US010916632B2

(12) United States Patent
Sundaresan et al.

(10) Patent No.: US 10,916,632 B2
(45) Date of Patent: Feb. 9, 2021

(54) MANUFACTURE OF IMPROVED POWER DEVICES

(71) Applicant: GeneSiC Semiconductor Inc., Dulles, VA (US)

(72) Inventors: Siddarth Sundaresan, Dulles, VA (US); Ranbir Singh, Dulles, VA (US); Stoyan Jeliazkov, Dulles, VA (US)

(73) Assignee: GENESIC SEMICONDUCTOR INC., Dulles, VA (US)

( * ) Notice: Subject to any disclaimer, the term of this patent is extended or adjusted under 35 U.S.C. 154(b) by 0 days.

(21) Appl. No.: 16/352,698

(22) Filed: Mar. 13, 2019

(65) Prior Publication Data

US 2020/0295139 A1 Sep. 17, 2020

(51) Int. Cl.
*H01L 29/66* (2006.01)
*H01L 29/16* (2006.01)
*H01L 29/78* (2006.01)
*H01L 29/06* (2006.01)

(52) U.S. Cl.
CPC ...... *H01L 29/1608* (2013.01); *H01L 29/0696* (2013.01); *H01L 29/66712* (2013.01); *H01L 29/781* (2013.01)

(58) Field of Classification Search
CPC ............... H01L 29/1608; H01L 29/781; H01L 29/0696; H01L 29/66712
See application file for complete search history.

(56) References Cited

U.S. PATENT DOCUMENTS

2009/0152667 A1* 6/2009 Rieger ................. H01L 29/407
257/488
2010/0155839 A1* 6/2010 Grebs ................. H01L 29/0878
257/336

* cited by examiner

*Primary Examiner* — David Vu
(74) *Attorney, Agent, or Firm* — Dave Law group LLC; Raj S. Dave

(57) ABSTRACT

An embodiment relates to a device having a SiC substrate, a well region, a source region, and a first sinker region, wherein the first sinker region has a depth that is equal to or greater than a depth of the well region, the source region is within the well region, the first sinker region is within the source region, and the first sinker region is located between a source interconnect metallization region and the SiC substrate. Another embodiment relates to a device having a SiC substrate, a drift layer on the SiC substrate, a well region on the drift layer, a source region within the well region, and a plug within the well region.

22 Claims, 40 Drawing Sheets
(4 of 40 Drawing Sheet(s) Filed in Color)

P-type Implant

P-type Implant

MANUFACTURE OF IMPROVED POWER DEVICES

FIELD OF THE INVENTION

This invention relates to power semiconductor devices using a vertical silicon carbide (SiC) Double-Implantation Metal oxide semiconductor field-effect transistor (DMOSFET). A power metal oxide semiconductor field-effect transistor (MOSFET) is a specific type of MOSFET designed to handle significant power levels.

BACKGROUND OF INVENTION

Silicon based power devices have long dominated power electronics and power system applications. On the other hand, SiC is a wider band-gap (Eg) material with Eg=3.3 eV as compared to silicon (Eg=1.1 eV); therefore, SiC has a higher blocking voltage than Si. SiC has a higher breakdown electric field ($3\times10^6$ V/cm to $5\times10^6$ V/cm) compared to Si (breakdown electric field for Si is $0.3\times10^6$ V/cm) and is a better thermal conductor (3.7 (W/cm-K) for SiC versus 1.6 (W/cm-K) for Si). SiC has been a material of choice for power MOSFETs. However, "[e]ven with the successful introduction of SiC power MOSFETs into the commercial market place, several key reliability issues have not been fully resolved." [Source: Key Reliability Issues for SiC Power MOSFETs, A. Lelis, D. Habersat, R. Green, and E. Mooro of the U.S. Army Research Laboratory, published in ECS Transactions, 58 (4) 87-93 (2013), DOI: 10.1149/05804.0087ecst].

SiC exists in a kind of polymorphic crystalline building known as a polytype, e.g. 3C—SiC, 4H—SiC, 6H—SiC. FIG. 1a is the prior art SiC DMOSFET structure reported by B. J. Baliga in Advanced High-Voltage Power Device Concepts (Springer Press, 2011). FIG. 1b shows the electric field contours simulated for the prior art SiC DMOSFET structure of FIG. 1a. The electric field distribution near the surface of the 5-kV shielded 4H—SiC inversion-mode power MOSFET structure is shown in FIG. 1b to allow examination of the electric field in the junction gate field-effect transistor (JFET) region and the gate region. The sharp peak of the electric field at the edge of the P+ shielding region can be observed in this prior art device which will result in a high electric field in the gate oxide, thereby resulting in a poor performance of this MOSFET device. FIG. 1c shows the electric field distribution in the shielded 4H—SiC inversion-mode MOSFET. The simulated results in the figure show an electric field as high as 4 MV/cm in the gate oxide for the prior art SiC DMOSFET structure of FIG. 1a.

A typical SiC MOSFET device structure such as that shown in FIG. 1a results in high electric field concentration at the corner of the p-well region, which results in a high electric field in the gate oxide layer, especially during high drain bias (blocking mode) operation. The high critical electric fields for breakdown in 4H—SiC ($\approx 3$ MV/cm) results in a very high (>5 MV/cm) electric field in the gate oxide. Fowler-Nordheim tunneling currents are observed at such high electric fields in the gate oxide, which can result in trapped charge in the gate oxide, which leads to poor device reliability.

The manufacturing processes for Si uses techniques like diffusion of dopants but these conventional manufacturing processes are not possible for making SiC device because the diffusion coefficients in SiC are negligible at temperatures below 1800° C. SiC devices are manufactured by ion implantation of both source and p-well regions but ion implantation and deep ion implantation is difficult in SiC. Therefore, there is a long-felt need for improved power devices that address the reliability issues for SiC power MOSFETs.

SUMMARY OF INVENTION

An embodiment relates to a device comprising a unit cell on a SiC substrate, the unit cell comprising a well region, a source region, and a first sinker region, wherein the first sinker region has a depth that is equal to or greater than a depth of the well region.

In an embodiment, the source region located is within the well region.

In an embodiment, the at least a portion of the first sinker region is located at a center of the unit cell.

In an embodiment, the first sinker region is located between a source interconnect metallization region and the SiC substrate.

In an embodiment, the first sinker region is located between least two well regions.

In an embodiment, the first sinker region is located between at least two source regions.

In an embodiment, at least a portion of the well region is located between the source region and the SiC substrate.

In an embodiment, the device further comprises a drift layer.

In an embodiment, the drift layer is located on the SiC substrate.

In an embodiment, the unit cell is located within the drift layer.

In an embodiment, the device further comprises a second sinker region.

In an embodiment, the second sinker region has a depth that is less or equal to the depth of the first sinker region.

In an embodiment, the second sinker region is located between the well region and the first sinker region.

In an embodiment, the second sinker region is located between the source region and the SiC substrate.

In an embodiment, the second sinker region is under the source region.

In an embodiment, the device further comprises a trench in the source region.

In an embodiment, the first sinker region is located below the trench.

In an embodiment, a top surface of the first sinker region is located below a bottom surface of the source region.

In an embodiment, the device comprises a N-type MOSFET or P-type MOSFET.

In an embodiment, the device comprises a N-type DMOSFET or P-type DMOSFET.

In an embodiment, the device further comprises a drain region.

In an embodiment, the device further comprises gate region.

In an embodiment, the device further comprises an interlayer dielectric.

A device comprising a SiC substrate, a drift layer on the SiC substrate, and a unit cell within the drift layer, the unit cell comprising a well region, a source region within the well region, and a plug within the well region.

In an embodiment, the plug is partially within the source and extends beyond the source.

In an embodiment, the source region is completely within the well region.

In an embodiment, the plug region is within the source region.

In an embodiment, the plug region is located between a source interconnect metallization region and the SiC substrate.

In an embodiment, at least a portion of the plug region is located at a center of the unit cell.

In an embodiment, the plug region is located between at least two source regions.

BRIEF DESCRIPTION OF THE FIGURES

The patent or application file contains at least one drawing executed in color. Copies of this patent or patent application publication with color drawing(s) will be provided by the Office upon request and payment of the necessary fee.

FIG. 1b shows the electric field contours simulated for the prior art SiC DMOSFET structure in FIG. 1a.

FIG. 1c shows the electric field distribution for the prior art SiC DMOSFET structure in FIG. 1a.

FIG. 2b shows the breakdown simulation of the SiC DMOSFET structure in FIG. 2a.

FIG. 5b shows the breakdown simulation of the SiC DMOSFET structure designed according to embodiments shown in FIG. 3 and FIG. 5a.

FIG. 6a to FIG. 6j are cross sectional views showing the process steps for manufacturing the SiC DMOSFET structure in FIG. 5a.

FIG. 7b shows the breakdown simulation of the SiC MOSFET structure in FIG. 7a.

FIG. 8a to FIG. 8bb are cross sectional views showing the process steps for manufacturing the SiC DMOSFET structure in FIG. 7a.

DETAILED DESCRIPTION

Definitions and General Techniques

Figure 1A:
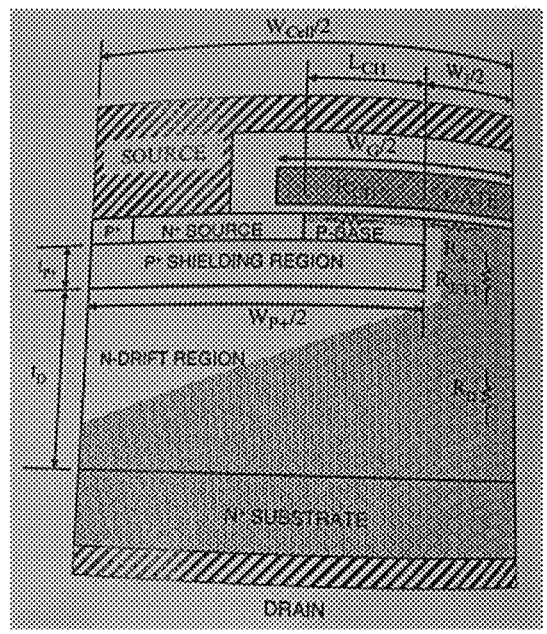
FIG. 1a shows the prior art SiC DMOSFET structure reported by B. J. Baliga in Advanced High-Voltage Power Device Concepts, Springer Press, 2011.
Figure 1B:
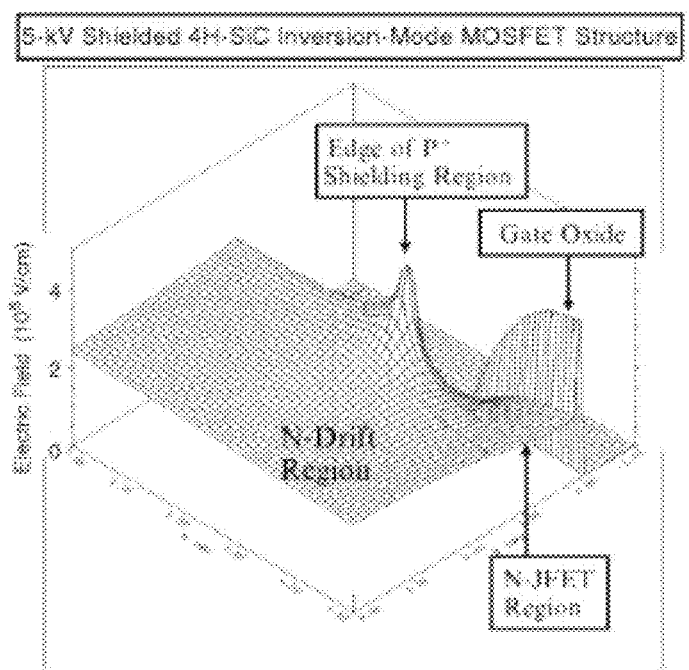
Figure 1C:
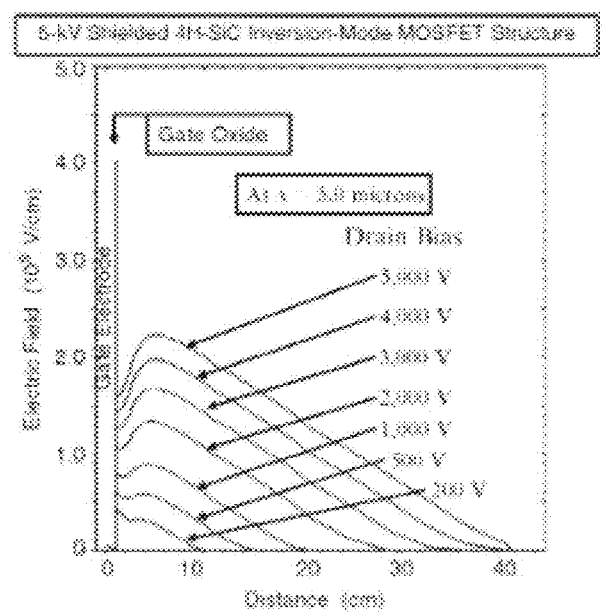

Unless otherwise defined herein, scientific and technical terms used in connection with the present invention shall have the meanings that are commonly understood by those of ordinary skill in the art. Further, unless otherwise required by context, singular terms shall include pluralities and plural terms shall include the singular. Generally, nomenclatures used in connection with, and techniques of, semiconductor processing described herein are those well-known and commonly used in the art.

The methods and techniques of the present invention are generally performed according to conventional methods well known in the art and as described in various general and more specific references that are cited and discussed throughout the present specification unless otherwise indicated. The nomenclatures used in connection with, and the procedures and techniques of semiconductor device technology, semiconductor processing, and other related fields described herein are those well-known and commonly used in the art.

The following terms and phrases, unless otherwise indicated, shall be understood to have the following meanings.

The term "unit cell" as used herein refers to a piece of a pattern in a semiconductor which is repeated in the semiconductor.

The term "SiC" as used herein refers to silicon carbide which is a compound semiconductor and is a mixture of silicon and carbon with the chemical formula SiC. Silicon is covalently bonded with carbon. In 4H—SiC, 4H is written in the Ramsdell classification scheme here the number indicates the layer and the letter indicates the Bravais lattice. That means in a 4H—SiC structure four hexagonal layers of SiC are present. SiC exists in a kind of polymorphic crystalline building known as a polytype, e.g. 3C—SiC, 4H—SiC, 6H—SiC. Presently 4H—SiC is used in power device manufacturing. [Source: A complete analytical potential based solution for a 4H—SiC MOSFET in nanoscale, M K Yadav, K P Pradhan and P K Sahu Published 24 May 2016•©2016 Vietnam Academy of Science & Technology]

The term "substrate" as used herein refers to the supporting material on or in which the components of an integrated circuit are fabricated or attached.

The term "JFET" as used herein refers to junction gate field-effect transistor which is a three-terminal semiconductor device that can be used as electronically-controlled switches, amplifiers, or voltage-controlled resistors. A FET (field-effect transistor) is a unipolar transistor in which current carriers are injected at a source terminal and pass to a drain terminal through a channel of semiconductor material whose conductivity depends largely on an electric field applied to the semiconductor from a control electrode. There are two main types of FETs, a junction FET and an insulated-gate FET. In the junction FET, the gate is isolated from the channel by a pn-junction. In an insulated-gate FET, the gate is isolated from the channel by an insulating layer so that the gate and channel form a capacitor with the insulating layer as the capacitor dielectric.

The term "MOSFET" as used herein refers to metal oxide semiconductor field-effect transistor. which is a four terminal device with source(S), gate (G), drain (D) and body (B) terminals. The body of the MOSFET is frequently connected to the source terminal so making it a three terminal device like field effect transistor.

The term "DMOSFET" as used herein refers to double-implantation metal oxide semiconductor field-effect transistor. A common physical structure of SiC MOSFETs is the planar double-implanted MOSFET in 4H—SiC (SiC-DMOSFET).

The term "dopant" as used herein refers to n impurity added from an external source to a material by diffusion, coating, or implanting into a substrate, such as changing the properties thereof. In semiconductor technology, an impurity may be added to a semiconductor to modify its electrical properties or to a material to produce a semiconductor having desired electrical properties. N-type (negative) dopants (e.g., such as phosphorus for a group IV semiconductor) typically come from group V of the periodic table. When added to a semiconductor, n-type dopants create a material that contains conduction electrons. P-type (positive) dopants (e.g., such as boron for a group IV semiconductor) typically come from group III and result in conduction holes (i.e., vacancies in the electron shells).

The term "drain" as used herein refers to the electrode of a field effect transistor which receives charge carriers which pass through the transistor channel from the source electrode.

The term "source" as used herein refers to the active region/electrode to which the source of charge carriers is connected in a field effect transistor, The term "gate" as used herein refers to the control electrode or control region that exerts an effect on a semiconductor region directly associated therewith, such that the conductivity characteristic of the semiconductor region is altered in a temporary manner, often resulting in an on-off type switching action. The control electrode or control region of a field effect transistor is located between the source and drain electrodes, and regions thereof.

The term "impurity" as used herein refers to A foreign material present in a semiconductor crystal, such as boron or arsenic in silicon, which is added to the semiconductor to produce either p-type or n-type semiconductor material, or to otherwise result in material whose electrical characteristics depend on the impurity dopant atoms.

The term "PN junction" as used herein refers to the interface and region of transition between p-type and n-type semiconductors.

The term "polysilicon" as used herein refers to a polycrystalline form of silicon.

The term "P-type" as used herein refers to extrinsic semiconductor in which the hole density exceeds the conduction electron density.

The term "bandgap" as used herein refers to the difference between the energy levels of electrons bound to their nuclei (valence electrons) and the energy levels that allow electrons to migrate freely (conduction electrons). The band gap depends on the particular semiconductor involved.

The term "breakdown" as used herein refers to a sudden change from high dynamic electrical resistance to a very low dynamic resistance in a reverse biased semiconductor device (e.g., a reverse biased junction between p-type and n-type semiconductor materials) wherein reverse current increases rapidly for a small increase in reverse applied voltage, and the device behaves as if it had negative electrical resistance.

The term "channel" as used herein refers to a path for conducting current between a source and drain of a field effect transistor.

The term "chip" as used herein refers to a single crystal substrate of semiconductor material on which one or more active or passive solid-state electronic devices are formed. A chip may contain an integrated circuit. A chip is not normally ready for use until packaged and provided with external connectors.

The term "contact" as used herein refers to the point or part of a conductor which touches another electrical conductor or electrical component to carry electrical current to or from the conductor or electrical component.

The term "die" as used herein refers to a tiny piece of semiconductor material, separated from a semiconductor slice, on which one or more active electronic components are formed. Sometimes called a chip. N+ substrate.

The term "sinker" as used herein refers to deep implanted regions at key locations within the DMOSFET structure The term "plug" as used herein refers to the structure used to ground the well and the source contact.

The term "drift layer" as used herein refers to lightly doped region to support the high voltage in power MOSFET The term "well" used herein refers certain regions in a metal-oxide-semiconductor (MOS) transistor. MOS transistors are always created in a "well" region. A PMOS (positive-channel MOS) transistor is made in an N-doped region, called "n-well" region. Similarly, an NMOS transistor (negative-channel MOS) is made in a "P-type" region called "p-well". This ensures that the leakage between two transistors, through the bottom side, is low due to the reverse bias between the transistor areas and the well region.

The term "source interconnect metallization" as used herein refers to interconnection metallization that interconnects thousands of MOSFETs using fine-line metal patterns.

The term "self-aligned" used herein refers to processing steps in manufacturing of semiconductor devices. It is often necessary to achieve precise alignment between structures fabricated at different lithographic stages of integrated circuit fabrication. Stringent requirements on lithographic alignment tolerance can be relaxed if the structures are "self-aligned" which means one is forced into a specific position relative to the other for a wide range of lithographically defined positions.

The term "device" as used herein refers to the physical realization of an individual electrical element in a physically independent body which cannot be further divided without destroying its stated function.

The term "surface" as used herein refers to the outer or exterior boundary of a thing.

The term "trench" as used herein refers to electrical isolation of electronic components in a monolithic integrated circuit by the use of grooves or other indentations in the surface of the substrate, which may or may not be filled with electrically insulative (i.e., dielectric) material.

The term "dielectric" as used herein refers to a nonconductor of electricity, otherwise known as an insulator.

Embodiments relate to SiC DMOSFET power devices where the p-well regions effectively shield the sensitive gate oxide from the high electric fields present in SiC especially during high drain bias or blocking mode operation.

An embodiment relates to using a P+-plug to ground the p-well region with the N+ source contact.

An embodiment relates to making the lateral spacing between the p-well regions narrow enough to suppress the electric field in the gate oxide while ensuring the ON-resistance is not high.

An embodiment relates to replacing the P+ plug region of the DMOSFET with a deep P-type Sinker #1 region.

Embodiments relate to formation of one or more deep implanted sinker regions at certain locations within the MOSFET device structure such as a first P-type sinker region at the center of the MOSFET unit cell whose depth may be equal to or greater than the depth of the p-well region.

Embodiment relates to forming a second P-type sinker region under the N+ source region, whose depth may be equal to or greater than the p-well region, but less than or equal to the depth of the first P-type sinker region.

Embodiment relates to boron implantation which may be advantageously used for forming the deep sinker regions since boron has a larger implant range than aluminum that can result in deeper implant profiles Embodiment relates to the formation of a first trench with desired shape which may be etched in the N+ source region, prior to the formation of the first P-type sinker region, which may serve to increase the depth of the first P-type sinker region. The depth of the first trench may range from 0.01 µm up to 2 µm. The depth of the resulting first sinker region may be 0% to 100% larger than the depth of the p-well region. The depth of the first P-type sinker region can be as large as the entire epitaxial layer.

Embodiment relating to the formation of the first trench in the N+ source region may reduce or eliminate the need of expensive ultra-high energy implantation steps for forming the first P-type sinker region.

Embodiment relating to the first trench may be advantageously used to remove the N+ source implant from the first P-type sinker region, which may be desirable to prevent compensation of the first P-type sinker region by the N+ source implant. This is especially useful, if the N+ source region is self-aligned to the p-well region.

Embodiment relates to a gradually decreasing implant concentration which may be employed for forming the first and second P-type sinker regions in lieu of a box-shaped implant profile, as this may be advantageous in appropriately shaping the electric field under high drain bias. The doping in the P-type sinker regions may be varied linearly from a maximum value close to the SiC surface to a value equal to or slightly higher than the drift layer doping concentration at the other end of the P-type sinker regions.

Embodiment of a design of the first and second sinker regions may simplify the design of the p-well region, which can be designed to support metal-oxide-semiconductor (MOS) channel formation and may be advantageously designed for achieving low on-resistance, without compromising other performance metrics, such as reverse leakage current and electric field in gate oxide.

SiC devices in power electronics feature fast switching times, high blocking voltage capabilities, and the ability to operate at high temperatures. These characteristics, along with recent advancements in manufacturing processes, suggest that SiC has the potential to revolutionize power electronics as a successor to traditional silicon-based (Si) devices. SiC is a wide band gap material (3.3 eV) and has higher breakdown electric field ($3\times10^6$ V/cm to $5\times10^6$ V/cm) compared to Si (Si band gap is 1.1 eV and breakdown electric field for Si is $0.3\times10^6$ V/cm). SiC is a better thermal conductor (3.7 (W/cm-K) for SiC versus 1.6 (W/cm-K) for Si) which enables SiC devices to operate at extremely high-power levels and still dissipate the large amounts of excess heat generated. These material properties of SiC offer multiple advantages of using SiC instead of Si on power devices. In a comparison of SiC and Si semiconductor die with identical structures and dimensions, the SiC die exhibit a lower specific ON resistance and a higher breakdown voltage than the Si die.

The disclosed embodiments herein provide novel techniques for SiC DMOSFET design and fabrication for shaping of the electric field over the device structure and reducing concentration of electric fields at singular points. The embodiments herein reduce the electric field in the gate oxide region to less than 3.5 MV/cm and improve the device reliability.

The manufacturing process in Si uses techniques like diffusion of dopants but these conventional manufacturing processes are not possible for making SiC device because the diffusion coefficients in SiC are negligible at temperatures below 1800° C. SiC devices are manufactured by ion implantation of both source and p-well regions but ion implantation and especially deep ion implantation is difficult in SiC. In the embodiments herein, the ion implantation of source and p-well regions are made deep with novel techniques.

The increased reliability, higher operating temperature, increased efficiency, higher voltage capabilities of the SiC devices of the embodiments herein as compared to the silicon devices make them highly desirable in the electric vehicle and renewable energy industries. Traction inverters in electric vehicles are subjected to high thermal (>150° C.) and load cycling and renewable energy converters are subjected to extreme environmental conditions. The embodiments described herein for the SiC devices maximize power conversion efficiency to >98% for example while providing high reliability thus making it an ideal candidate for electric vehicles to minimize maintenance and downtime, which is expensive for the operators of the electric vehicles.

The disclosed embodiments change the way in which SiC power DMOSFET devices can effectively shield the sensitive gate oxide from the high electric fields present in 4H—SiC especially during high drain bias (blocking mode operation).

In embodiments herein, SiC power DMOSFET devices overcome the trade-off between achieving a low ON resistance and achieving a robust blocking performance, which implies a low electric field in the structure close to a gate oxide.

Embodiments herein include a unit cell of a SiC power DMOSFET comprising a vertical MOSFET. Certain regions of the SiC power DMOSFET device are a p-well region, which is formed by an implantation, an N+ source region, a N− drift layer, and an N+ substrate. In the embodiment herein, during the ON state the current flows vertically from the drain, through the inversion layer which is formed at the top of the p-well layer, when a gate voltage is applied to this device in through the N+ source region and out through the source metallization. In the OFF state or the blocking state, in the embodiments herein a voltage is supported across the p-well and N− drift layer junction. There is a PN junction which is formed between the p-well and the N drift layer. The voltage applied to the structure is supported across this PN junction in the reverse bias.

In the embodiments herein, a power MOSFET has several physical dimensions, including: the pitch of the unit cell, which is the repeat unit for the MOSFET; the channel length, which is the portion of the p-well in which the inversion channels is formed; the distance between two successive p-wells, referred to as the junction gate field-effect transistor (JFET) region or the JFET gap; the thickness of the gate oxide; and an inter-layer dielectric (ILD) layer, which is used to insulate the source interconnect metallization from the poly-silicon gate.

In the embodiments herein, the advantage of using SiC over Si is that for similar chip sizes, SiC can support much higher power density. The amount of voltage one can support in SiC can be ten times more than in Si, and the current that the SiC chip can carry through the MOSFET can be 10 to 50 times more than in Si. SiC MOSFETs form convenient switch, because one can achieve much higher power density. The performance advantage relates to the trade-off between voltage and current. Voltage blocking and current conduction capability, is about 200 times better in the case of SiC as compared to Si.

In the embodiment herein, the P+ plug, which is in the center of the SiC DMOSFET unit cell, is replaced by the PS #1 region. In the embodiment the PS #1 region extends below the p-well region. During the blocking condition, the electric field or the main region where the breakdown can happen, is at the center of the unit cell of a SiC DMOSFET, which is basically between the PS #1 region and the N− drift layer. SiC structures tend to break down between the p-well and the N− drift layer, and especially at the curvature of the p-well region. In the embodiments herein, the structure will break down between the PS #1 region and the N− drift layer. Here the location of the breakdown has been moved towards the center of the unit cell which results in a lower electric field closer to the gate oxide region. There is a reduced electric field close to the gate oxide region in the embodiment due to PS #1 region, and this should make for a more robust device.

The embodiments herein have difference in structure, difference in the method of manufacturing, difference in the functionality of the devices, and difference in the results that the devices produce than the prior art SiC devices. Simulation data of the embodiments herein show the differences in performance and results of structures. In addition to the PS #1 region, the devices of the embodiments herein also have a PS #2 region, which is placed under the N+ source region. This improves the electric field profile in the embodiment in a way that during the blocking mode of operation, the voltage is shed across a larger area of the unit cell, which results in even more robust operation. In the embodiments herein, the PS #2 region could be deeper than the p-well region and could be made shallower than the PS #1 region. In the embodiment herein of all the P-type regions in the SiC DMOSFET structure, the deepest of them is the PS #1 region, the intermediate one is the PS #2 region, and the shallower one is the p-well region. The embodiments herein show more appropriate electric field shaping from these PS #1 and PS #2 structures.

In the embodiments herein, another advantage of including the PS #2 region is that the PS #2 serves as a secondary p-well region. The design of the p-well region needs to satisfy several different constraints. The electrical dose in the p-well region can be large enough such that the desired breakdown voltage is realized while at the same time, the doping of the p-well region near the gate oxide region where the MOS channel is formed, can be low enough such that a reasonably low threshold voltage is realized.

In the embodiment the p-well region could now satisfy conflicting requirements. By placing the PS #2 under the N+ source region, it relaxes the design of the p-well region, whose purpose now is solely for channel definition and channel formation. In embodiments herein, the p-well does not have to be designed with the objective of supporting the breakdown voltage. The embodiments herein give a lot more flexibility to the designer to design the p-well region suitably only for MOS channel formation.

In the embodiment herein, the PS #1 is formed after a trench is etched into the N+ source region which is in the middle of the unit cell of the SiC DMOSFET. The advantage of this trench is that it moves the electric field location farther away from the gate oxide interface and to the middle of the unit cell of the SiC DMOSFET. In the embodiment etching a recess trench into the N+ source region, effectively creates a deeper PS #1 region. The electric field moves even further away from the gate oxide region, which would make for more robust blocking capability. In the embodiments herein, one of the reasons for doing the trench is because ion implantation and particularly deep ion implantation in SiC is difficult. Deep PS #1 sinker region can be made because of source trench. In the embodiments herein etching a trench and then doing the ion implantation, allows to make a deeper PS #1 region, which is effective and achieves the functionality.

In the embodiments herein since the trench helps in making a deeper PS #1 due to the source trench allows to make a thinner oxide region by reducing the oxide. SiC DMOSFET needs a thicker oxide to prevent them from breaking down in a dielectric field. In the embodiments herein by introducing the P-type sinker regions, one can use thinner oxide.

In the embodiments herein, the SiC DMOSFET devices are made using a series of masking steps followed by either ion implantation or etching and a deposition step. In the embodiments herein, the unit cell is produced where a series of structures are made using photolithography that is used to mask certain portions of the wafer or certain portion of device, and implementing certain steps, and then removing that mask, and doing the other steps. To minimize the number of steps is of great importance to realize cost-effectiveness. That is, cost structure is lower if one can somehow reduce number of steps. Also, certain steps in manufacturing of SiC are expensive, and the embodiments herein minimize the number of those expensive steps. For example, ion implantation is a relatively expensive step in SiC. p-well, P-plug, and N+ source regions are made using ion implantation. Ion implantations are expensive steps, particularly deeper ion implantation is even more expensive. So, minimizing deep ion implantation is of importance. Further, P-type Implantation is 5 to 10 times more expensive than doing N-type Implantation, since P-type implantation needs to be performed at higher temperatures (400-1000° C.) in contrast to N-type implants which can be performed at room-temperature. So, minimizing P-type implants, is also of importance.

In the embodiments, herein the wafer goes through a series of ion implantation steps first, which is typically called the front end of the process, then there is a high temperature annealing, which is used to anneal out the implant damage and electrically activate the implants. The back end of the process typically consists of forming the gate oxide, ILD and other metallization steps.

In the embodiments herein to make the SiC DMOSFET structure, photolithography would be used to mask a certain part of the wafer to create a p-well region, following which, a next masking step could be used to realize an N+ source region, followed by another masking step would be used to realize the P+ plug region. The wafers would need to be annealed to activate the implanted regions. After this, a gate oxide or a gate dielectric can be grown by either thermal oxide or using a deposited oxide. A gate metallization can be formed using a poly-silicon or other refractory metals. The gate metallization is then selectively patterned and etched to access the N+ source regions, following which the ILD is deposited and then patterned to realize the window for creating these ohmic contacts for the N+ source regions. The ohmic contact can be realized on the backside of the wafer, which is the drain, for the drain region. At the end of the process, a source interconnect metallization is used to connect the various unit cells.

SiC MOSFET is typically produced in several masking steps. Some of these masking steps, could be for forming implanted regions, while other masking steps are for forming structures such as gate oxide, ILD etc. The embodiments herein are all done in 11 masking steps without increasing a masking step for any additional feature like PS #1, PS #2, source trench formations or other structures in the embodiments.

In SiC, ion implantation is a method to introduce dopants since diffusion does not work well. So, to realize the PS #1 region to be deeper than p-well region, requires higher implantation energy. In the embodiments herein typically either aluminum or boron is used for realizing P-type regions in SiC. So, for realizing the PS #1 region and a deep PS #1 region, in the embodiments herein boron implantation is used in lieu of aluminum implantation, since for a given energy, the boron implantation can result in deeper regions as compared to aluminum implantation. Another way to realize a deep PS #1 region is to use a much higher energy and still use aluminum as the P-type dope.

In an embodiment herein, a p-well region is formed, following which, the N+ source region is formed. While forming the N+ source region, ion implantation is performed to realize the PS #2 region. The same masking step is used for forming the N+ source region and the PS #2 region. In the embodiment herein, this enables one to realize a PS #2 region exactly under the N+ source region.

In the embodiments herein, the N+ source implant is made self-aligned to the p-well implant, to reduce or even eliminate misalignment which could occur if the two regions are realized in different masking steps.

In the embodiment herein to realize sub 0.5-micron channel lengths or sub 1-micron channel lengths the first p-well region is formed using traditional implantation masking step. A dielectric layer of a sufficient thickness is deposited, and then using photolithography, one would selectively pattern this layer, and then perform ion implantation, to realize the p-well region. Once this is done, a second dielectric layer is deposited on top of this patterned first dielectric layer, and then subjected to a blanket etch. This, results in a dielectric spacer region which then defines the region which is subjected to the N+ source implant. So, by choosing an appropriate thickness of the second dielectric layer, one can define the MOS channel length.

In the embodiment herein to realize a channel which is 0.5-micron wide first create a p-well region using conventional photolithography technique, for example one may deposit and pattern silicon dioxide layer, then one may deposit a second silicon dioxide layer of a thickness equal to like 0.5-micron. When one etches this layer down, one would realize a spacer which would be 0.5-micron also. When one performs the N+ source implant, one would have effectively an MOS channel length of 0.5-micron.

In the embodiment, the channel length is formed not by the limitations of lithography techniques, but by the ability of depositing dielectric layers, for example silicon dioxide, where one has much better control. One can deposit a dielectric or silicon dioxide layers with a resolution which is much better than what lithography can allow.

In one method called the subtractive method, the process first fabricates a N+ source, then deposits a dielectric layer, and then form the P+ layer through the poly-silicon variation. The embodiments herein do the additive method, where first one does the p-well, and then deposits the dielectric of a controlled thickness, which will define the channel length, and then put the N+ source. So, the order of N+ and p-well is reversed in the embodiments herein when compared to how prior art SiC DMOSFET's are formed.

The embodiments herein avoid implanting N+ source region in the gate region. In a SiC MOSFET structure there exists a parasitic NPN transistor, that can get triggered not during normal operation but when you're switching this device from OFF to ON or ON to OFF with extremely high speed.

In the embodiments herein, the trench into the N+ source region is formed prior to the implantation of the PS #1 region results in a deeper PS #1 region. But another benefit of doing this is that one can also remove the N+ source regions from the portions of the device that do not want the N+ source region to be implanted. So, that is the secondary benefit of having a trench etched into the N+ source region. The same masking step is used for performing the SiC dry etch, and then implanting the PS #1 region. This is achieved with just one masking step. In an embodiment, the PS #2 region is formed along with the N+ source region with the same masking step. The SiC trench and the PS #1 region are again formed using the same masking step. In this embodiment, four features are made using two masking steps.

In the embodiments herein, the cost of PS #1 sinker is reduced, because one does not have to employ deep ion implantation. Deep ion implantation, which are high doses, is expensive. And on the periphery, having a deep P+ is also beneficial, to prevent breakdown regions that can be formed. In the embodiments herein, one is avoiding the breakdown region at the periphery because one is using a single step for creating PS #1 and the trench. When one forms the MOS channel in a self-aligned fashion, N+ source region is formed everywhere where one has a p-well region, which extends to even the periphery of the device. In the embodiments herein, one avoids the breakdown at the periphery due to formation of trench and PS #1.

Figure 2A:
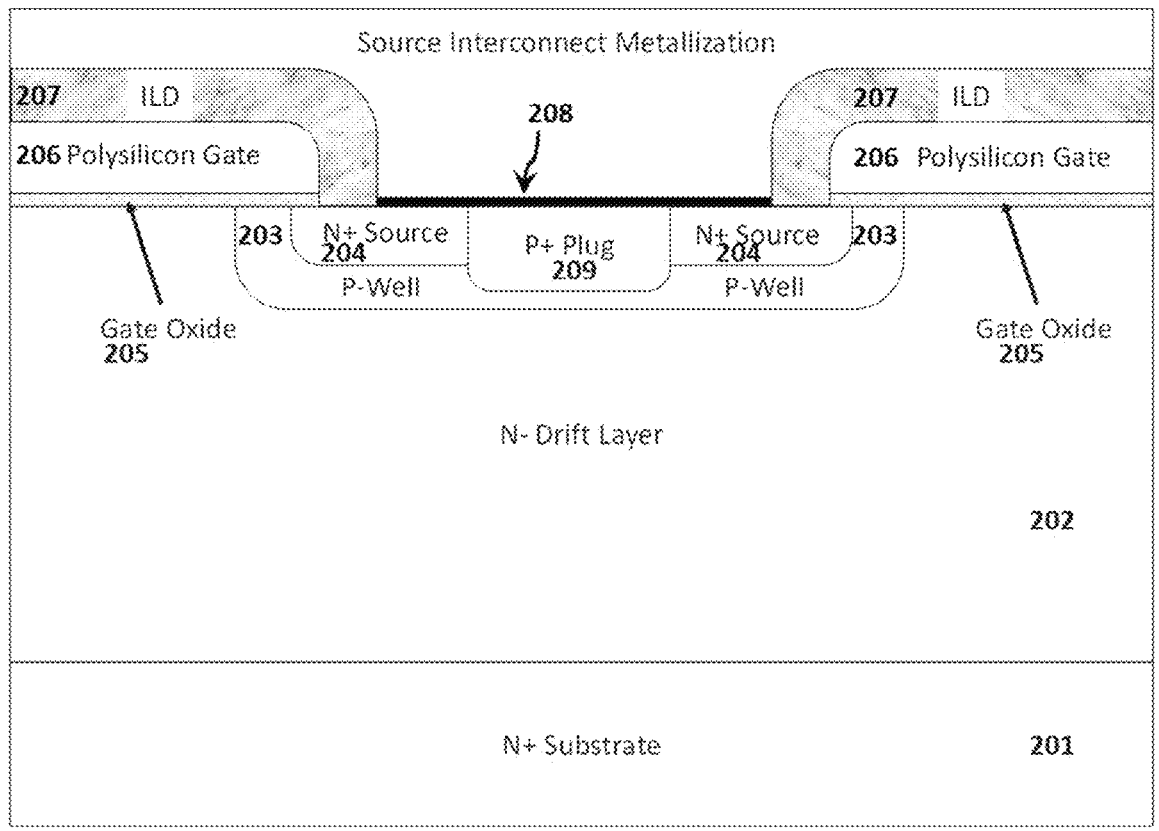
FIG. 2a shows an embodiment of a SiC DMOSFET with the P+ plug region to ground the p-well region with the N+ source contact.

An embodiment shown in FIG. 2a is the unit cell of a cross-sectional structure of a SiC DMOSFET. The key regions of this device are a p-well region 203, which is formed by ion-implantation or epitaxial re-growth of a p-type species such as aluminum or boron. There is an N+ source region 204, N– drift layer 202, and an N+ substrate 201. In the ON state when a gate voltage is applied to the polysilicon gate 206, the current flows vertically from the drain 201, through the inversion layer which is formed at the top of the p-well layer 203, through the N+ source region 204, and out through the source metallization 208. In the OFF state or the blocking state, a voltage is supported across the p-well 203, N– drift layer 202 junction and there is a PN junction which is formed between the p-well and the N– drift layer. The voltage applied to the structure is supported across this PN junction in the reverse bias. There are several key features in a power MOSFET, which include the pitch of the unit cell, which is the repeat unit for the MOSFET, the channel length, which is the portion of the p-well in which the inversion channel is formed, the distance between two successive p-wells, which is referred to as the JFET region or the JFET gap and the thickness of the gate oxide 205. Another feature is an ILD layer 207 which is used to insulate the source interconnect metallization 208 from the polysilicon gate 206. At the very center of the unit cell, there is a P+ plug layer 209 which is grounded with the N+ source metallization. The purpose of the P+ plug in SiC DMOSFET is to ground the p-well region with the N+ source contact. Typically, the depth of the P+ plug implant is made shallower than the p-well region as shown in FIG. 2a. The DMOSFET device structure can result in high electric field concentration at the corner of the p-well region 203, which results in a high electric field in the gate oxide layer 205, especially during high drain bias (blocking mode) operation. The high critical electric fields for breakdown in 4H—SiC 3 MV/cm) results in a very high (>5 MV/cm) electric field in the gate oxide. Fowler-Nordheim tunneling currents are observed at such high electric fields in the gate oxide, which can result in trapped charge in the gate oxide, which leads to poor device reliability. In the embodiment herein, the lateral spacing between p-well regions (JFET region) is made narrow enough to suppress the electric field in the gate oxide while making sure that the MOSFET ON-resistance is low enough.

Figure 2B:
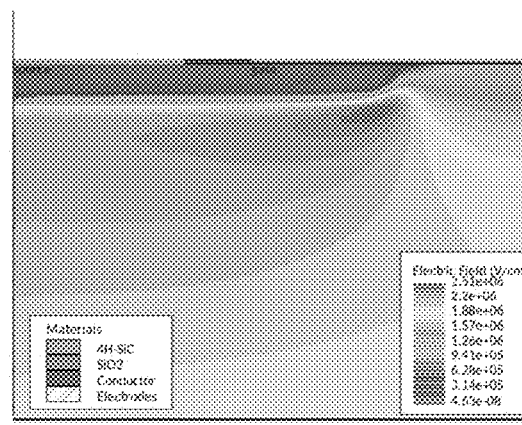

FIG. 2b is the breakdown simulation of a SiC MOSFET shown in FIG. 2a. The simulation shows the peak electric field located at the corner of the p-well region, which results in a certain high electric field in the gate oxide layer. The electric field is strongly concentrated at the corner of the p-well region because that is the region of maximum curvature. (this embodiment has limitation)

Figure 3:
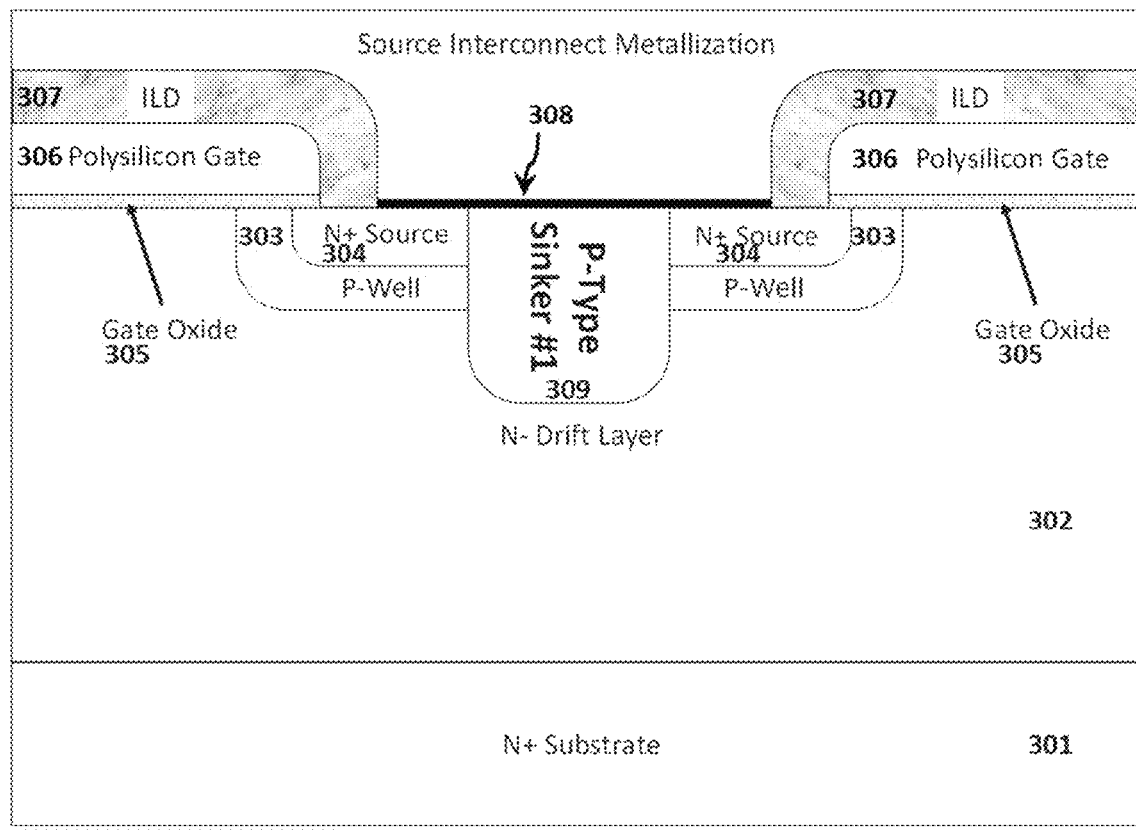
FIG. 3 shows an embodiment of a SiC DMOSFET where the P+ plug region in FIG. 2a is replaced with a deep P-type Sinker #1 region.

An embodiment shown in FIG. 3 is the cross-sectional unit cell of a SiC DMOSFET. The key regions of this device are a p-well region 303, which is formed by ion-implantation or epitaxial re-growth of a p-type species such as aluminum or boron. There is an N+ source region 304, N− drift layer 302, and an N+ substrate 301. In the ON state when a gate voltage is applied to the polysilicon gate 306, the current flows vertically from the drain 301, through the inversion layer which is formed at the top of the p-well layer 303, through the N+ source region 304, and out through the source metallization 308. There are several key features in a power MOSFET, which include the pitch of the unit cell, which is the repeat unit for the MOSFET, the channel length, which is the portion of the p-well in which the inversion channel is formed, the distance between two successive p-wells, which is referred to as the JFET region or the JFET gap and the thickness of the gate oxide 305. Another feature is an ILD layer 307 which is used to insulate the source interconnect metallization 308 from the poly-silicon gate 306. Here the P+ plug region 209 of the SiC DMOSFET from FIG. 2a is replaced with a deep P-type Sinker #1 (PS #1) region 309. The depth of the PS #1 region, is greater than the depth of the p-well region. During the OFF state or the blocking condition, the structure shown in FIG. 2a, will break down between the p-well 203 and the N− drift layer 202 especially at the curvature of the p-well region. But with the PS #1 region 309 being introduced in FIG. 3 the electric field or the main region where the breakdown will happen, is now at the very center of the drawing, which is basically between the PS #1 region 309 and the N− drift layer 302. The presence of the deeper PS #1 region results in moving the peak electric field location from the corner of the p-well region 303 to the PS #1 region 309. The location of the peak electric field in 4H—SiC during high drain bias operation has been moved farther away from the gate oxide 305. The electric field in the gate oxide 305 is now lower than that of FIG. 2a device.

Figure 4A:
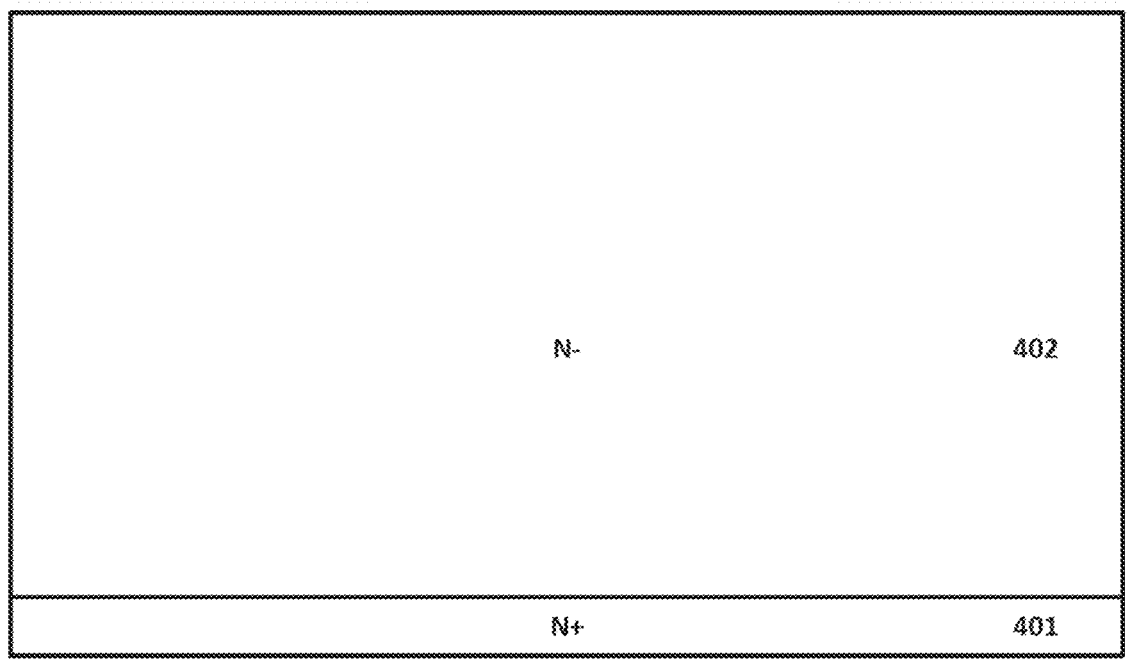
FIG. 4a to FIG. 4r are cross sectional views showing the process steps for manufacturing the SiC DMOSFET structure in FIG. 3.
Figure 4B:
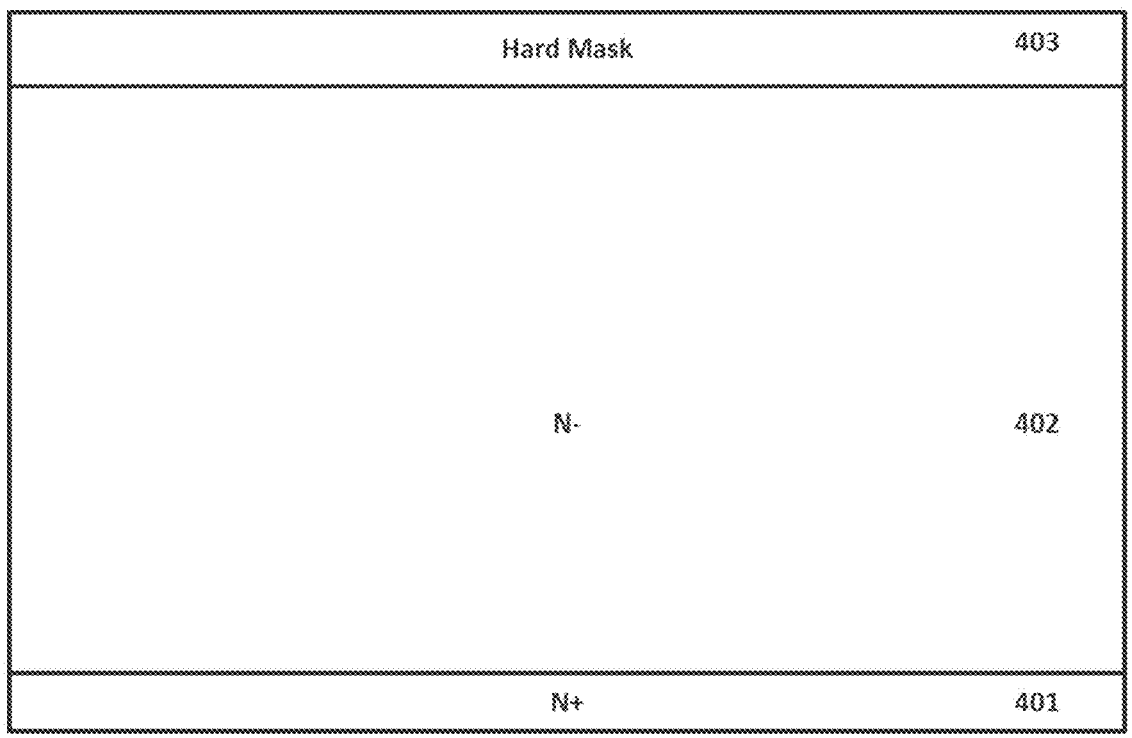
Figure 4C:
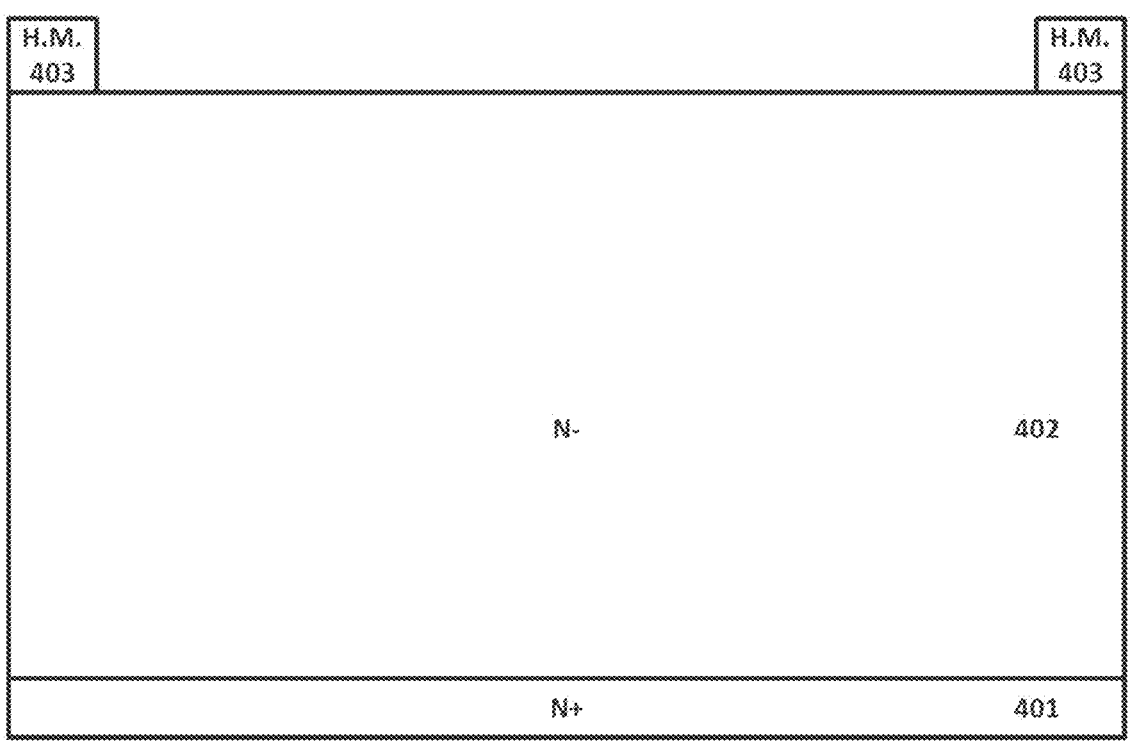
Figure 4D:
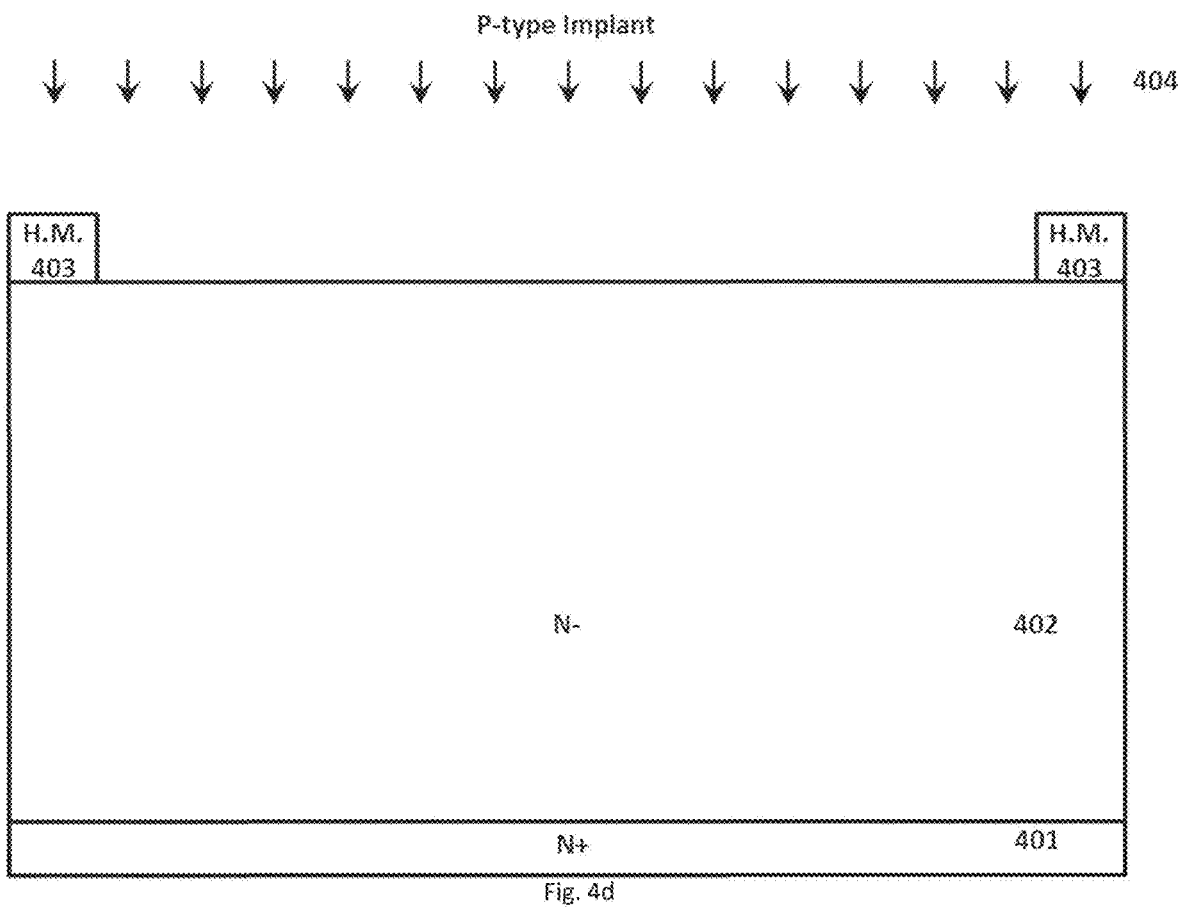
Figure 4E:
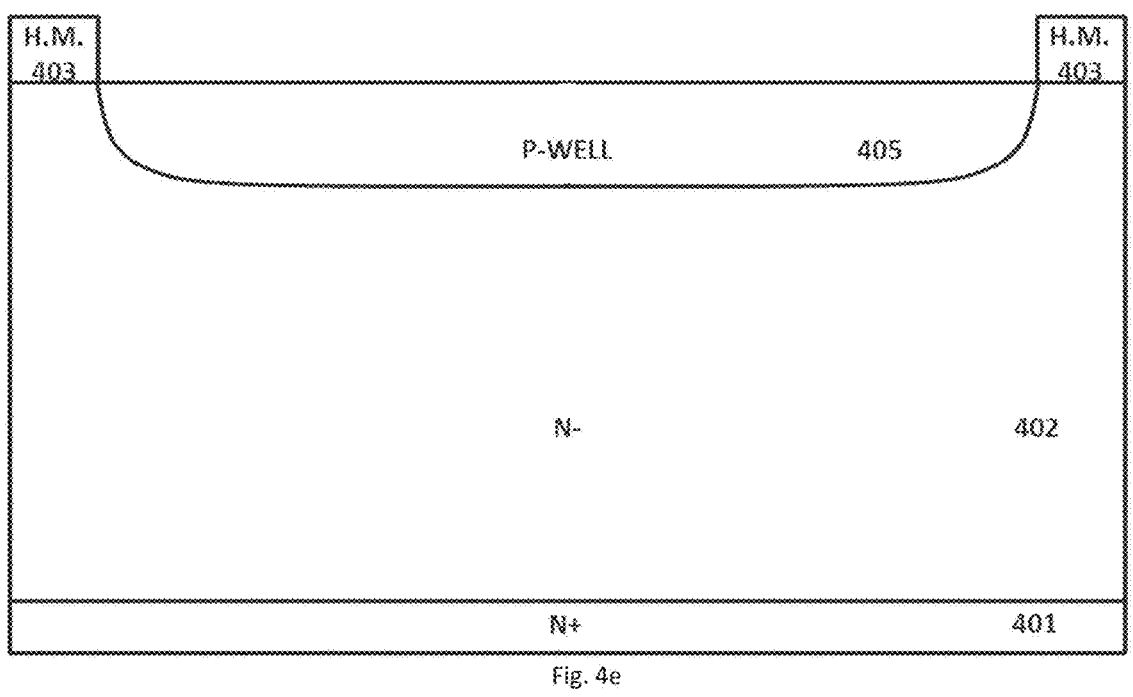
Figure 4F:
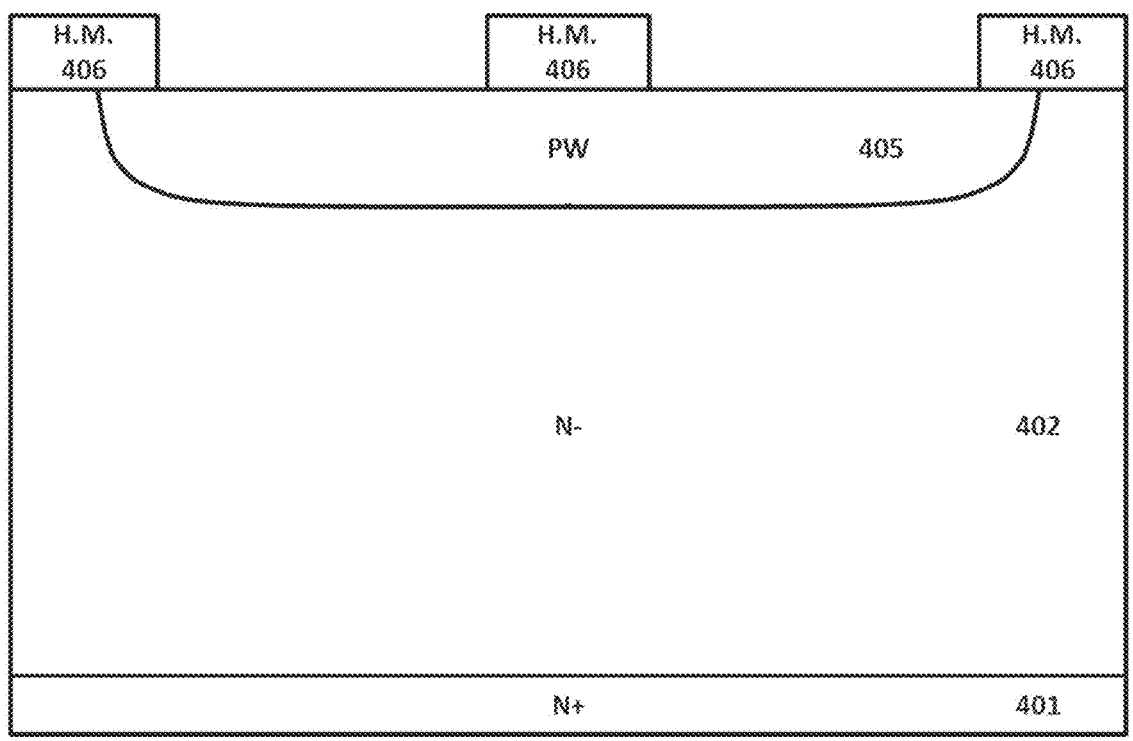
Figure 4G:
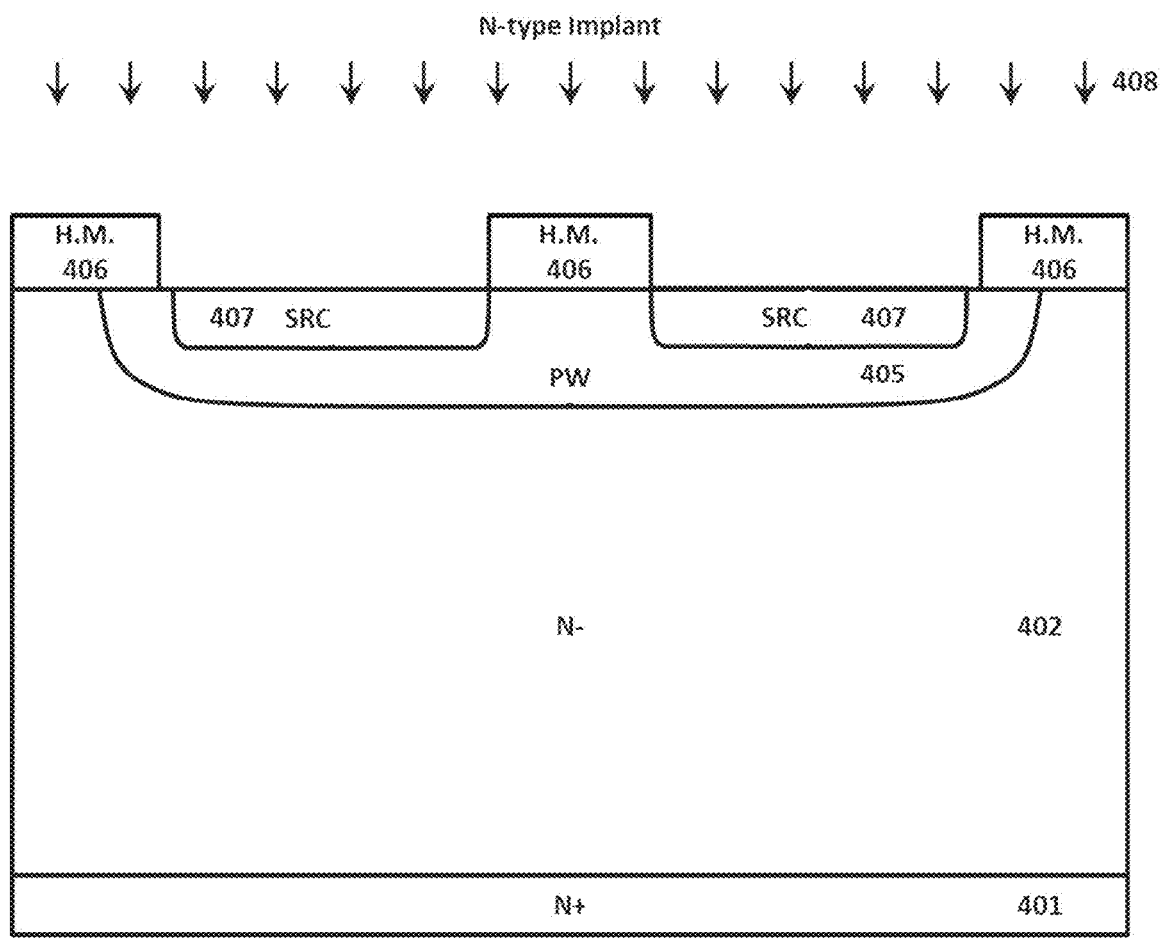
Figure 4H:
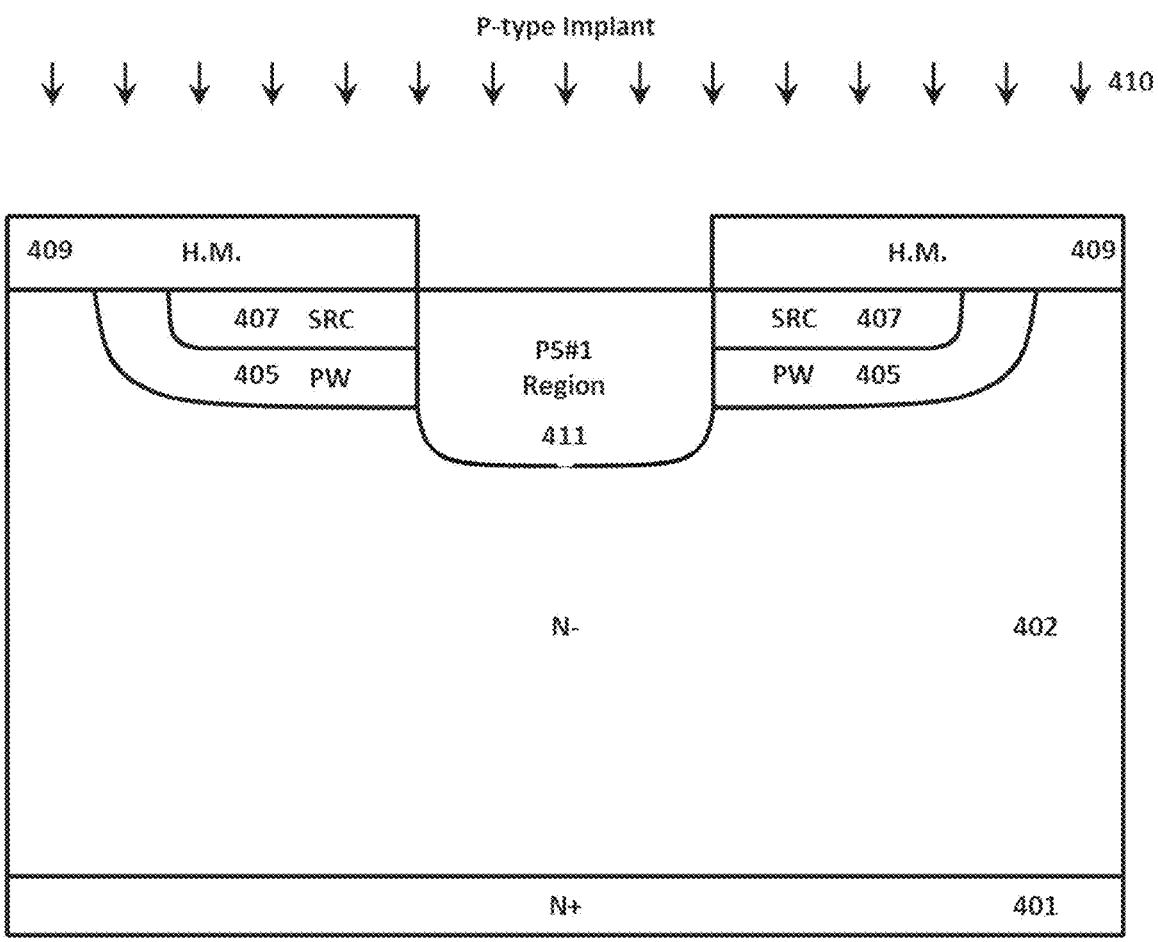
Figure 4I:
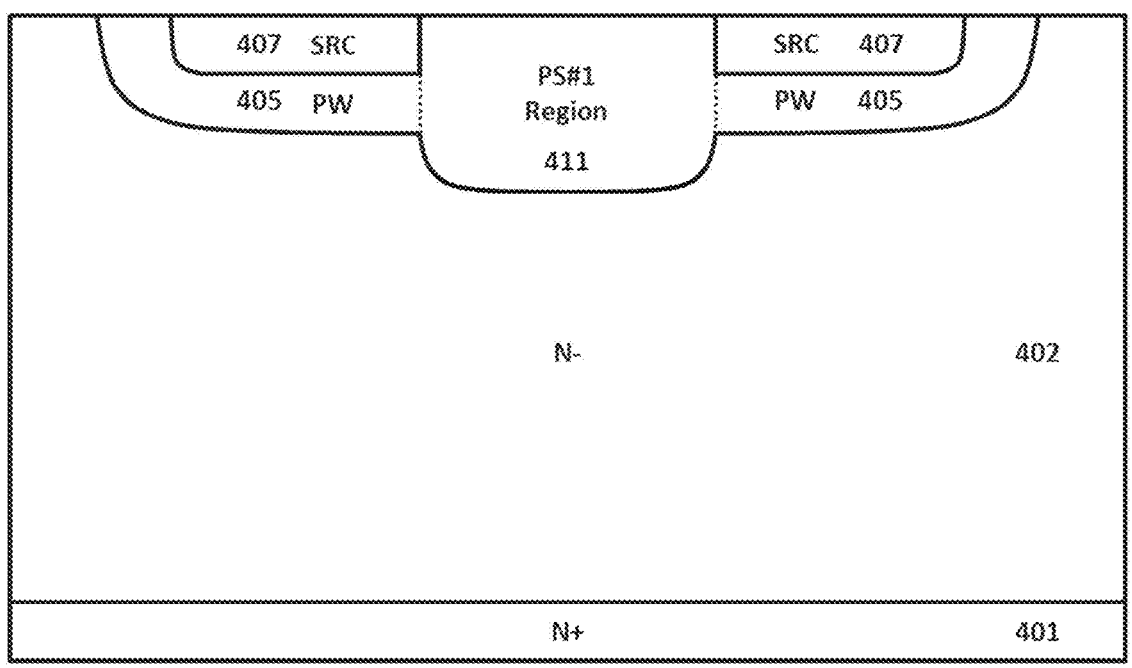
Figure 4J:
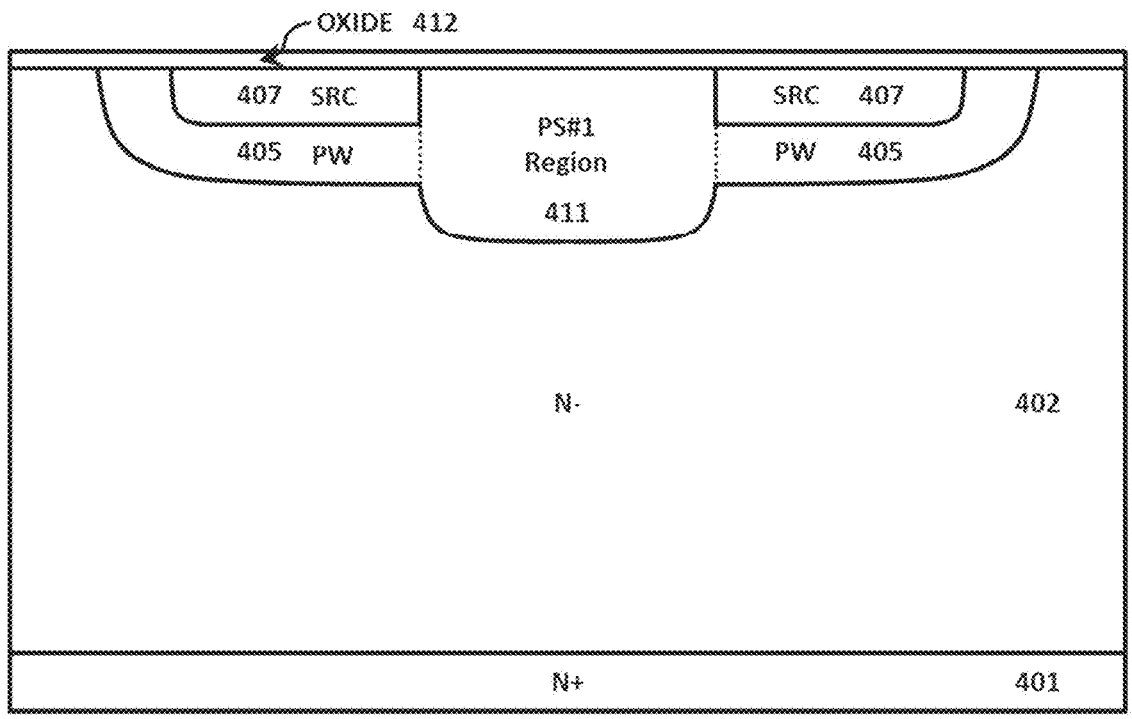
Figure 4K:
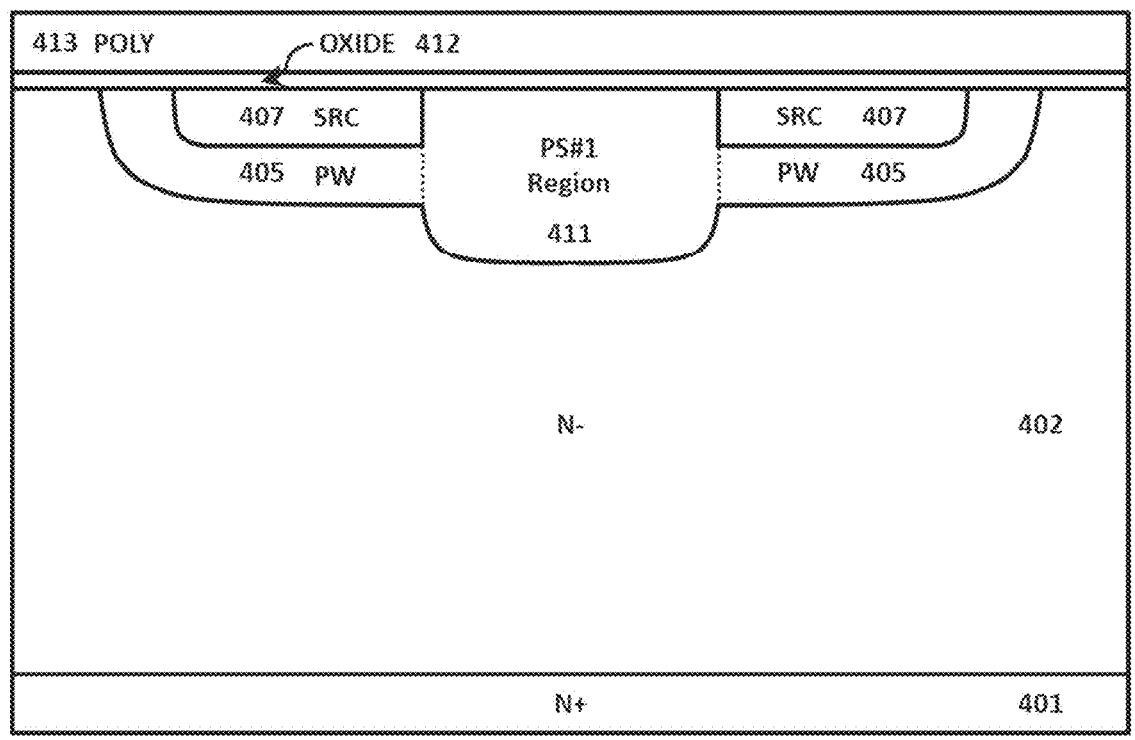
Figure 4L:
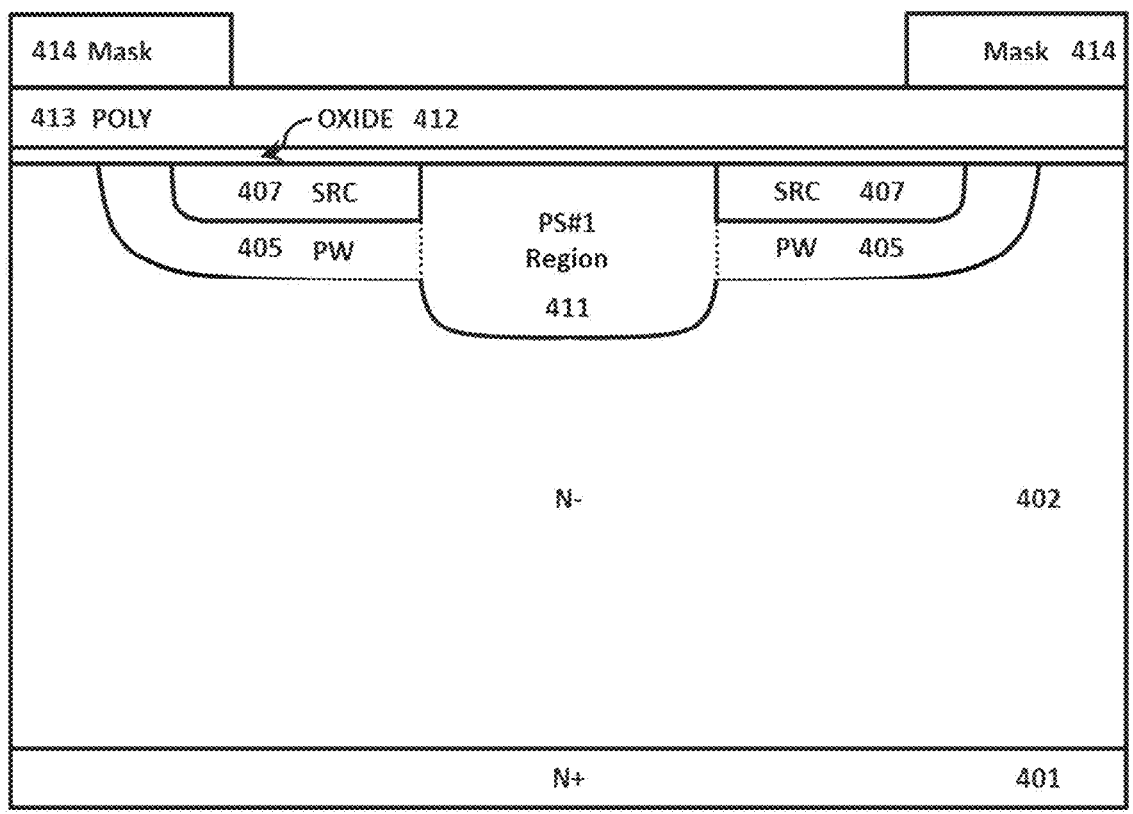
Figure 4M:
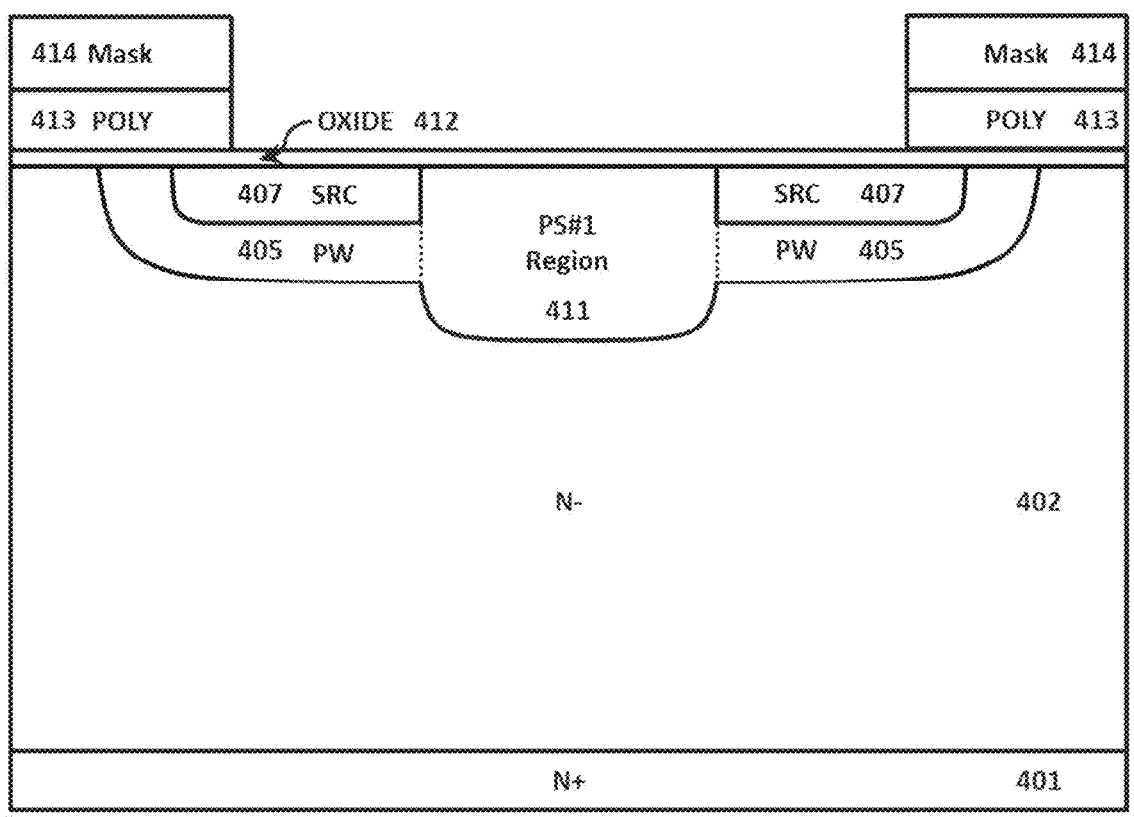
Figure 4N:
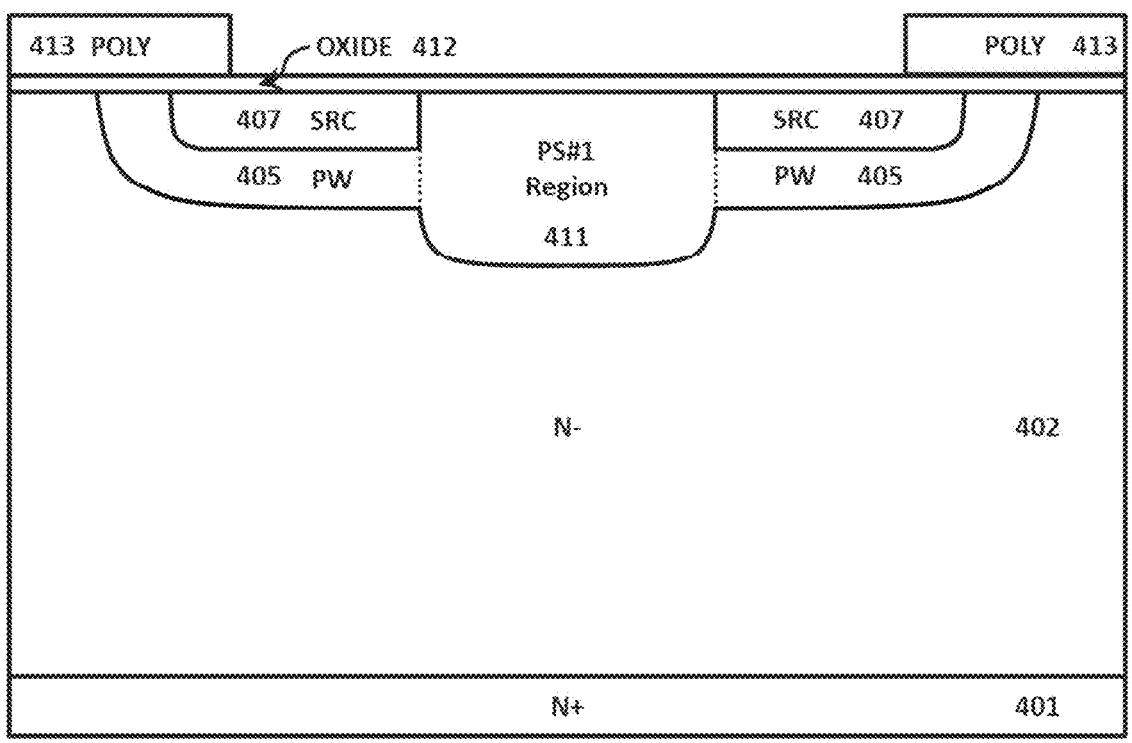
Figure 4O:
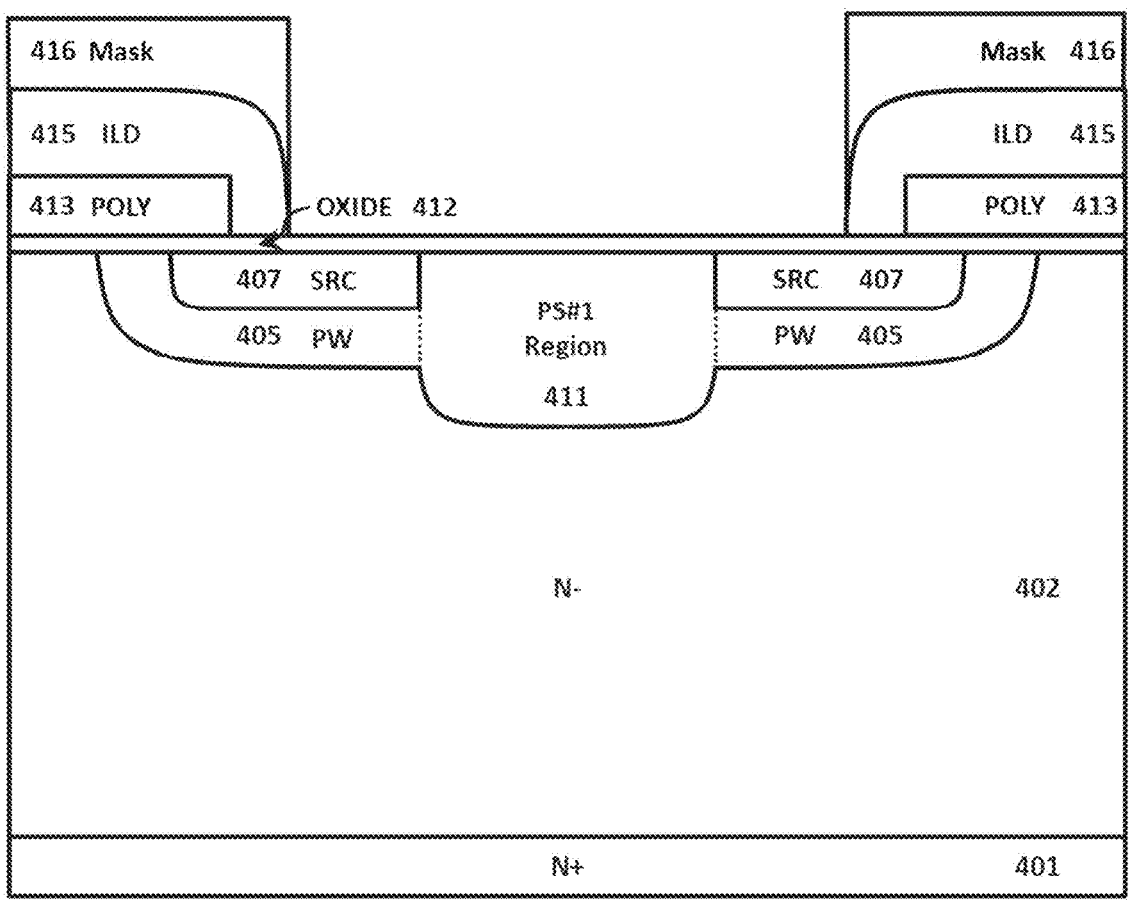
Figure 4P:
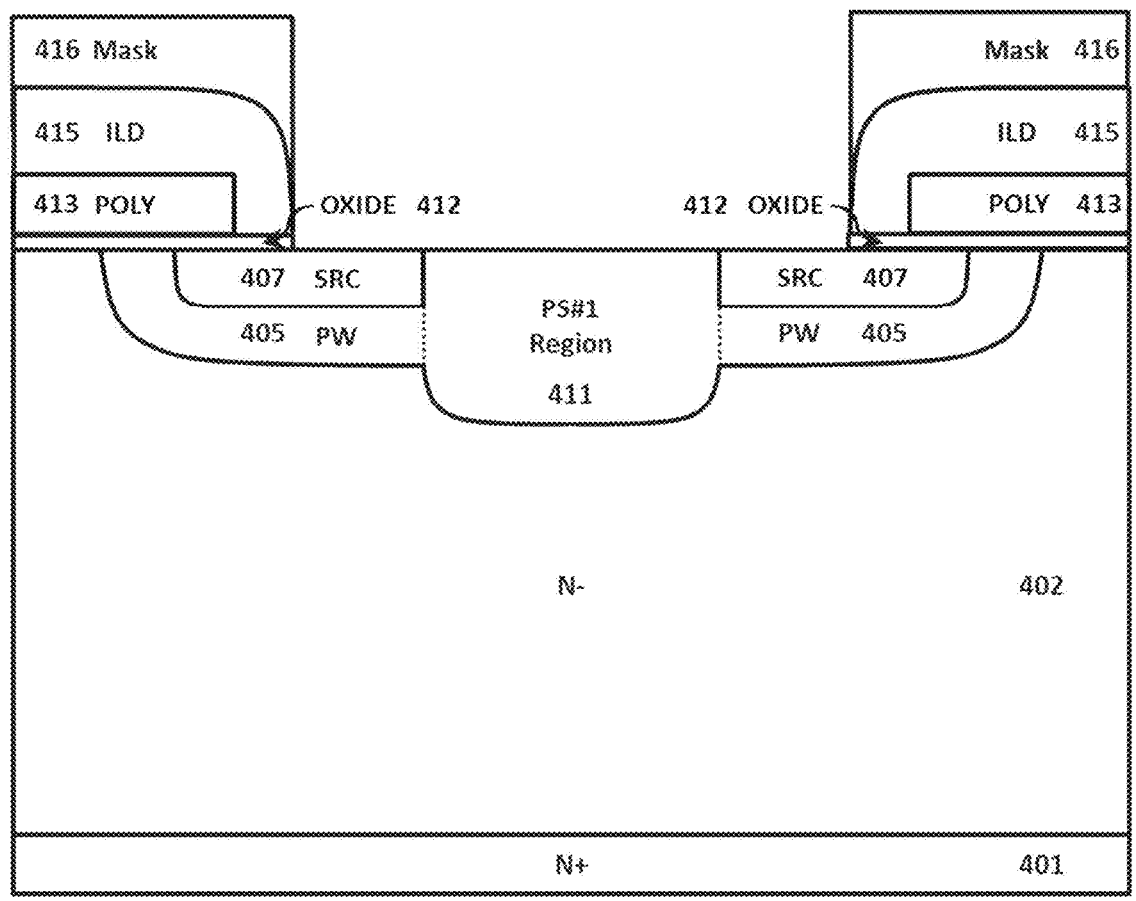
Figure 4Q:
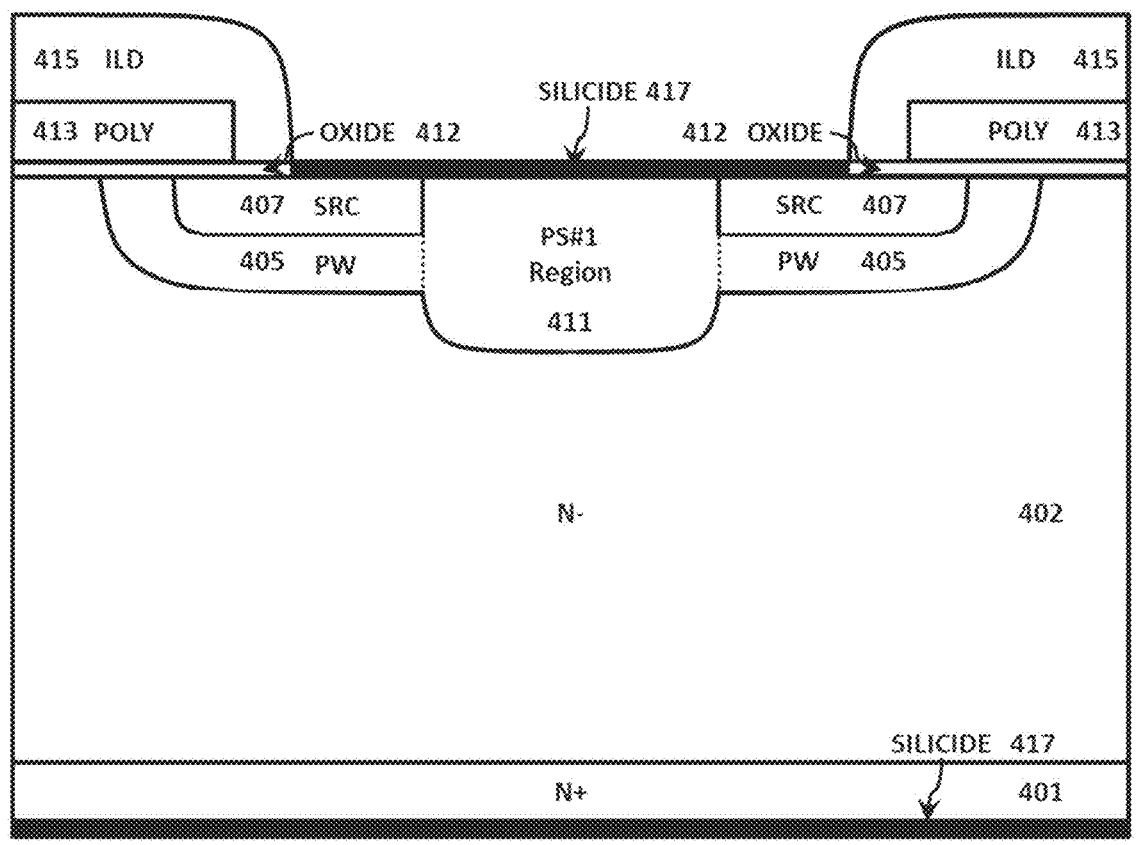
Figure 4R:
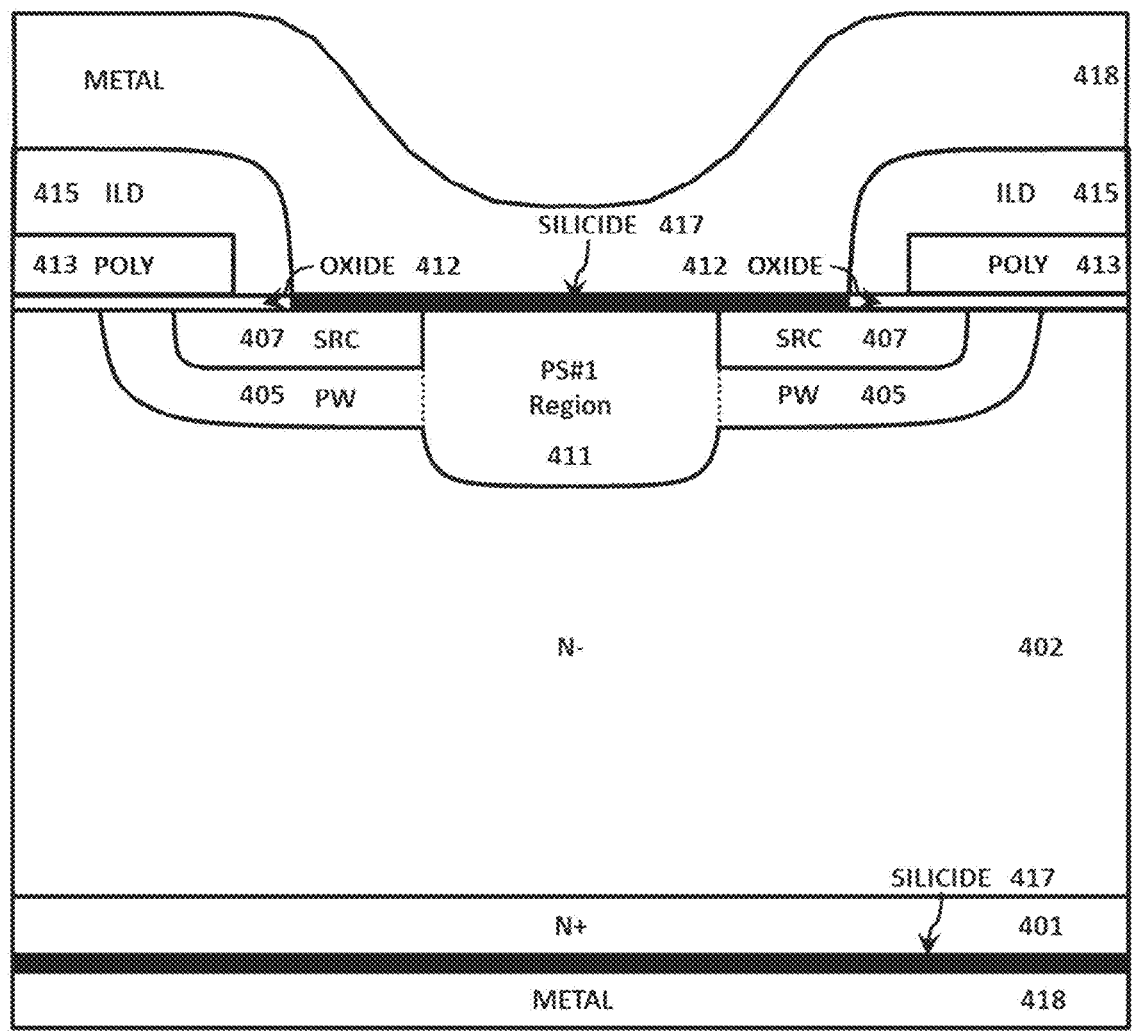

FIG. 4a to FIG. 4r describes the process of manufacturing the structure shown in FIG. 3. The manufacturing process for a SiC DMOSFET is on a SiC substrate 401 and starts with using a 4H—SiC Si-face epi-wafer with suitable doping ($10^{14}$-$10^{18}$ cm$^{-3}$) and thickness (1 μm to 300 μm) for the epilayer 402 shown in FIG. 4a. A blanket hard mask 403 (comprising a CVD deposited layer of silicon dioxide, silicon nitride, silicon oxynitride, or a metallic layer such as nickel, with thickness ranging from 50 nm to 5 μm) is deposited in FIG. 4b and then patterned using photolithography followed by a dry etch (using a reactive ion-etch for example) as shown in FIG. 4c. A P-type implantation 404 (comprising boron or aluminum, at energies ranging from 10 keV to 800 keV, at implant doses ranging from $10^{12}$ cm$^{-2}$ to $10^{15}$ cm$^{-2}$) in FIG. 4d is performed to create a p-well 405 in FIG. 4e. The mask 403 is removed, and another hard mask layer 406 is deposited (comprising a CVD deposited layer of silicon dioxide, silicon nitride, silicon oxynitride, or a metallic layer such as nickel, with thickness ranging from 50 nm to 5 μm) and patterned in FIG. 4f to define the N+ source region. Notice that the center of the unit cell is masked for source (SRC) implantation. The SRC (N+ source region) 407 is formed by implantation of the n-type (N+) impurity 408 (comprising nitrogen or phosphorus, at energies ranging from 10 keV to 500 keV, at implant doses ranging from $10^{13}$ cm$^{-2}$ to $10^{16}$ cm$^{-2}$) as shown in FIG. 4g. After removing the hard mask 406 another hard mask layer 409 is deposited and patterned in FIG. 4h. The PS #1 region 411 is formed by implantation of the p-type impurity 410 in FIG. 4h. The deep PS #1 region can be formed using ion-implantation of aluminum or boron, which are commonly used p-type dopants in 4H—SiC. Boron can be advantageously used for forming this deep P-type Sinker region, since it has significantly higher implant range as compared to aluminum, and deep implants using boron can be formed with lower ion-implantation energies. In one example, the PS #1 region can be formed with boron implantation with a 20-50% higher depth as compared to the p-well region. The boron implant may comprise of energies ranging from 10 keV to 800 keV, at implant doses ranging from $10^{12}$ cm$^{-2}$ to $10^{15}$ cm$^{-2}$. In a related embodiment of this invention, the doping profile of the PS #1 region can be formed with gradually decreasing doping concentration with a peak value at the SiC surface. This graded doping profile for the PS #1 region can prevent the formation of sharp corners in the 3-Dimensional landscape and is beneficial for spreading the peak electric field during high drain bias operation over a larger area which results in a higher breakdown voltage. In one example, the PS #1 region can be formed with a peak doping in the range of $10^{19}$ cm$^{-3}$ to $10^{20}$ cm$^{-3}$ close to the SiC surface, which linearly decreases as a function of depth into the silicon carbide to the background N-drift layer doping (in the range of $10^{14}$-$10^{16}$ cm$^{-3}$). A linearly graded doping profile of the PS #1 region results in a sufficient portion of the drain potential being supported within the PS #1 region and not only the N− drift region. This results in a pseudo charge-balanced structure, which promotes breakdown over a larger SiC region, which results in a lower critical electric field at breakdown and consequently a lower electric field in the gate insulator. This is followed by the removal of the hard mask 409 (using either dry or wet etching techniques commonly practiced by those in the field) in FIG. 4i. Then the oxide layer 412 which is the gate oxide is either thermally grown or deposited using chemical vapor deposition (CVD) in FIG. 4j. The thickness of the gate oxide could range from 10 nm to 100 nm. Either dry or wet thermal oxidation could be used for oxide growth. Plasma-enhanced CVD (PECVD) or low-pressure CVD (LPCVD) could be used for gate oxide deposition. A polysilicon gate layer is then deposited on the top 413 in FIG. 4k. The polysilicon layer may be deposited using PECVD or LPCVD. The polysilicon layer may be degenerately doped using boron or phosphorus, either in-situ or in a subsequent step. In-situ doping may be performed by the addition of PH3 precursor to the polysilicon deposition chemistry. Post-deposition doping of polysilicon may be performed by depositing a layer of POCl$_3$ followed by a drive-in step at temperatures ranging from 700-900° C. A hard mask 414 is deposited on top and patterned as shown in FIG. 4l. The polysilicon gate layer 413 is etched by using the patterned mask layer 414 in FIG. 4m. The mask layer 414 is then removed from the top in FIG. 4n. An interlayer dielectric (ILD) layer 415 (comprising 50 nm-1000 nm thick silicon dioxide, silicon nitride, silicon oxynitride layers or a stacked combination thereof) is deposited on the wafer; a hard mask 416 is deposited and patterned on top to define the ILD opening; the ILD layer is patterned using the hard mask 416 as shown in FIG. 4o. Further the gate oxide is etched using the same mask 416 in FIG. 4p. The mask 416 is then removed and a nickel silicide region 417 is formed on the exposed SiC surface in FIG. 4q. Interconnect metal layers 418 (either Al or Ag or Au) is deposited and patterned on the top and bottom of the chip in. FIG. 4r The main problem in the prior art device in FIG. 1a as recognized by the authors of this invention is that the p-well regions do not effectively shield the sensitive gate oxide from the high electric fields present in 4H—SiC especially during high drain bias (blocking mode operation). The presence of the deeper PS #1 region results in moving the peak electric field location from the corner of the p-well region to the PS #1 region. In other words, the location of the peak electric field in 4H—SiC during high drain bias operation has been moved farther away from the gate oxide.

The advantage of this embodiment is that the breakdown location has been moved from the corner of the p-well region to the base of the newly formed PS #1 region, which is both farther away from the gate oxide interface and deeper into the semiconductor. The electric field in the gate oxide for the device structure incorporating the PS #1 region is now significantly lower than the prior art device which is shown using device simulation using SILVACO ATLAS in FIG. 5b.

Figure 5A:
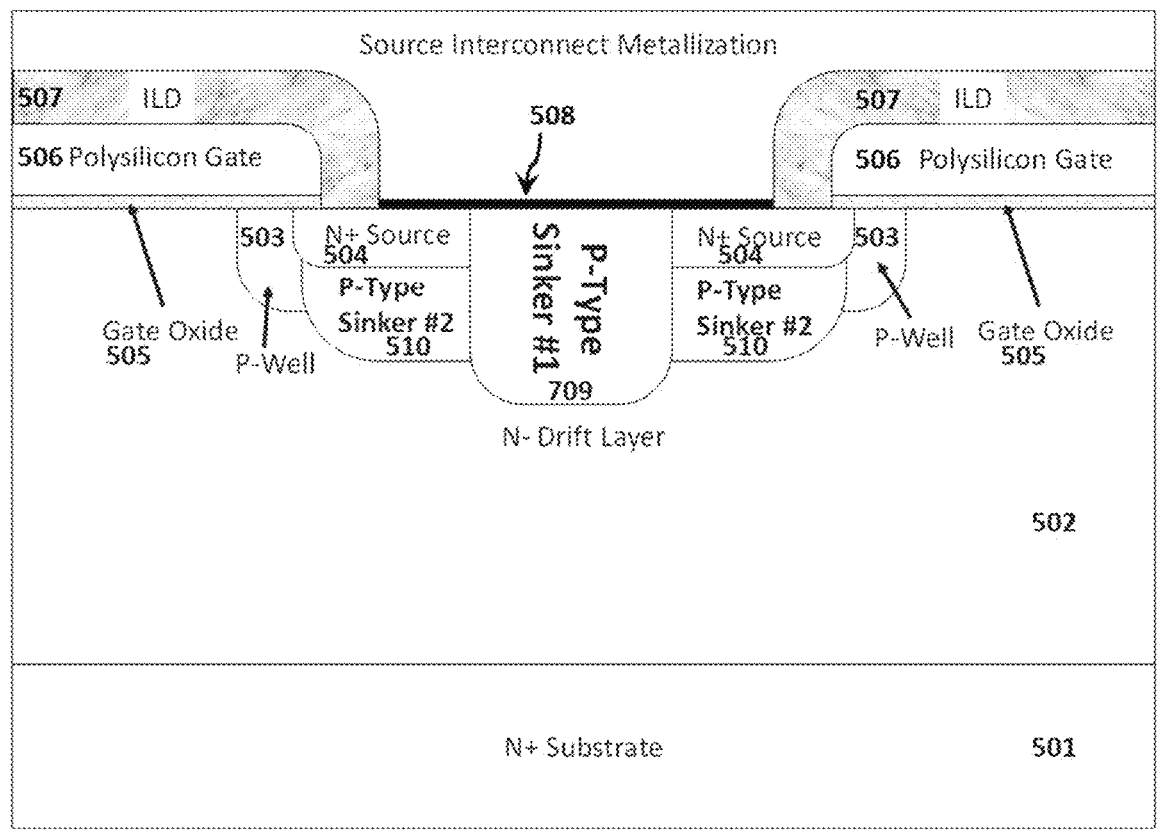
FIG. 5a shows an embodiment of a SiC DMOSFET where a P-type Sinker #2 region under the N+ source region is formed in addition to the deep P-type Sinker #1 region.

An embodiment shown in FIG. 5a is the cross-sectional unit cell of a vertical power DMOSFET. The key regions of this device are a p-well region 503, which is formed by ion-implantation or epitaxial re-growth of a p-type species such as aluminum or boron. There is an N+ source region 504, N− drift layer 502, and an N+ substrate 501. In the ON state when a gate voltage is applied to the polysilicon gate 506, the current flows vertically from the drain 501, through the inversion layer which is formed at the top of the p-well layer 503, through the N+ source region 504, and out through the source metallization 508. There are several key features in a power MOSFET, which include the pitch of the unit cell, which is the repeat unit for the MOSFET, the channel length, which is the portion of the p-well in which the inversion channel is formed, the distance between two successive p-wells, which is referred to as the JFET region or the JFET gap and the thickness of the gate oxide 505. Another feature is an ILD layer 507 which is used to insulate the source interconnect metallization 508 from the polysilicon gate 506. Here a second P-type Sinker #2 (PS #2) region 510 under the N+ source region 504 is formed in addition to the PS #1 region 509 already described in an embodiment shown in FIG. 3. The PS #2 region is formed deeper than the p-well region 503 but shallower than the PS #1 region 509. For example, the PS #2 region 510 can be made 20% deeper than the p-well region 503, while the PS #1 region 509 can be made 20% deeper than the PS #2 region 510.

The presence of the PS #2 region results in a sharing of the peak electric field under high drain bias operation between the PS #1 and PS #2 regions. The presence of the PS #2 region alleviates a local maximum of the peak electric field in the device structure under high drain bias conditions. In the prior art SiC MOSFET shown in FIG. 1a, the design of the p-well region needs to satisfy conflicting requirements. The electrical dose in the p-well region under the N+ source region must be high enough to prevent reach-through breakdown under off-state (high drain bias) operation. But, at the same time, the surface doping of the p-well region must be low enough to maintain a reasonably low gate threshold voltage and device ON resistance. In this context, the PS #2 region introduced in this embodiment can be thought of as a secondary p-well region and can be designed with the main purpose of preventing reach-through breakdown and for appropriately shaping the electric field profile under high drain bias operation. The presence of the PS #2 region frees up the constraint in the design of the primary p-well region, which can be used for ON-state related device metrics such as gate threshold voltage and ON resistance. Since with the introduction of the PS #2 region, p-well region does not have to be designed with the objective of supporting the breakdown voltage it gives a lot more flexibility to the designer to design the p-well region suitably for just MOS channel formation.

Figure 5B:
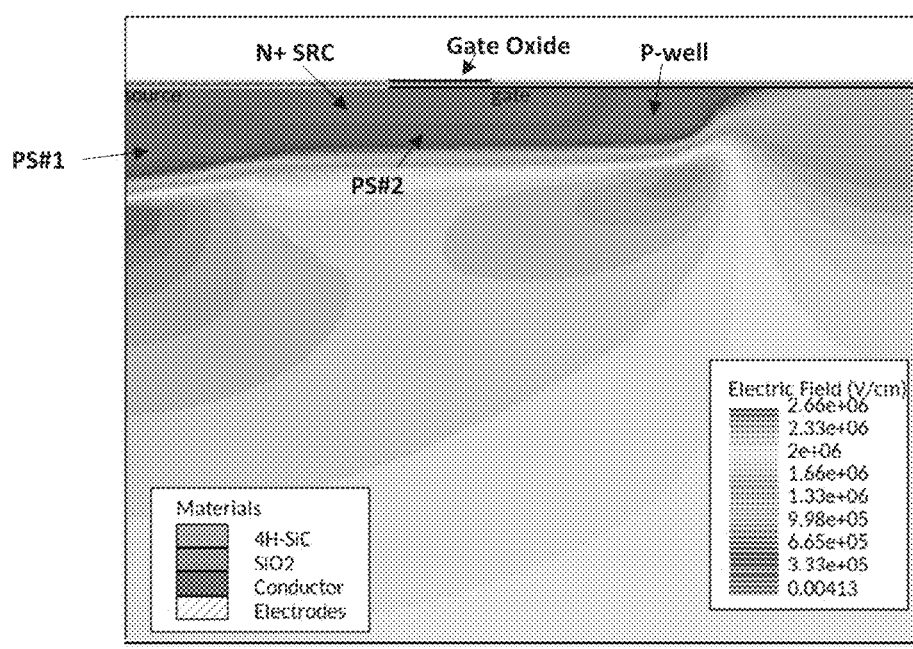

Breakdown simulation FIG. 5b of a SiC DMOSFET designed according to the two embodiments described in FIG. 3 and FIG. 5a shows that the peak electric field location has been moved away from the corner of the p-well region to the center of the unit cell, which results in a lower electric field in the gate oxide layer.

Figure 6A:
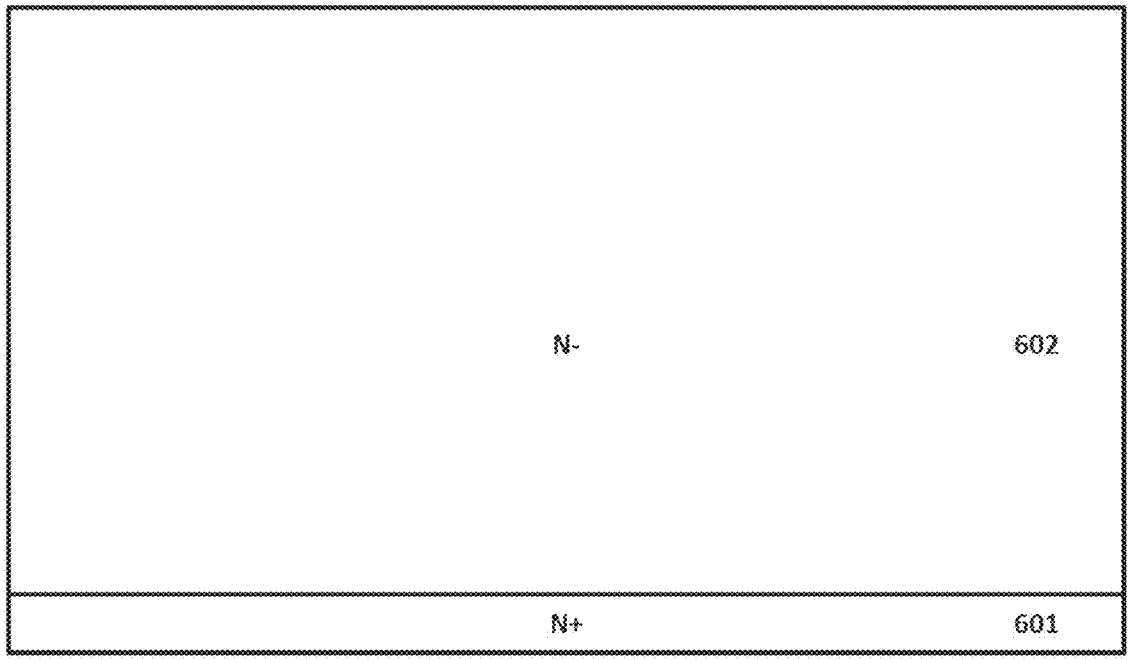
Figure 6B:
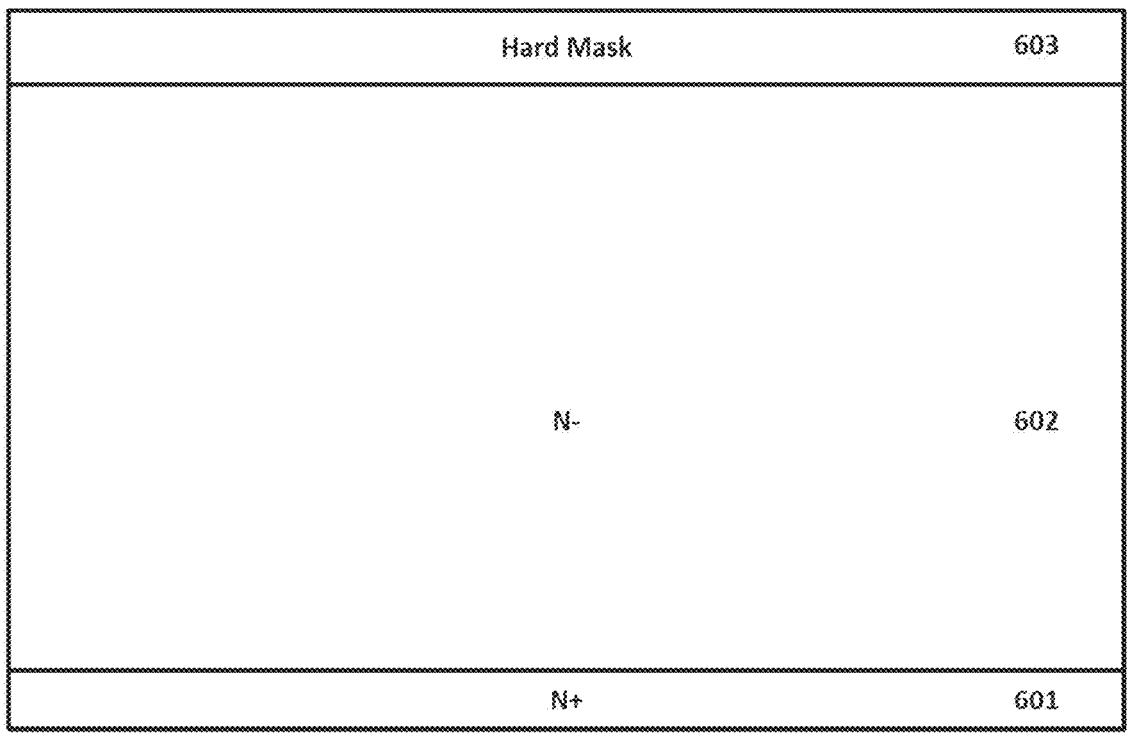
Figure 6C:
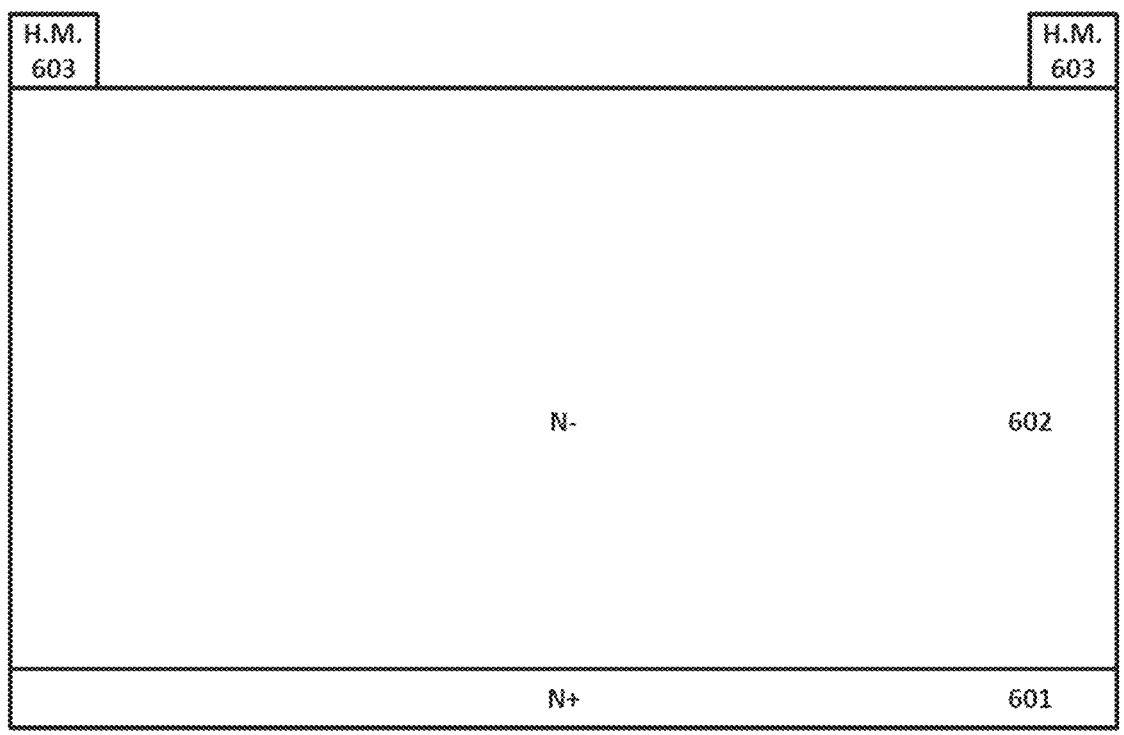
Figure 6D:
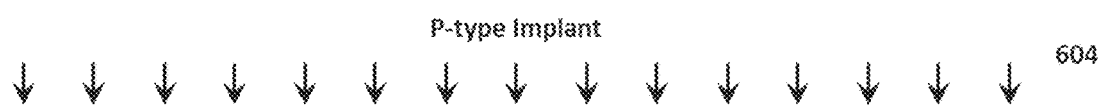
Figure 6D:
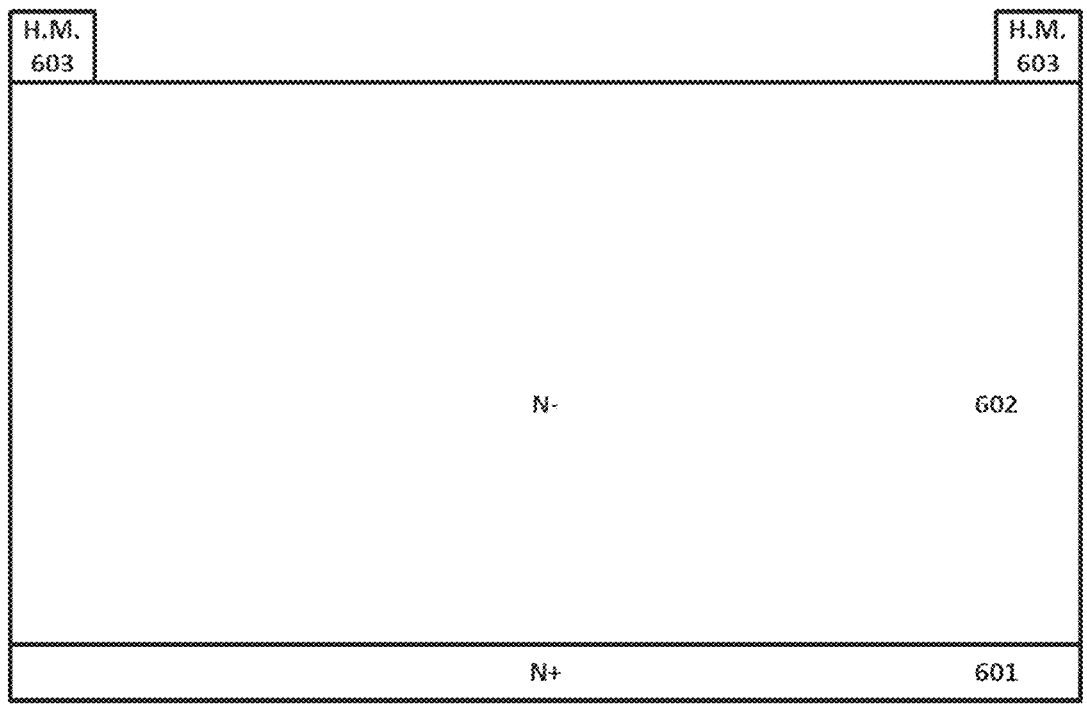
Figure 6E:
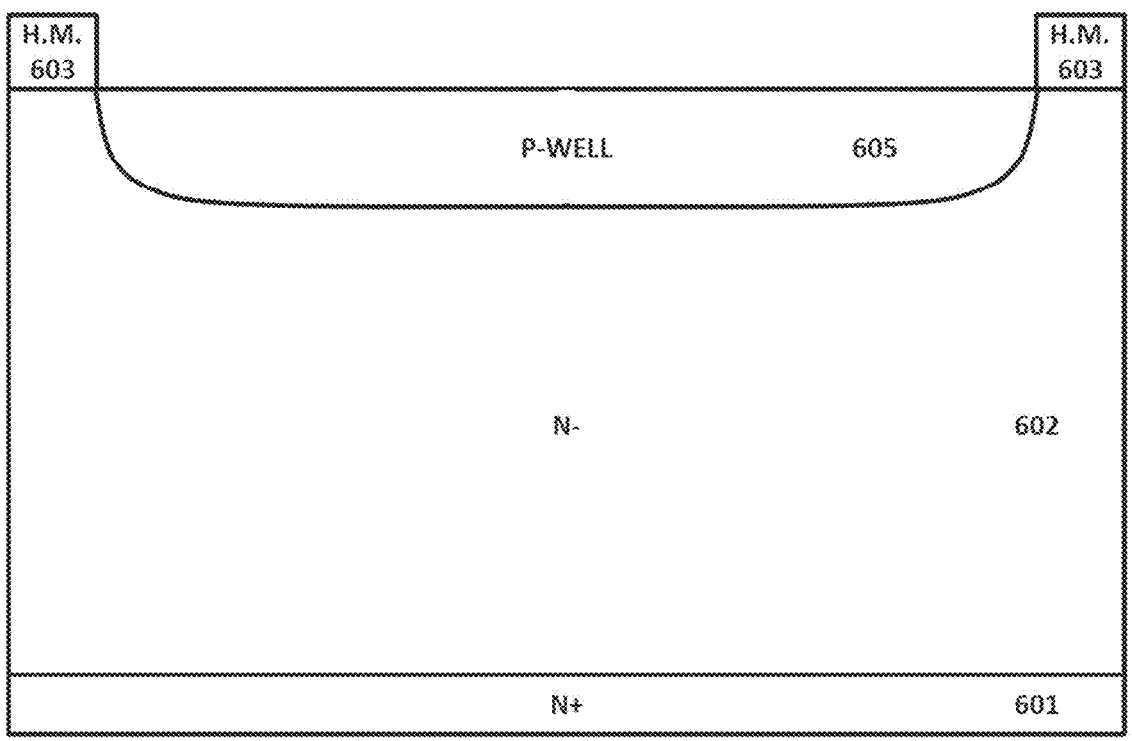
Figure 6F:
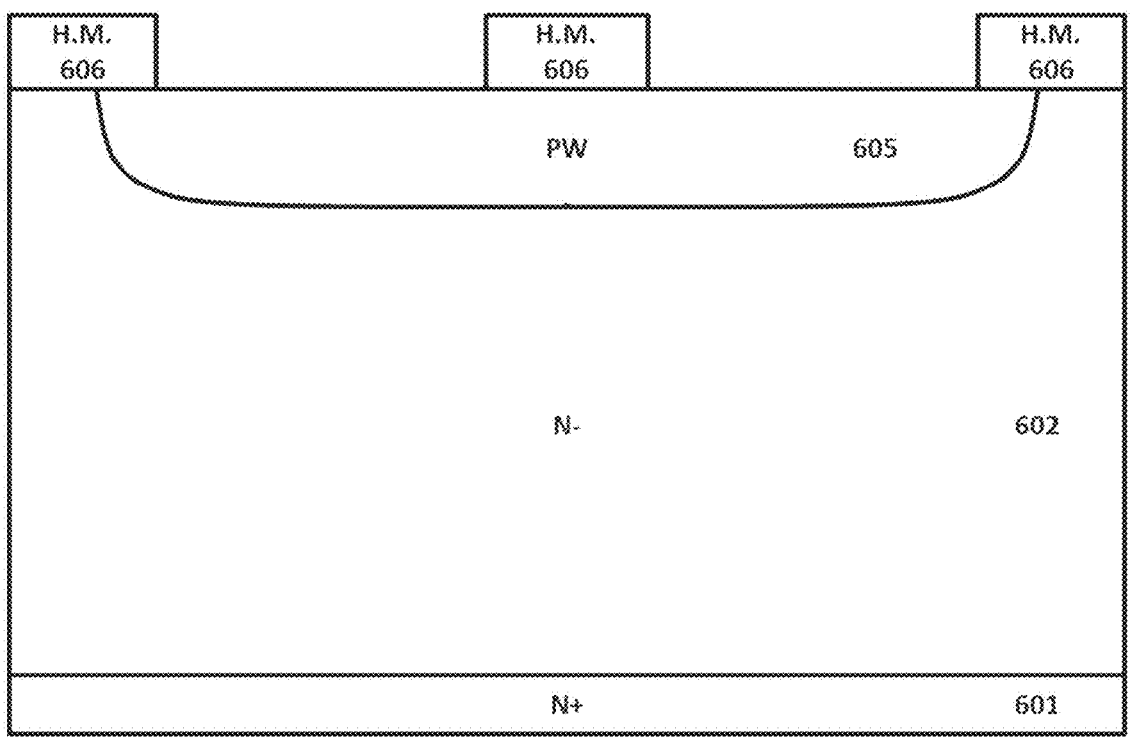
Figure 6G:
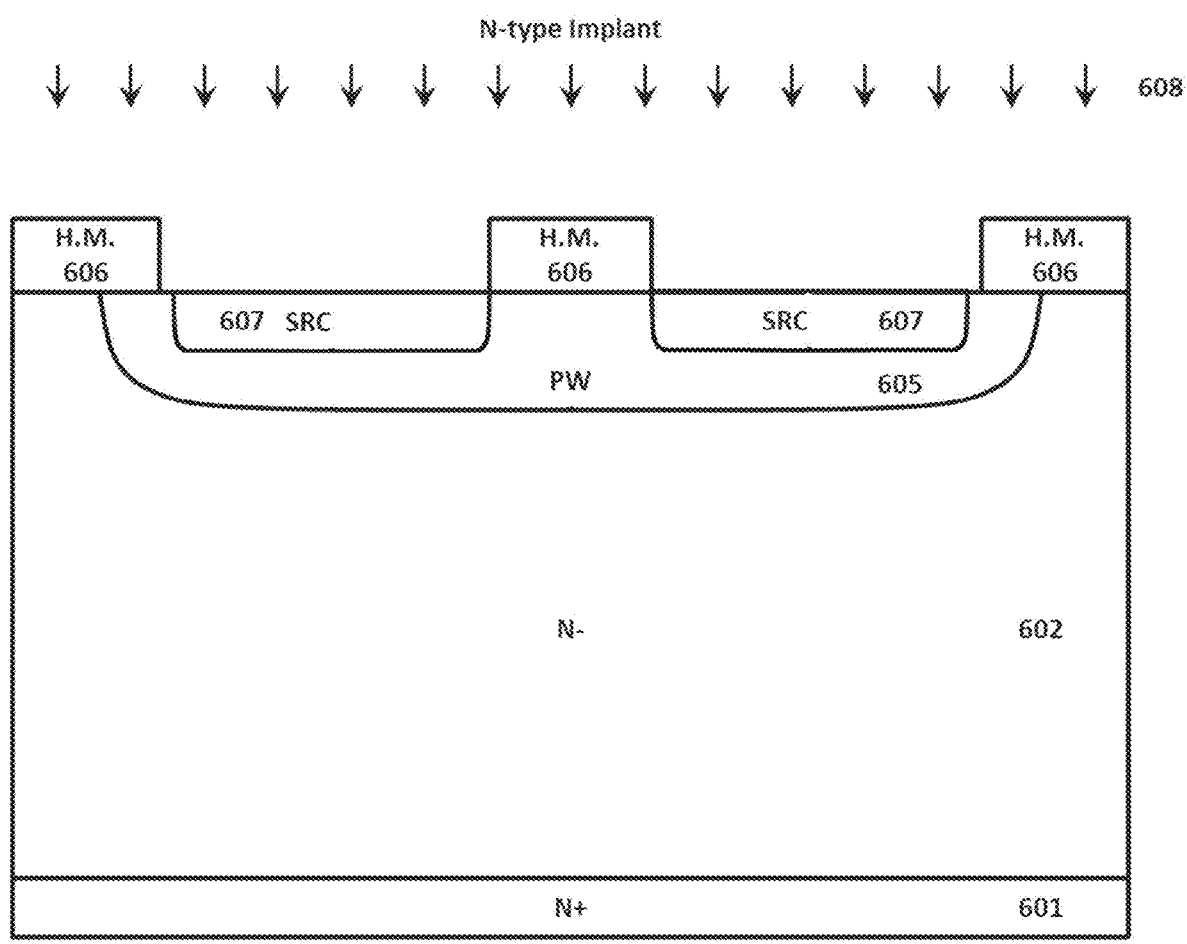
Figure 6H:
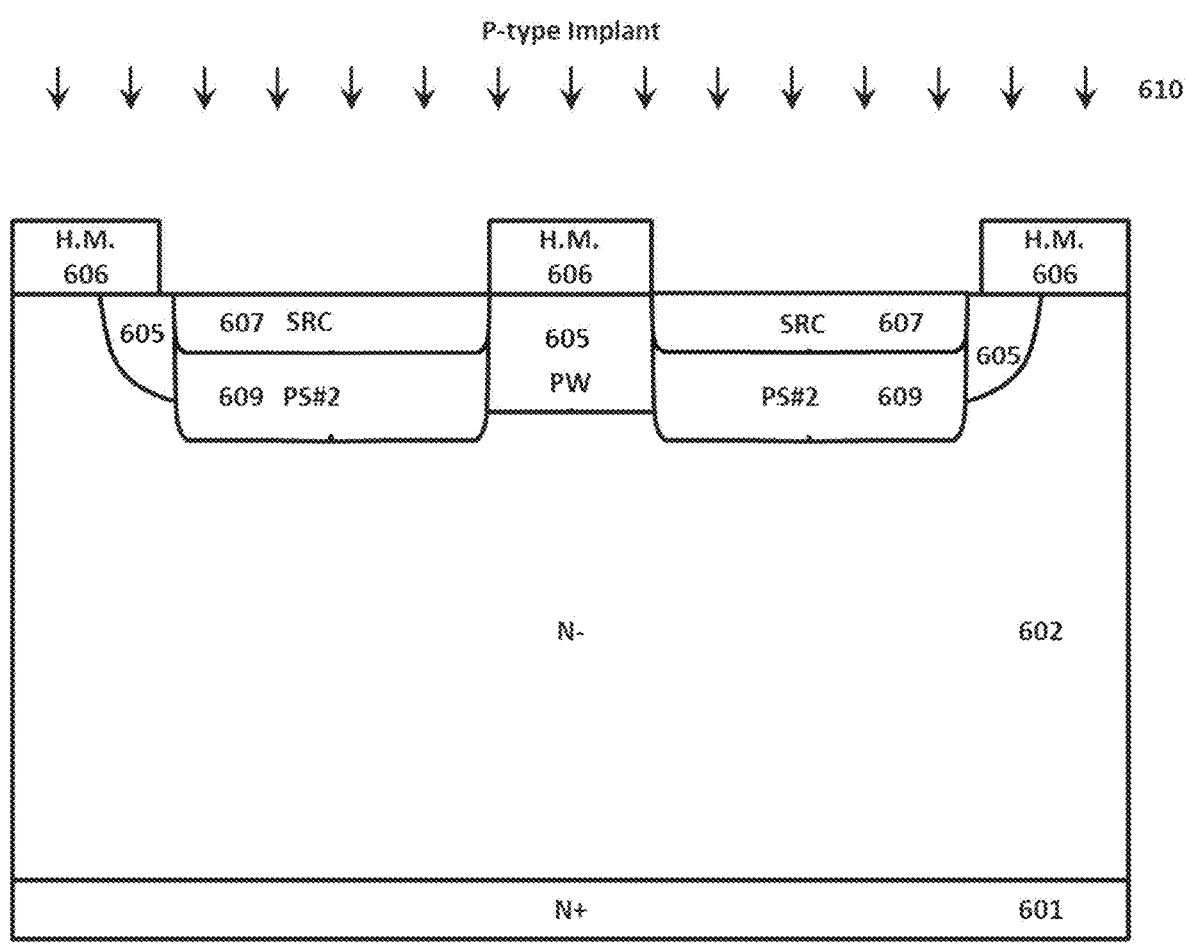
Figure 6I:
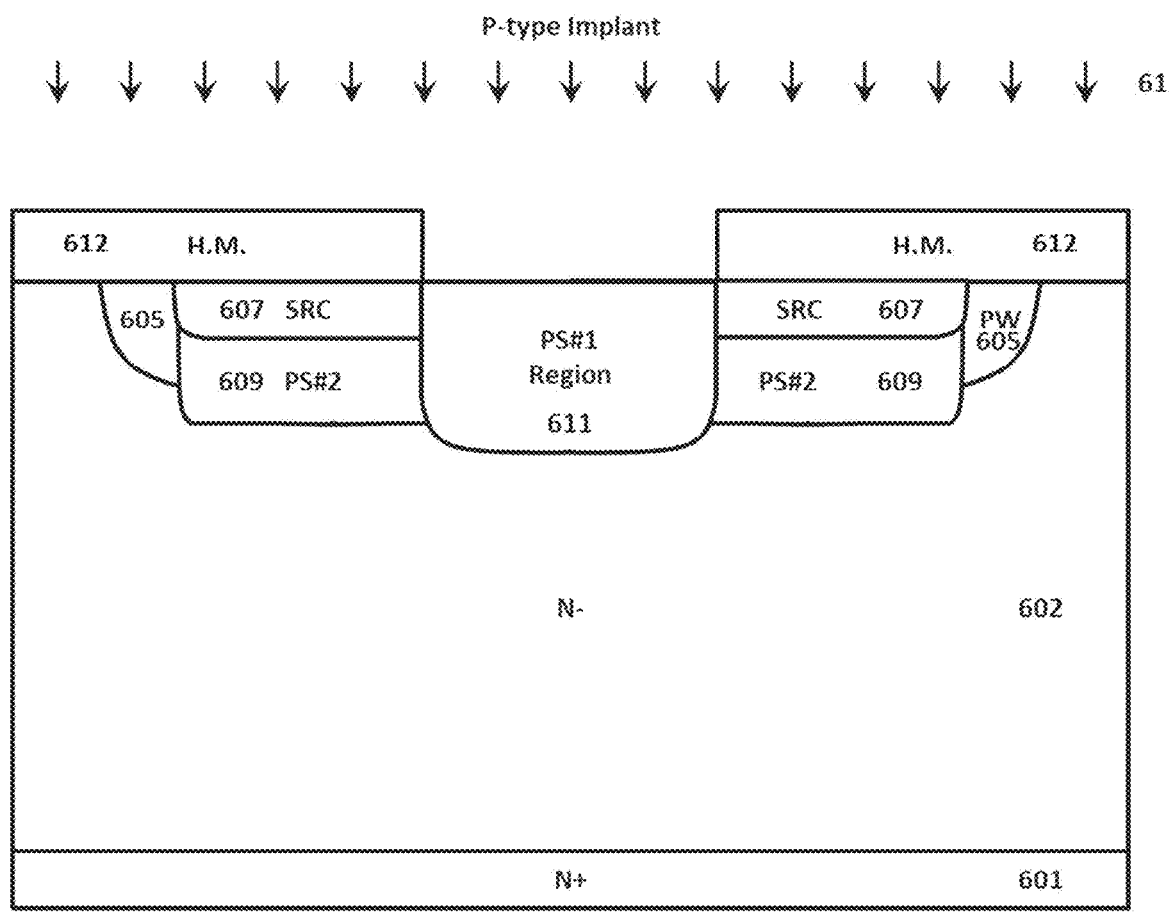
Figure 6J:
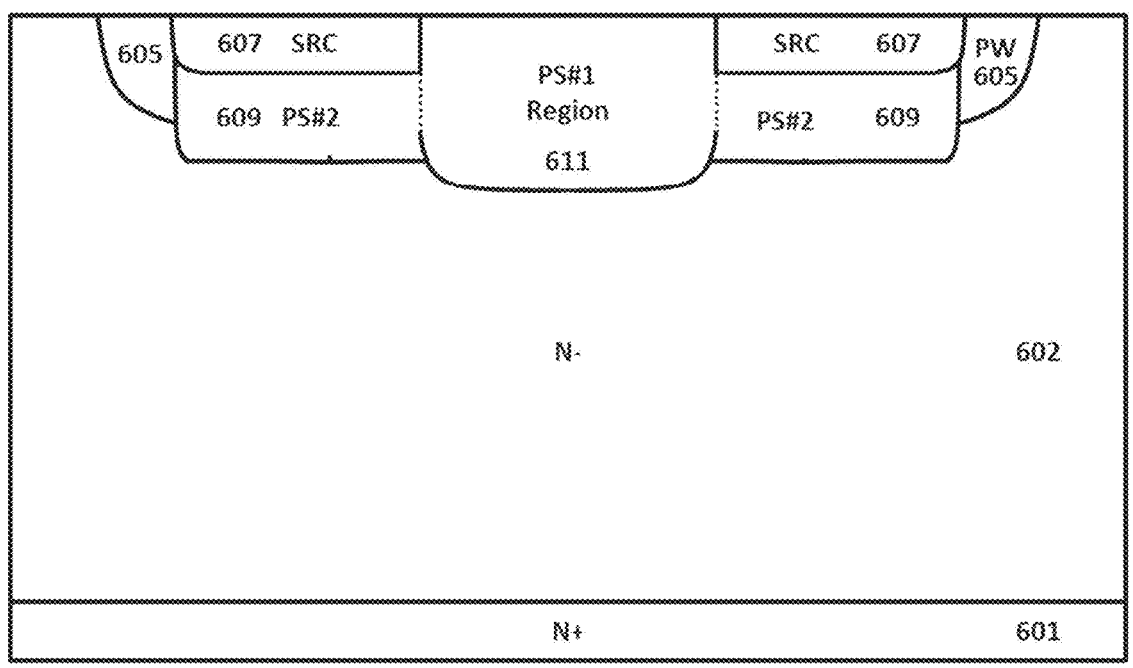

FIG. 6a to FIG. 6j describes the process of manufacturing the structure shown in FIG. 5a. The manufacturing process for a SiC DMOSFET is on a SiC substrate 601 and starts with using a 4H—SiC Si-face epi-wafer with suitable doping ($10^{14}$-$10^{18}$ cm$^{-3}$) and thickness (1 μm to 300 μm) for the epilayer 602 shown in FIG. 6a. A blanket hard mask 603 (comprising a CVD deposited layer of silicon dioxide, silicon nitride, silicon oxynitride, or a metallic layer such as nickel, with thickness ranging from 50 nm to 5 μm) is deposited in FIG. 6b and then patterned using photolithography followed by a dry etch (using a reactive ion-etch for example) as shown in FIG. 6c. A P-type implantation 604 (comprising Boron or Aluminum, at energies ranging from 10 keV to 800 keV, at implant doses ranging from $10^{12}$ cm$^{-2}$ to $10^{15}$ cm$^{-2}$) is performed in FIG. 6d to create a p-well 605 in FIG. 6e. The mask 603 is removed, and another hard mask layer 606 is deposited (comprising a CVD deposited layer of silicon dioxide, silicon nitride, silicon oxynitride, or a metallic layer such as nickel, with thickness ranging from 50 nm to 5 μm) and patterned in FIG. 6f to define the N+ source region. Notice that the center of the unit cell is masked for source (SRC) implantation. The SRC (N+ source region) 607 is formed by implantation of the n-type (N+) impurity 608 (comprising nitrogen or phosphorus, at energies ranging from 10 keV to 500 keV, at implant doses ranging from $10^{13}$ cm$^{-2}$ to $10^{16}$ cm$^{-2}$) as shown in FIG. 6g. The PS #2 region 609 is formed by implantation of the P type impurity 610 as shown in FIG. 6h. The deep PS #2 region can be formed using ion-implantation of aluminum or boron, which are commonly used p-type dopants in 4H—SiC. Boron can be advantageously used for forming this deep P-type Sinker region, since it has significantly higher implant range as compared to aluminum, and deep implants using boron can be formed with lower ion-implantation energies. If using aluminum, the PS #2 region may comprise implant energies ranging from 100 keV to 1 MeV and implant dose ranging from $10^{13}$ cm$^{-2}$ to $10^{16}$ cm$^{-2}$. If using boron, the PS #2 region may comprise implant energies ranging from 50 keV to 800 keV and implant dose ranging from $10^{13}$ cm$^{-2}$ to $10^{16}$ cm$^{-2}$. The same hard mask 606 utilized for forming the N+ source region is utilized for defining the ion-implanted PS #2 region. In this case, the PS #2 region is self-aligned under the N+ source region. The hard mask 606 is removed and another hard mask layer 612 is deposited and patterned in FIG. 6i. The PS #1 region 611 is formed by implantation of the P-type impurity 613 that may comprise aluminum or boron. Boron can be advantageously used for forming the PS #1 region, since it has significantly higher implant range as compared to aluminum, and deep implants using boron can be formed with lower ion-implantation energies. If using aluminum, the PS #1 region may comprise implant energies ranging from 100 keV to 1 MeV and implant dose ranging from $10^{13}$ cm$^{-2}$ to $10^{16}$ cm$^{-2}$. If using boron, the PS #1 region may comprise implant energies ranging from 50 keV to 800 keV and implant dose ranging from $10^{13}$ cm$^{-2}$ to $10^{16}$ cm$^{-2}$. PS #2 region can be formed with a depth higher than that of the p-well region but lower than that of the PS #1 region. As a second example of this embodiment, the PS #2 region can be made 20% deeper than the p-well region, while the PS #1 region can be made 20% deeper than the PS #2 region. In a related embodiment of this invention, the doping profile of the PS #1 and PS #2 regions can be formed with gradually decreasing doping concentration with a peak value at the SiC surface. This graded doping profile for the PS #1 and PS #2 regions can prevent the formation of sharp corners in the 3-Dimensional landscape and is beneficial for spreading the peak electric field during high drain bias operation over a larger area which results in a higher breakdown voltage. As examples, the PS #1 and PS #2 regions can be formed with a peak doping in the range of $10^{19}$ cm$^{-3}$ to $10^{20}$ cm$^{-3}$ close to the SiC surface and close to the N+ Source region, respectively. The doping concentration in the PS #1 and PS #2 regions may linearly decrease as a function of depth into the silicon carbide to the background N-drift layer doping (in the range of $10^{14}$-$10^{16}$ cm$^{-3}$). A linearly graded doping profile of the PS #1/PS #2 regions results in a sufficient portion of the drain potential being supported within the PS #1/PS #2 regions and not only the N– drift region. This results in a pseudo charge-balanced structure, which promotes breakdown over a larger SiC region, which results in a lower critical electric field at breakdown and consequently a lower electric field in the gate insulator. The formation of the PS #1 region is followed by the removal of the hard mask 612 (dry or wet etch) in FIG. 6*j*. The remaining steps in the process to create the structure shown in FIG. 5*a* exactly follows the same steps shown in FIG. 4*j* to FIG. 4*r*.

This "staircase" arrangement of the PS #1 and PS #2 regions with certain depths can result in an even lower electric field in the gate oxide under high drain bias operation. Yet another benefit of the PS #2 region is that the p-well region can be made shallower and with a lower implant dose, which can reduce the device ON-resistance while simultaneously increasing the gate threshold voltage, both of which are desirable from an applications standpoint. Thus, a better trade-off between the off-state and on-state performance is enabled by the teachings of this invention.

Figure 7A:
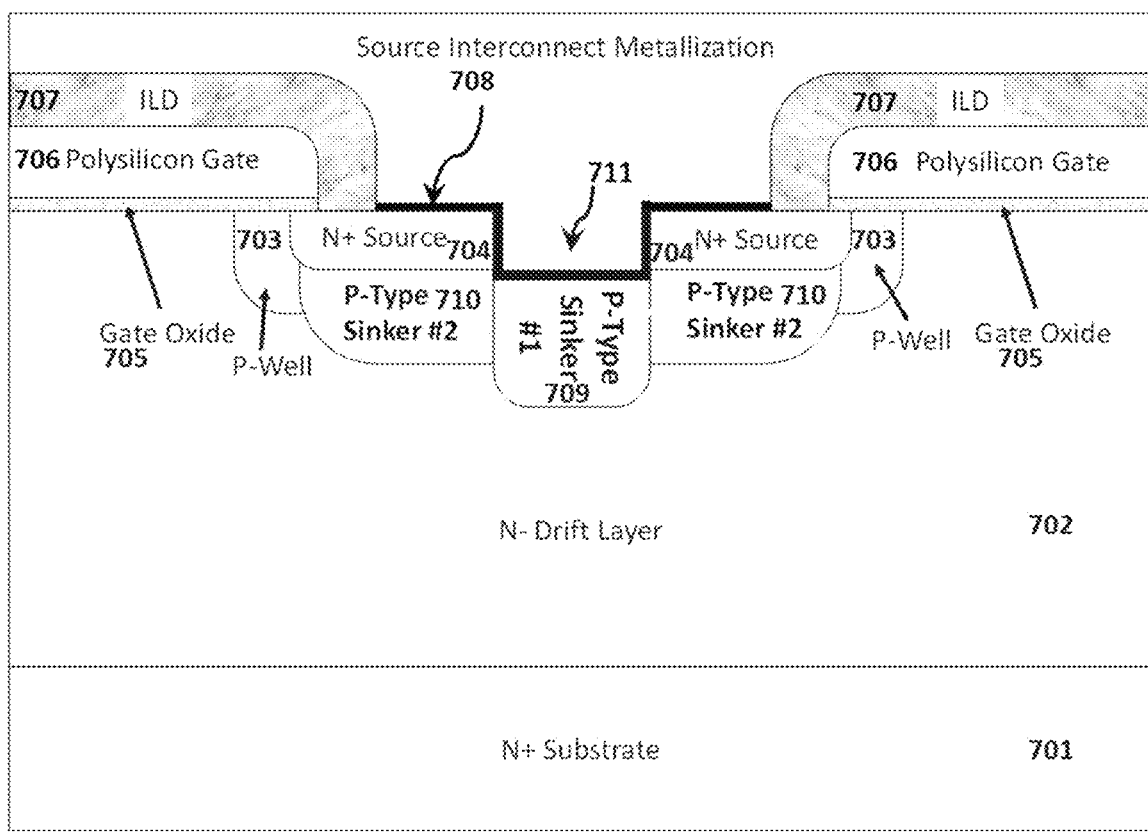
FIG. 7a shows an embodiment of a SiC DMOSFET where a trench is etched into the N+ source region before implanting the P-type Sinker #1 region.

An embodiment shown in FIG. 7*a* is the cross-sectional unit cell of a SiC DMOSFET. The key regions of this device are a p-well region 703, which is formed by ion-implantation or epitaxial re-growth of a p-type species such as aluminum or boron. There is an N+ source region 704, N– drift layer 702, and an N+ substrate 701. In the ON state when a gate voltage is applied to the polysilicon gate 706, the current flows vertically from the drain 701, through the inversion layer which is formed at the top of the p-well layer 703, through the N+ source region 704, and out through the source metallization 708. There are several key features in a power MOSFET, which include the pitch of the unit cell, which is the repeat unit for the MOSFET, the channel length, which is the portion of the p-well in which the inversion channel is formed, the distance between two successive p-wells, which is referred to as the JFET region or the JFET gap and the thickness of the gate oxide 705. Another feature is an inter-layer dielectric (ILD) layer 707 which is used to insulate the source interconnect metallization 708 from the poly-silicon gate 706. Here a trench 711 is etched into the N+ source region 704 before implanting the PS #1 region 709. Here PS #2 region 710 under the N+ source region 704 is formed in addition to the PS #1 region 709. The PS #2 region is formed deeper than the p-well region 703 but shallower than the PS #1 region 709. It is desirable to move the electric field location as far away from the gate oxide interface for robust blocking capability of the device operation which improves the device reliability. Moving the breakdown location to the middle of the unit cell which is furthest away from the gate oxide 705 is an embodiment and by etching a recess trench 711 into the N+ source region 704, you have effectively created a deeper PS #1 region than what was in FIG. 3 and FIG. 5*a* and moved the electric field even further away from the gate oxide region.

The PS #1 region is designed with the greatest depth among the P-type Sinker regions. While boron implantation is one technique to create such deep P-type regions in SiC technology, when you consider the maximum range of commercial ion-implanters available it becomes clear that ion implantation in SiC is not an easy process and deep ion implantation is particularly difficult. The function of the N+ source region which is also referred to as source trench is that the PS #1 region can be realized with lower ion-implantation energies, which lowers the cost and time of this implantation step, without any compromise in implantation depth. In the embodiment herein, a trench can be dry etched into SiC after the implantation of the N+ source region but before the implantation of the PS #1 region. The same hard mask layer used for the PS #1 implant can be used for etching the source trench into the SiC. In this embodiment herein, the hard mask layer is first patterned, followed by dry etching the trench into SiC, which is immediately followed by ion-implantation of the PS #1 region. The formation of the source trench naturally extends the depth of the PS #1 region. Hence, the PS #1 region can be realized with lower ion-implantation energies, which lowers the cost/time of this implantation step, without any compromise in implant depth. The formation of the source trench also removes the N+ source region and enables a direct connection of the P-well region with the N+ source ohmic contact thereby grounding the p-well and shorting the P-well region with the N+ source region.

Figure 7B:
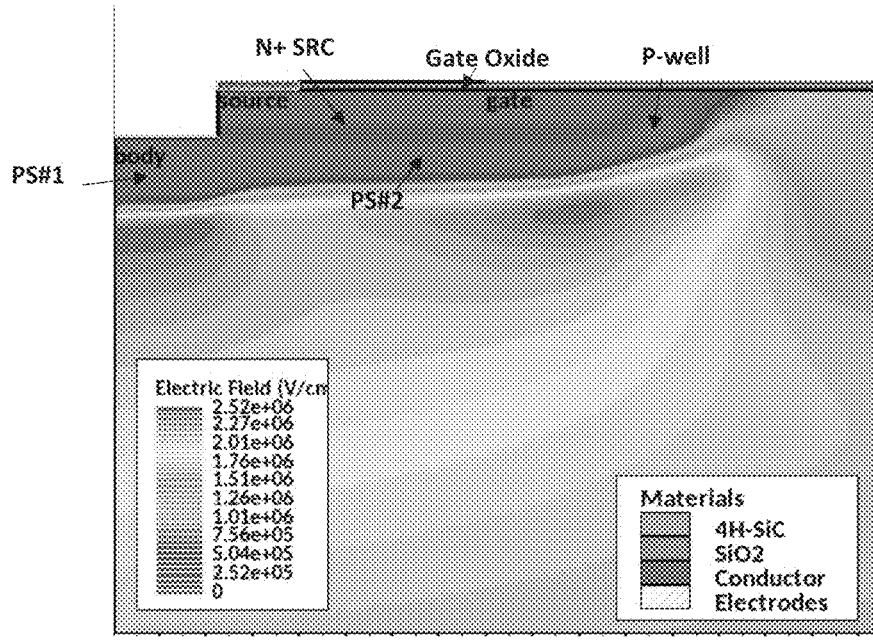

FIG. 7*b* is the breakdown simulation of a SiC MOSFET designed according to Embodiment shown in FIG. 7*a* which shows that the peak electric field location has been moved away from the corner of the p-well region to the center of the unit cell, which results in a lower electric field in the gate oxide layer.

Figure 8A:
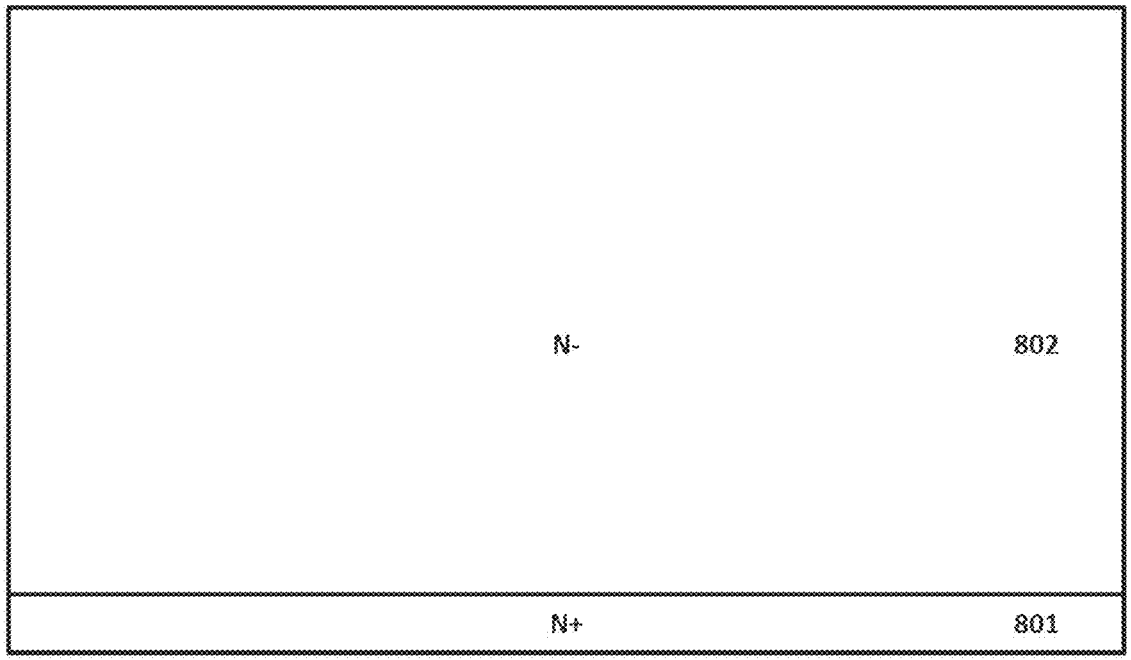
Figure 8B:
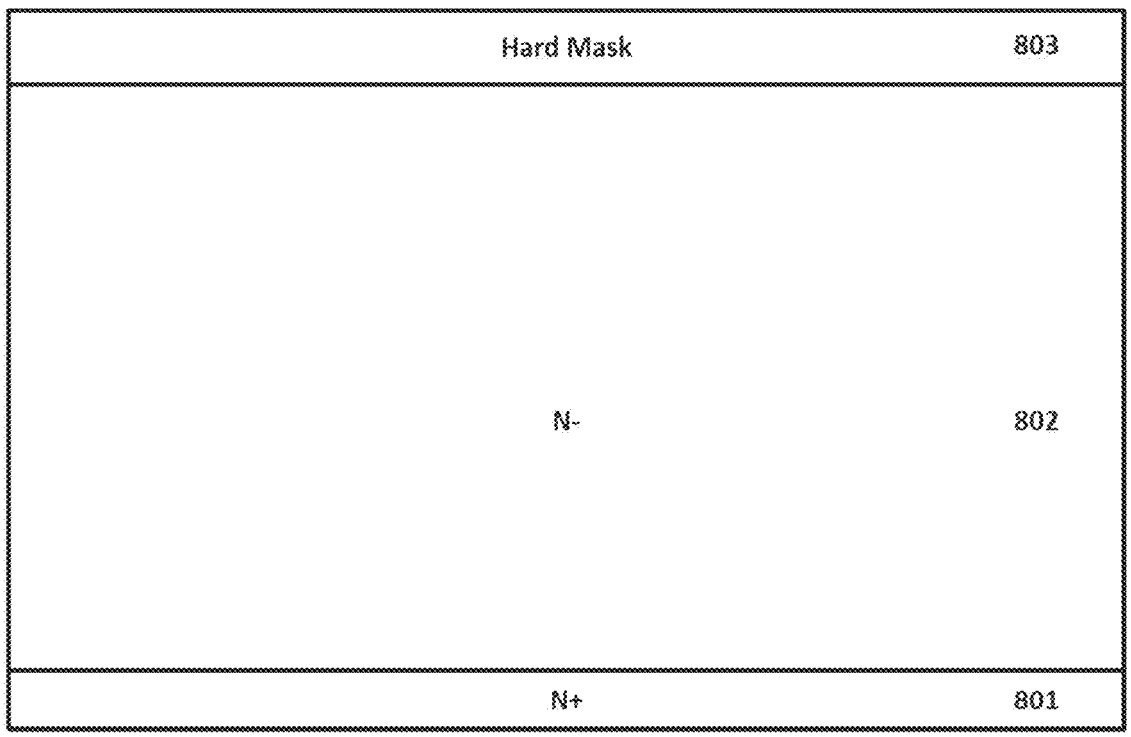
Figure 8C:
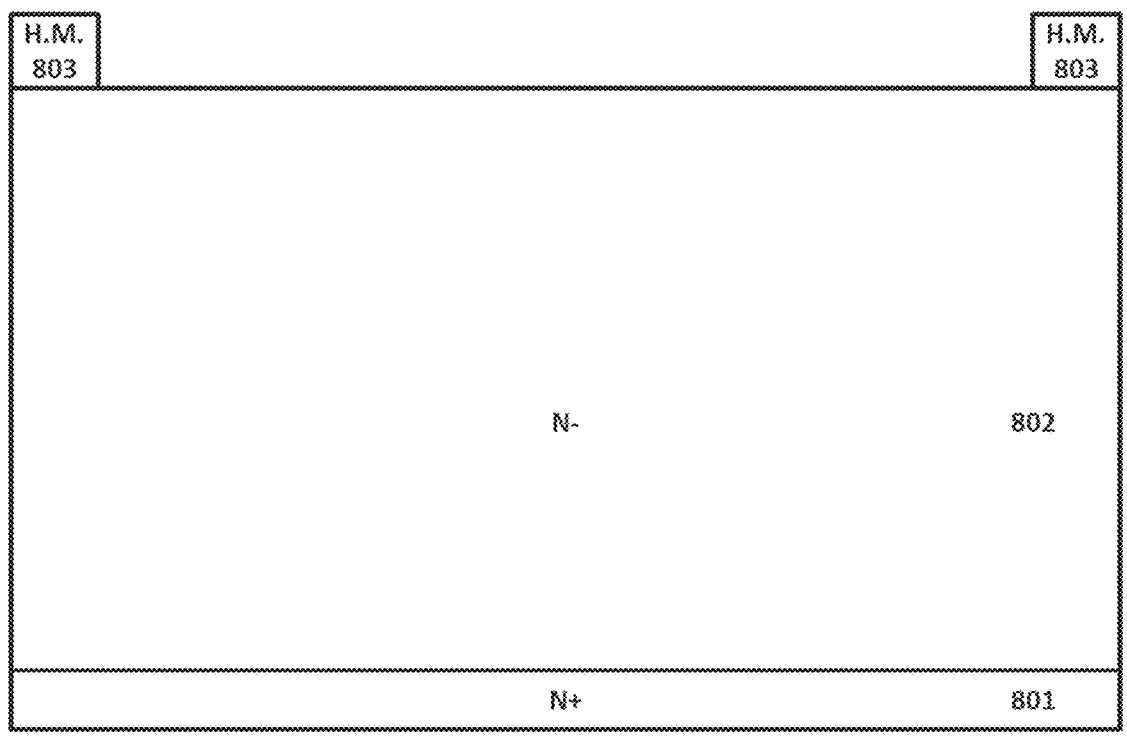
Figure 8D:
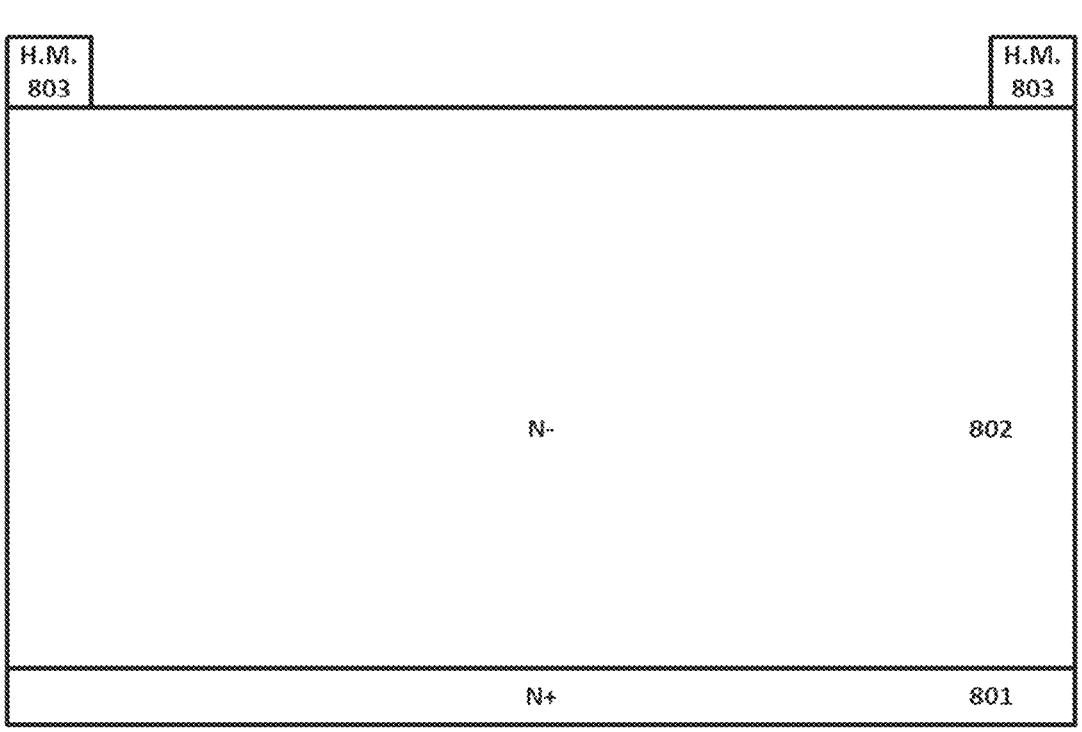
Figure 8E:
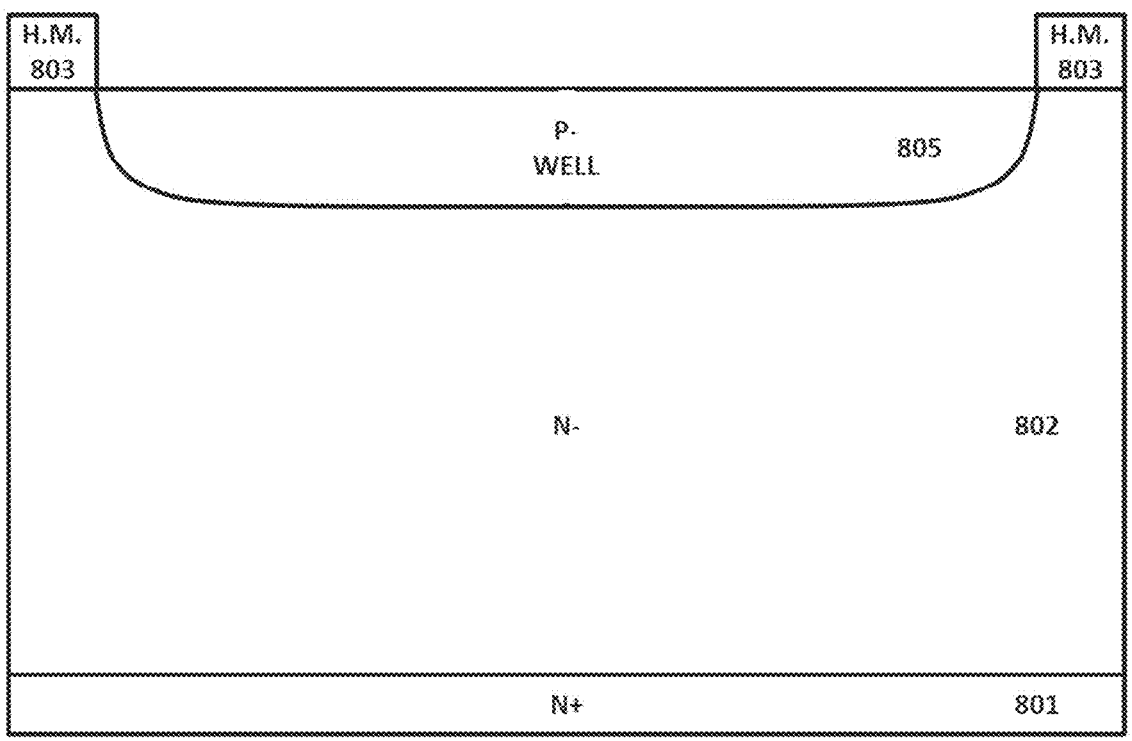
Figure 8F:
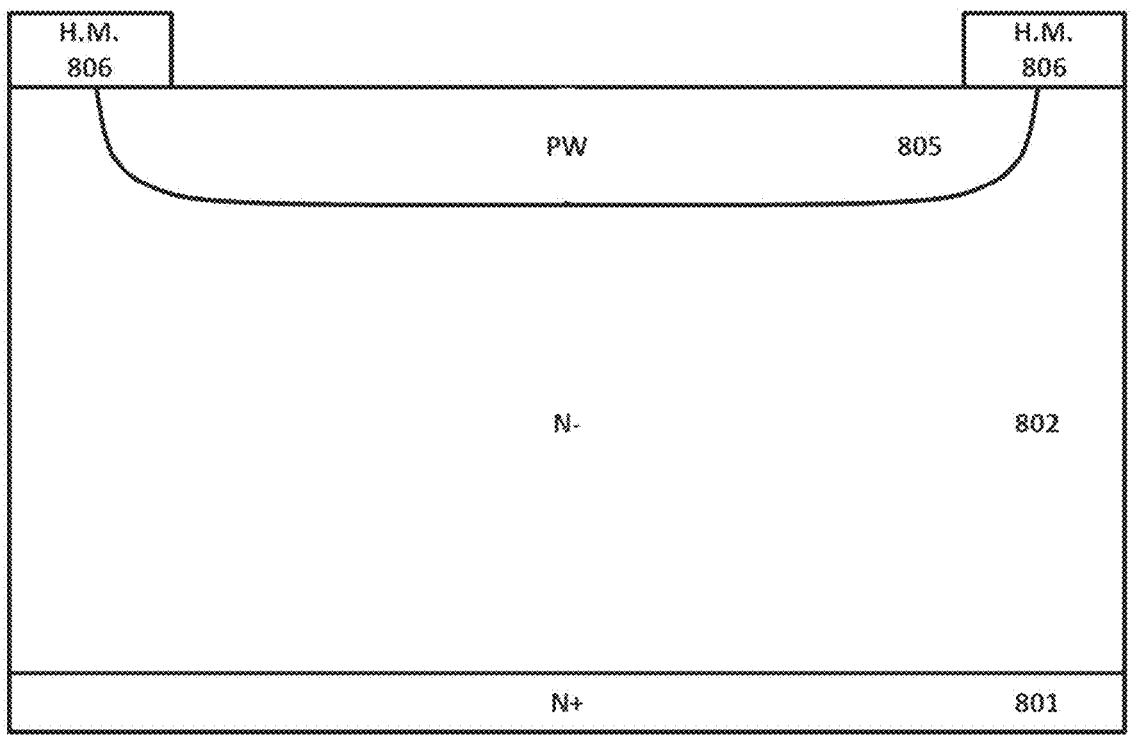
Figure 8G:
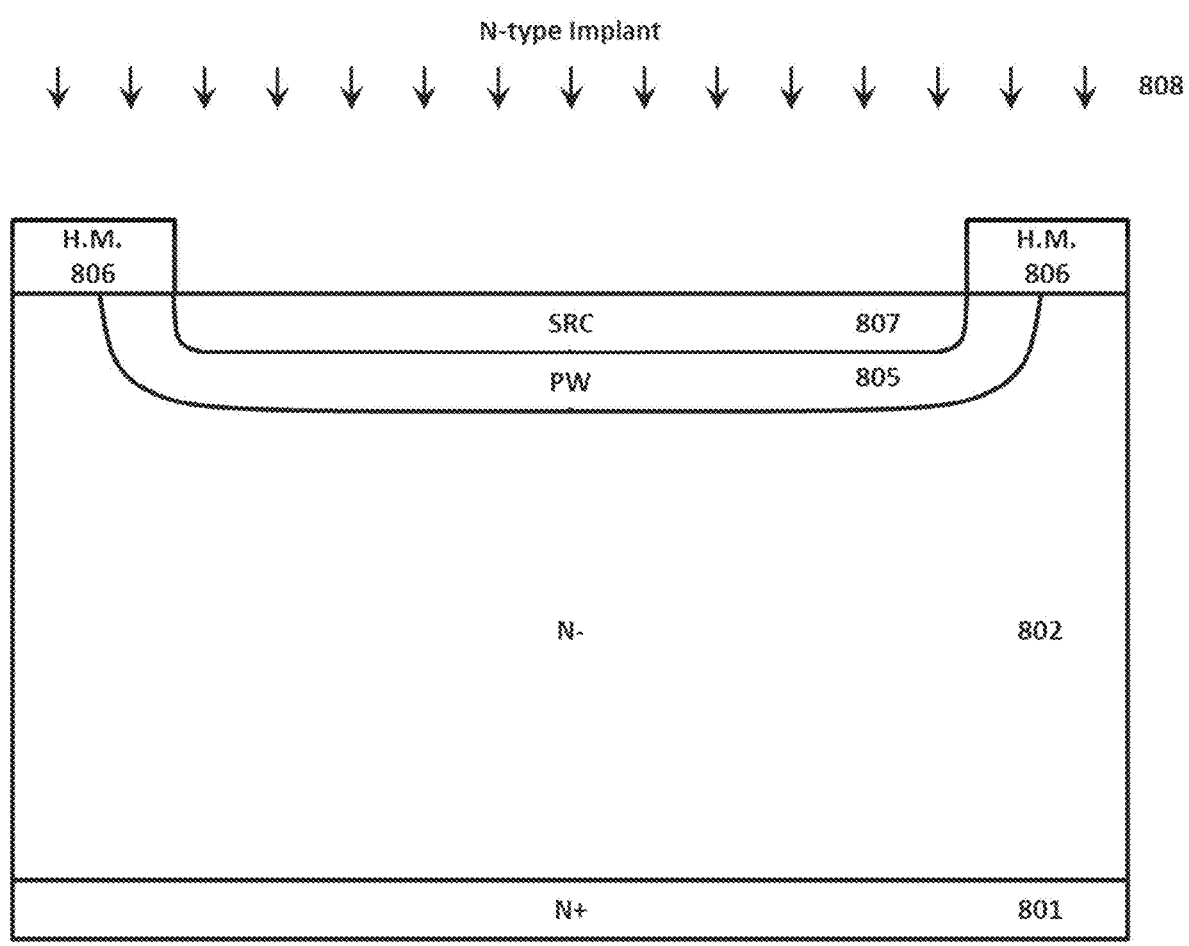
Figure 8H:
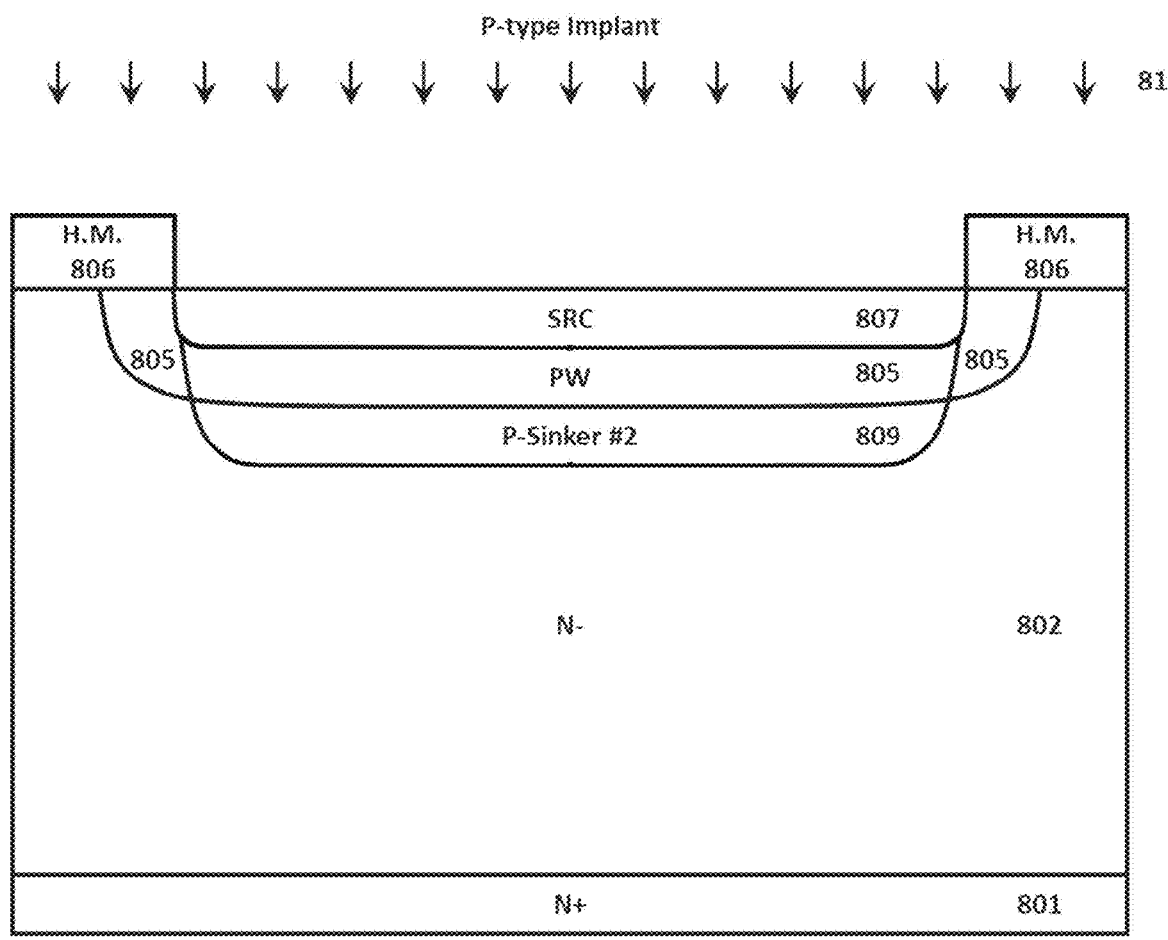
Figure 8I:
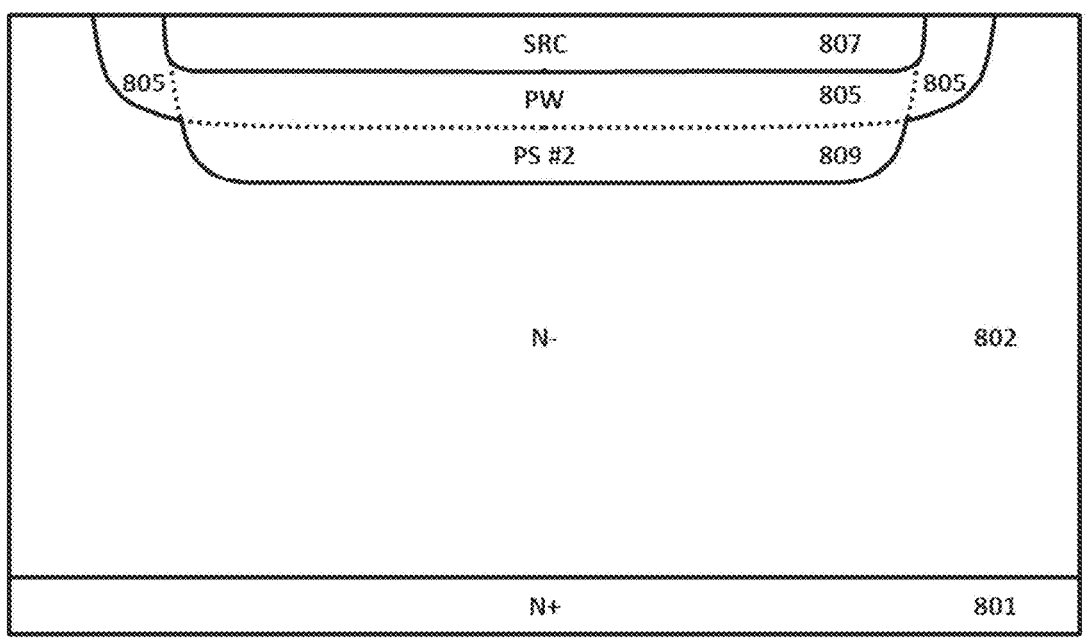
Figure 8J:
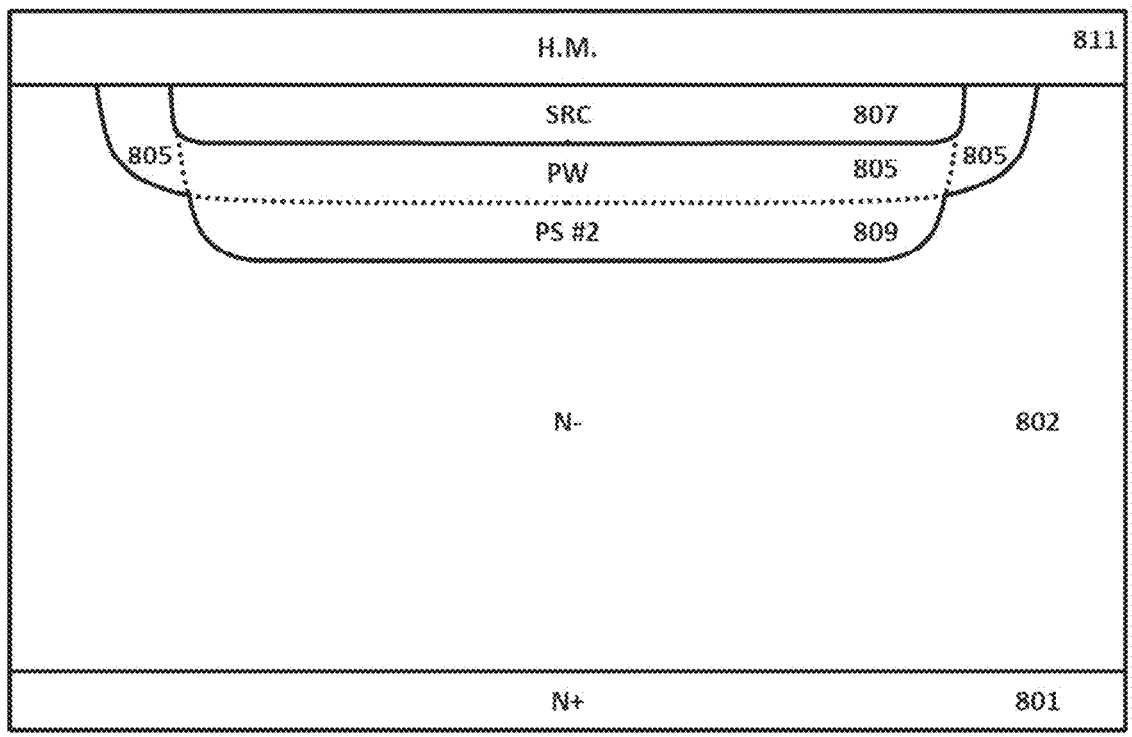
Figure 8K:
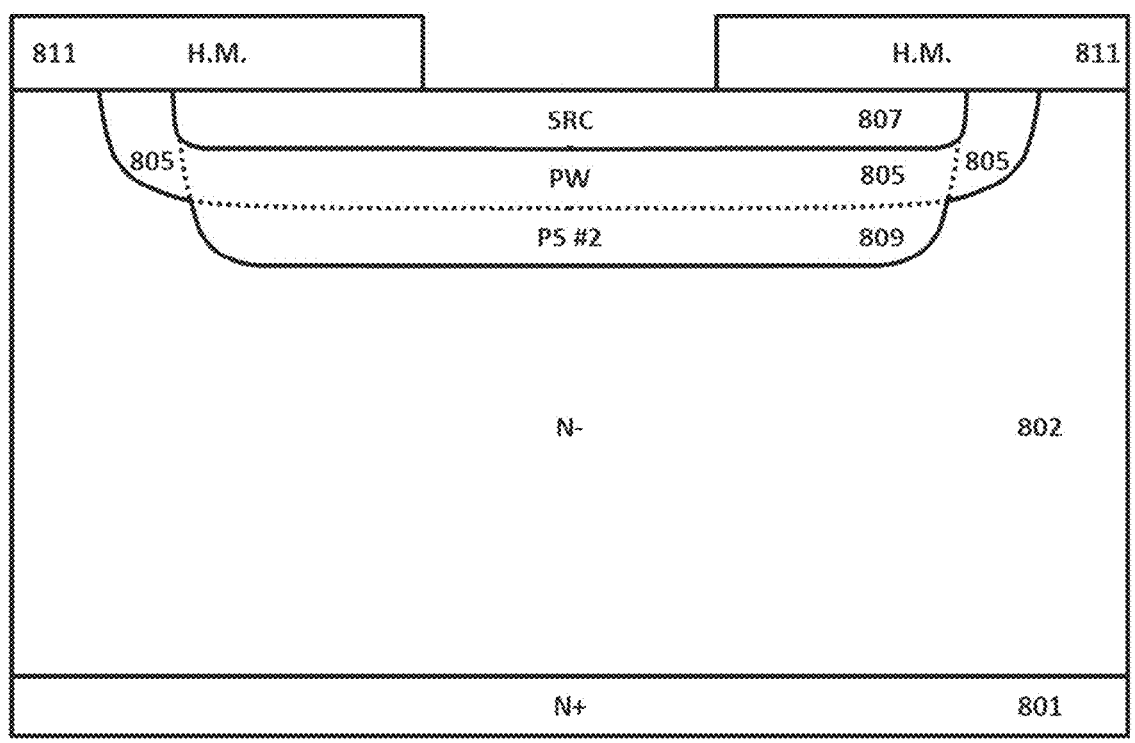
Figure 8L:
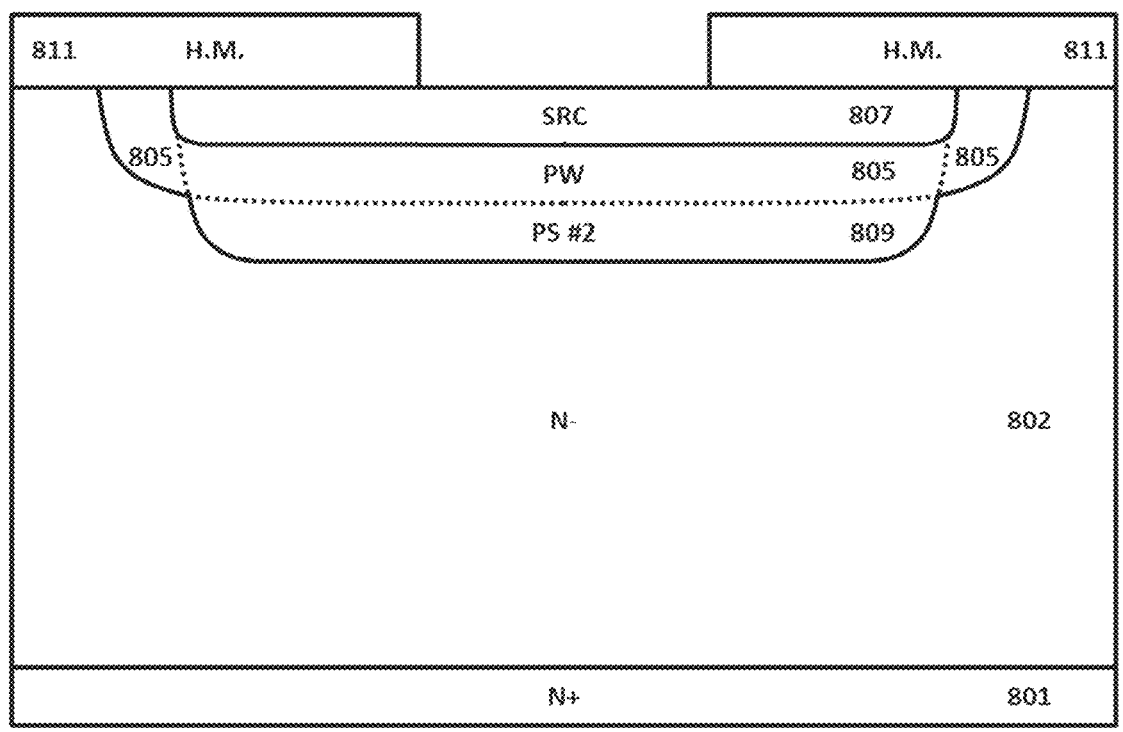
Figure 8M:
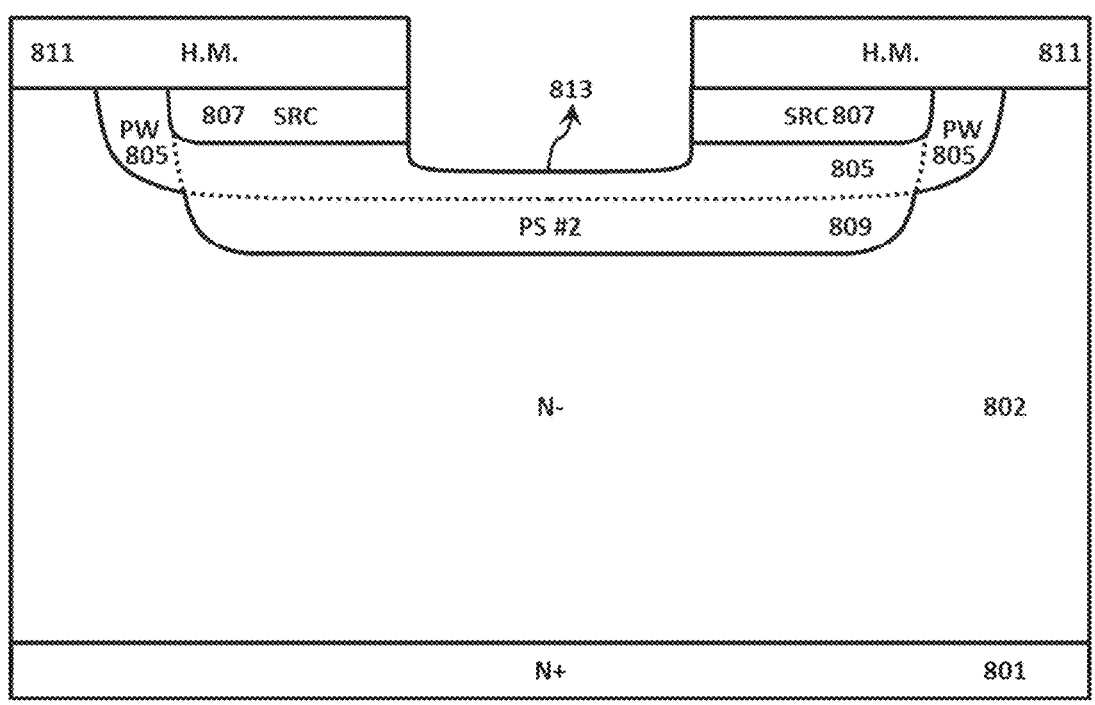
Figure 8N:
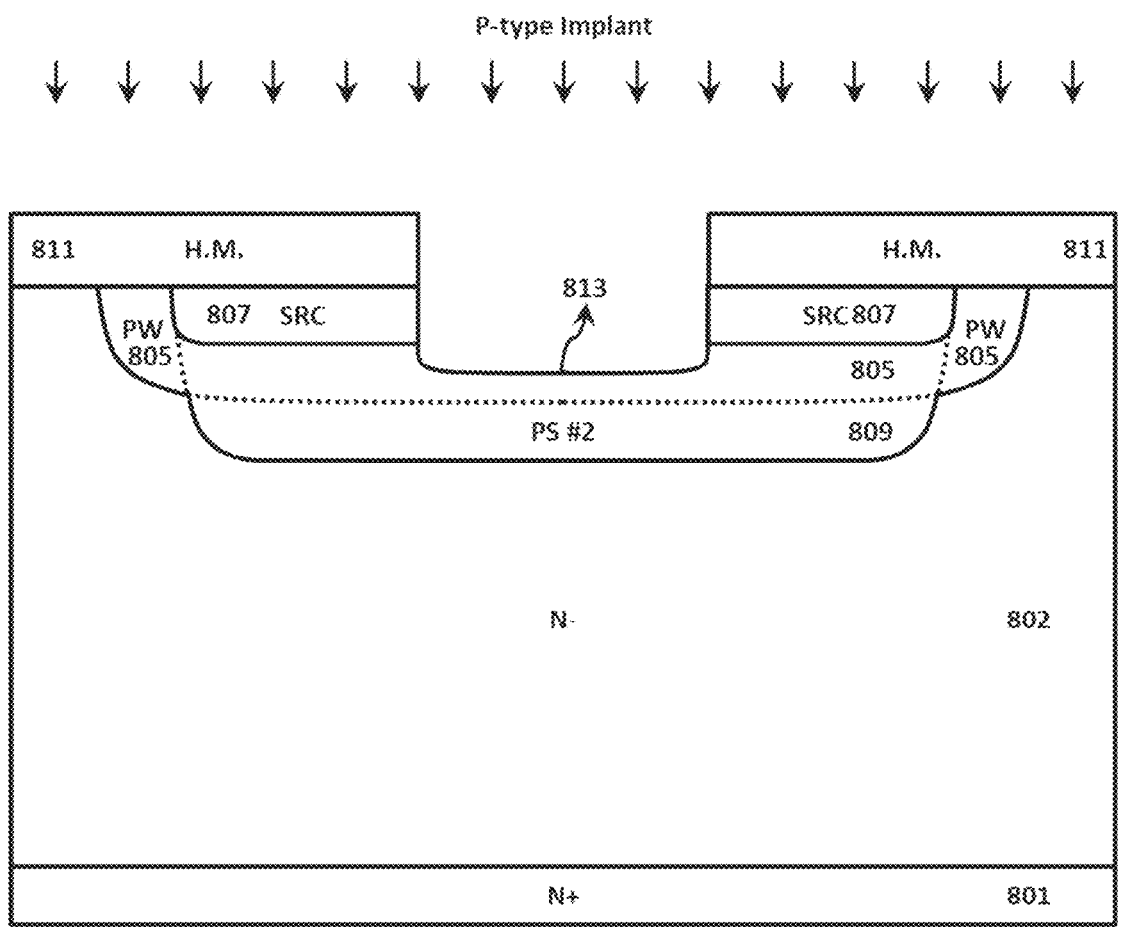
Figure 8O:
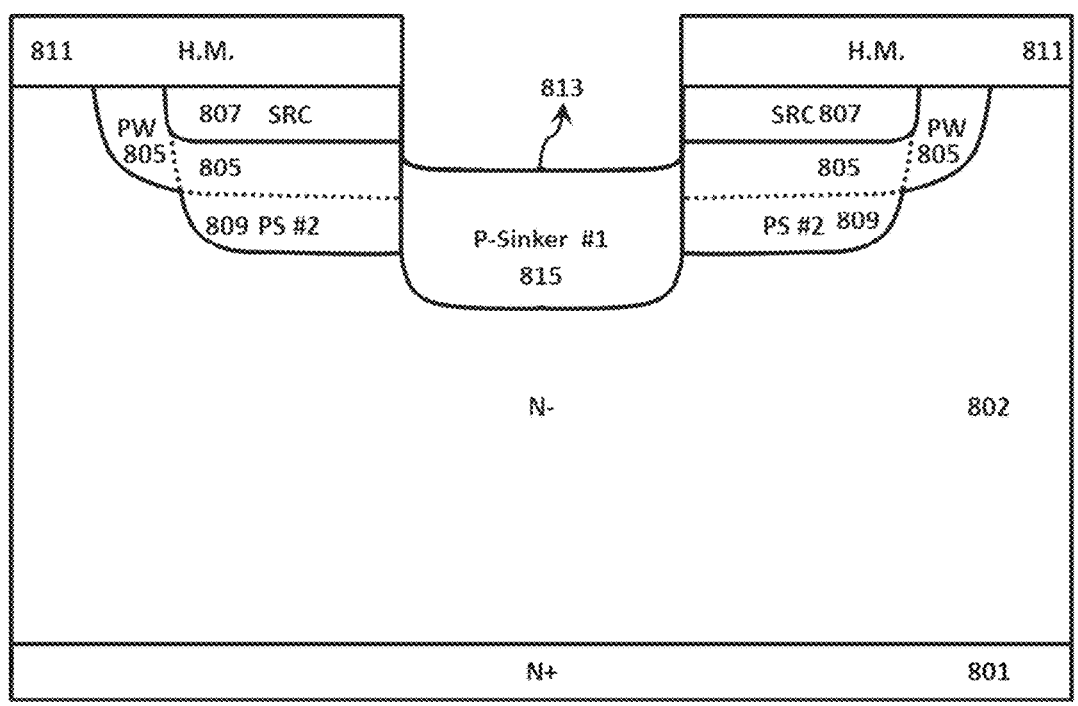

FIG. 8*a* to FIG. 8*bb* describes the process of manufacturing the SiC DMOSFET structure shown in FIG. 7*a*. The manufacturing process for a SiC DMOSFET is on a SiC substrate 801 and starts with using a 4H—SiC Si-face epi-wafer with suitable doping ($10^{14}$-$10^{18}$ cm$^{-3}$) and thickness (1 μm to 300 μm) for the epilayer 802 shown in FIG. 8*a*. A blanket hard mask 803 (comprising a CVD deposited layer of silicon dioxide, silicon nitride, silicon oxynitride, or a metallic layer such as nickel, with thickness ranging from 50 nm to 5 μm) is deposited in FIG. 8*b* and then patterned using photolithography followed by a dry etch (using a reactive ion-etch for example) as shown in FIG. 8*c*. A P-type implantation 804 (comprising boron or aluminum, at energies ranging from 10 keV to 800 keV, at implant doses ranging from $10^{12}$ cm$^{-2}$ to $10^{15}$ cm$^{-2}$) in FIG. 8*d* is performed to create a p-well 805 in FIG. 8*e*. The mask 803 is removed, and another hard mask layer 806 is deposited (comprising a CVD deposited layer of silicon dioxide, silicon nitride, silicon oxynitride, or a metallic layer such as nickel, with thickness ranging from 50 nm to 5 μm) and patterned in FIG. 8*f* to define the N+ source region. The N+ source region 807 is formed by implantation of the n-type (N+) impurity 808 (comprising Nitrogen or Phosphorus, at energies ranging from 10 keV to 500 keV, at implant doses ranging from $10^{13}$ cm$^{-2}$ to $10^{16}$ cm$^{-2}$) as shown in FIG. 8*g*. The PS #2 region 809 is formed by the implantation of the P-type impurity 810 in FIG. 8*h*. The deep PS #2 region can be formed using ion-implantation of aluminum or boron, which are commonly used p-type dopants in 4H—SiC. Boron can be advantageously used for forming this deep P-type Sinker region, since it has significantly higher implant range as compared to aluminum, and deep implants using boron can be formed with lower ion-implantation energies. The patterned hard mask 806 is removed from the top in FIG. 8i. Another hard mask layer 811 is formed on the top in FIG. 8j and patterned in FIG. 8k. The pattered mask 811 is used to etch 812 into the substrate in FIG. 8l for creating a recessed region. The source trench which is the recessed region 813 is formed in the substrate by penetrating the source region in FIG. 8m. A P-type implant 814 in FIG. 8n is performed for creating the PS #1 region. If using aluminum, the PS #1 region may comprise implant energies ranging from 100 keV to 1 MeV and implant dose ranging from $10^{13}$ cm$^{-2}$ to $10^{16}$ cm$^{-2}$. If using boron, the PS #1 region may comprise implant energies ranging from 50 keV to 800 keV and implant dose ranging from $10^{13}$ cm$^{-2}$ to $10^{16}$ cm$^{-2}$. The PS #1 815 is formed by the self-aligned implantation of the p-type impurity in FIG. 8o. As described more completely in the above embodiments, a linearly graded doping profile of the PS #1/PS #2 regions may be preferable utilized in lieu of a uniform (abrupt) doping profile, which results in a sufficient portion of the drain potential being supported within the PS #1/PS #2 regions and not only the N− drift region. This results in a pseudo charge-balanced structure, which promotes breakdown over a larger SiC region, which results in a lower critical electric field at breakdown and consequently a lower electric field in the gate insulator.

PS #1 region is designed with the greatest depth among the P-type Sinker regions using Boron implantation and the formation of the trench naturally extends the depth of the PS #1 region. The same hard mask used for etching the source trench 811 is utilized to define the PS #1 region. As will be apparent to those in the field of this invention, the SiC trench can be formed using dry etching techniques including reactive ion-etching, inductively coupled plasma (ICP)-RIE, etc. While a 90° sidewall slope is shown for this trench region in FIG. 7a, it is advantageous to form the trench regions with lower angle (60-90°) sidewalls, since this will reduce the curvature of the PS #1 region, and therefore improve the blocking performance of the device.

Figure 8P:
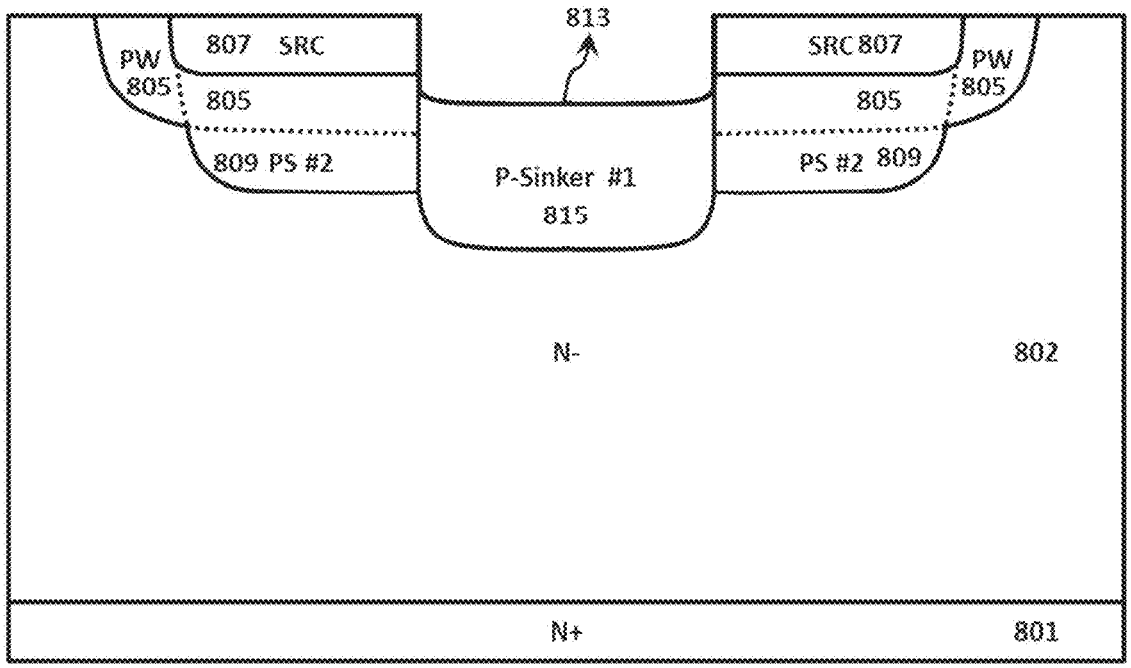
Figure 8Q:
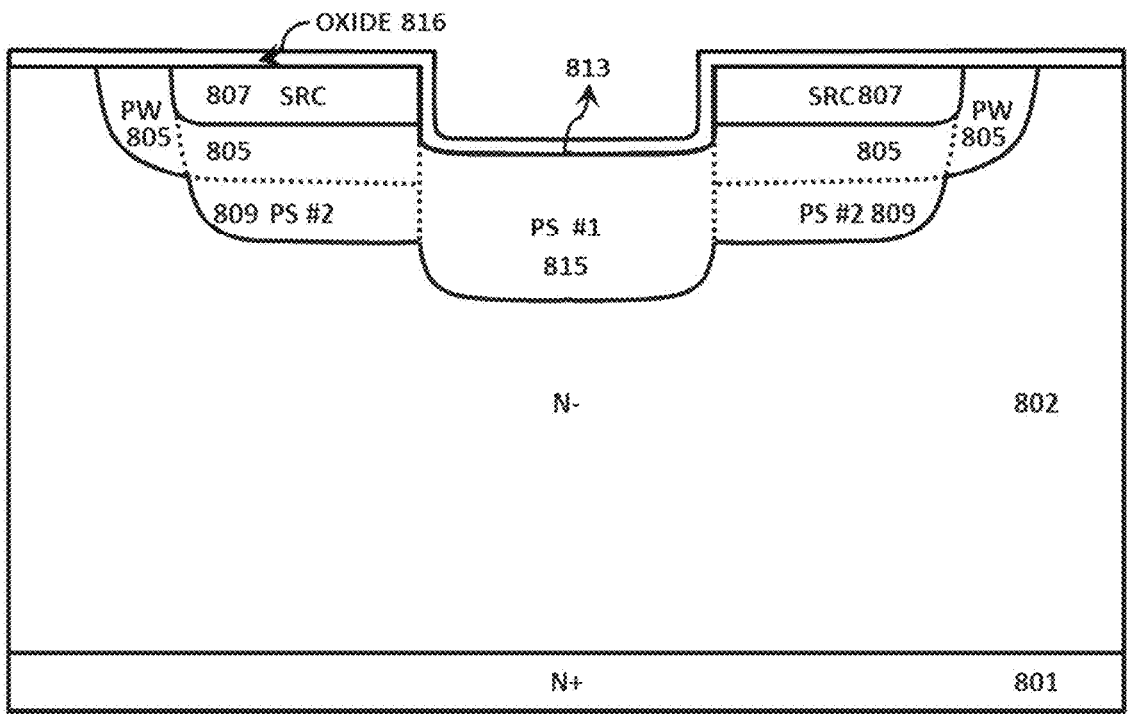
Figure 8R:
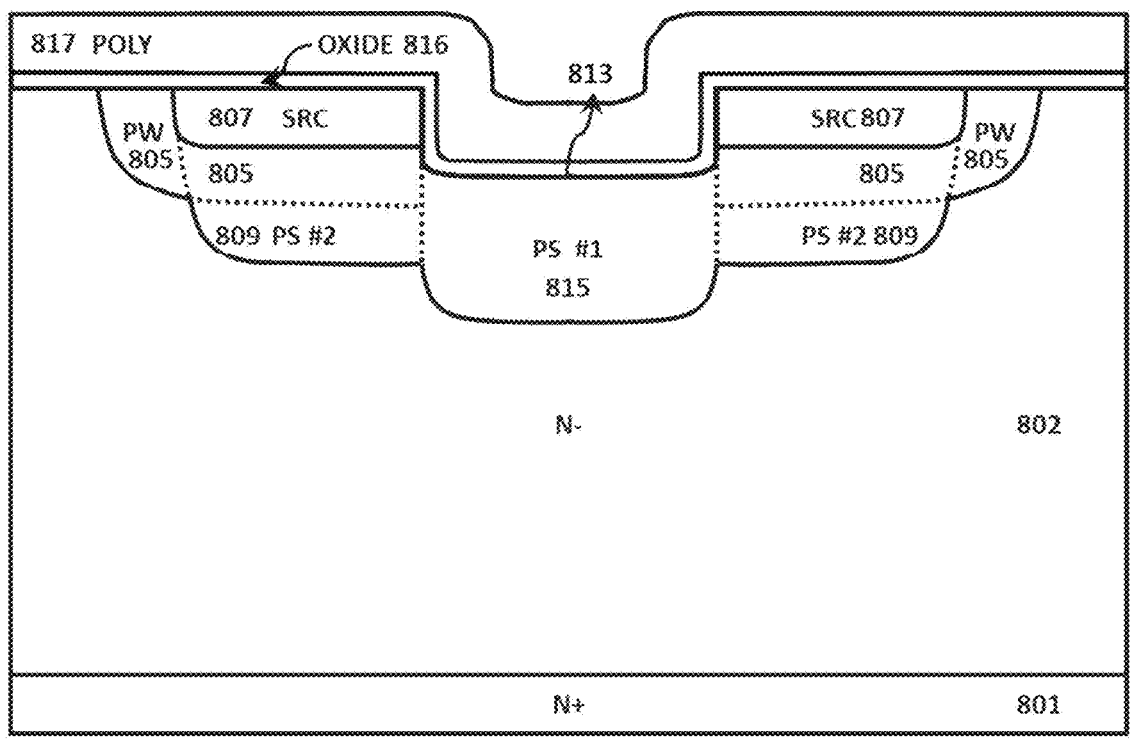
Figure 8S:
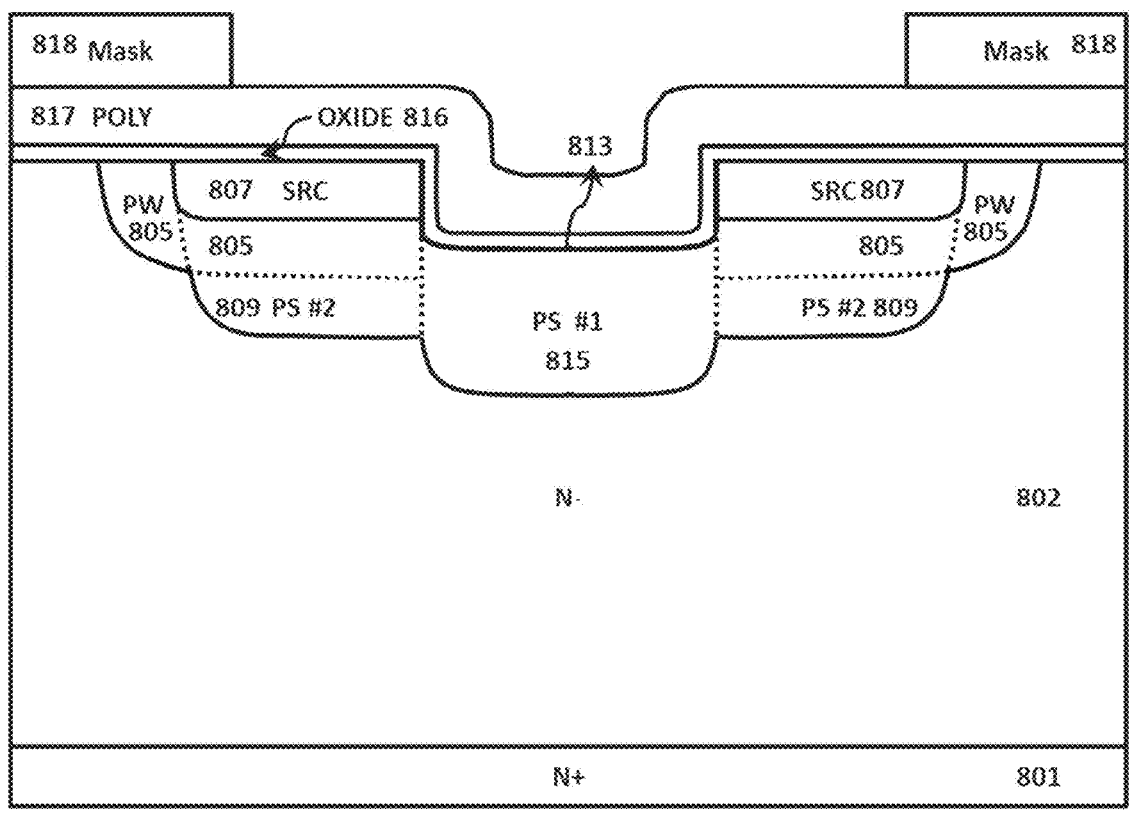
Figure 8T:
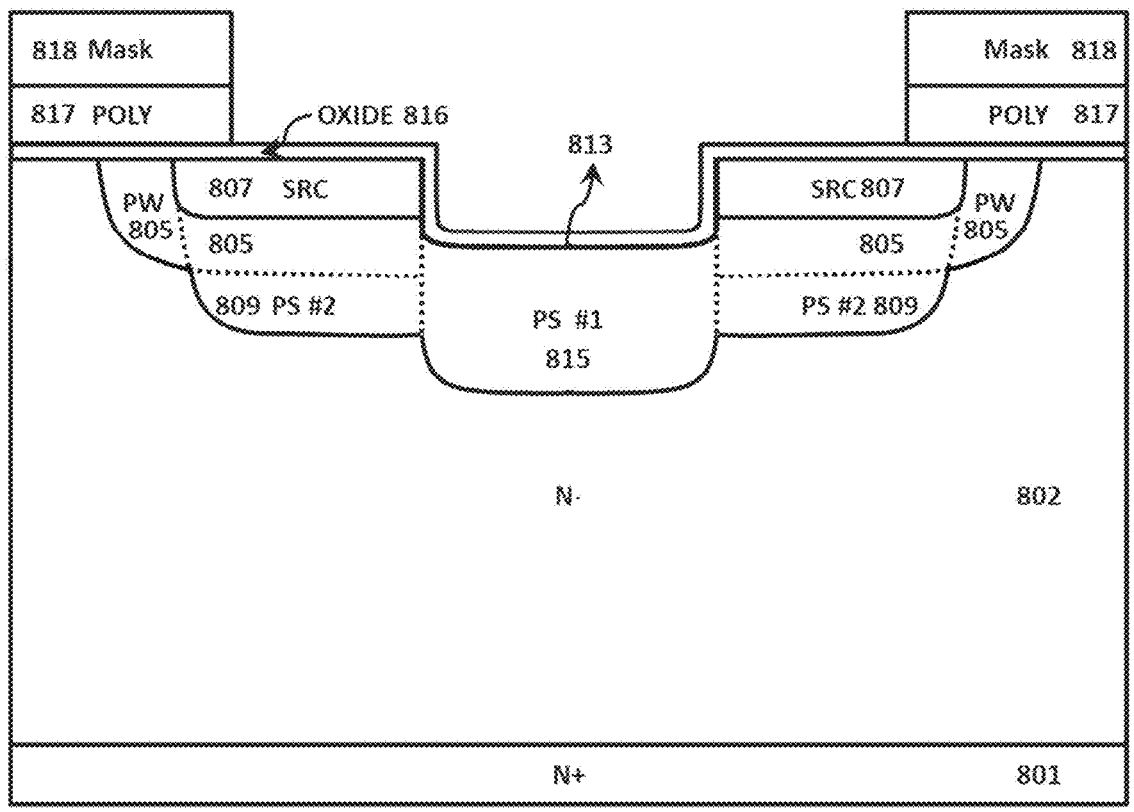
Figure 8U:
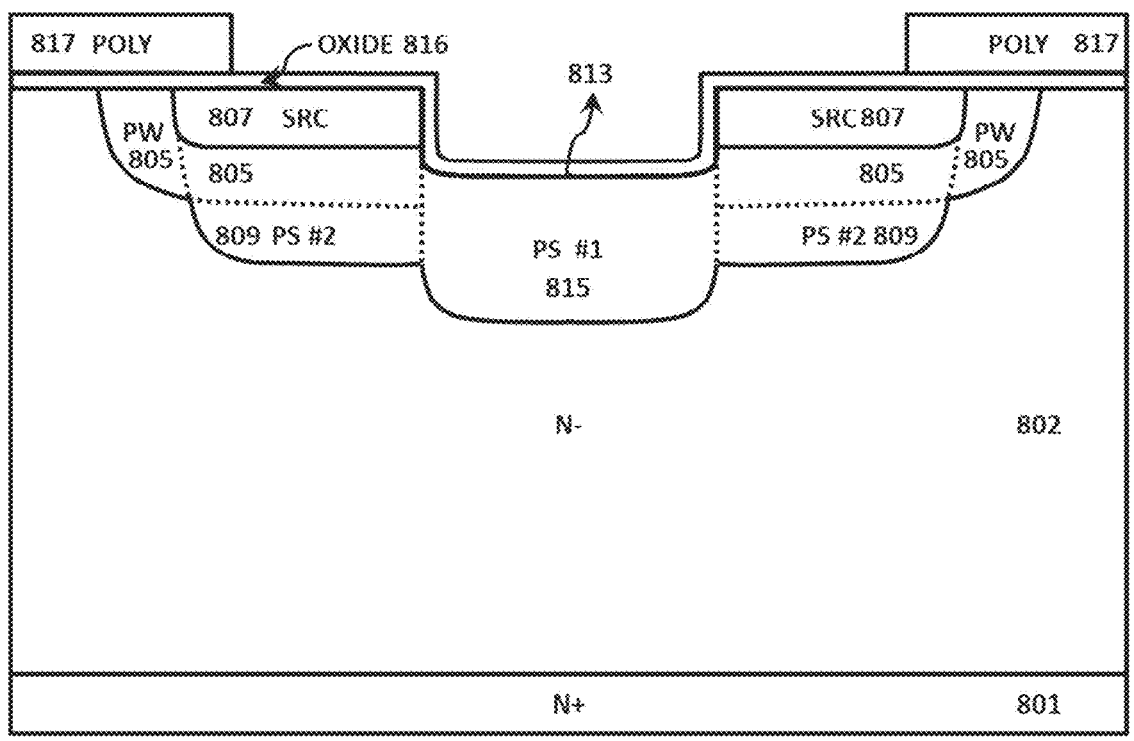
Figure 8V:
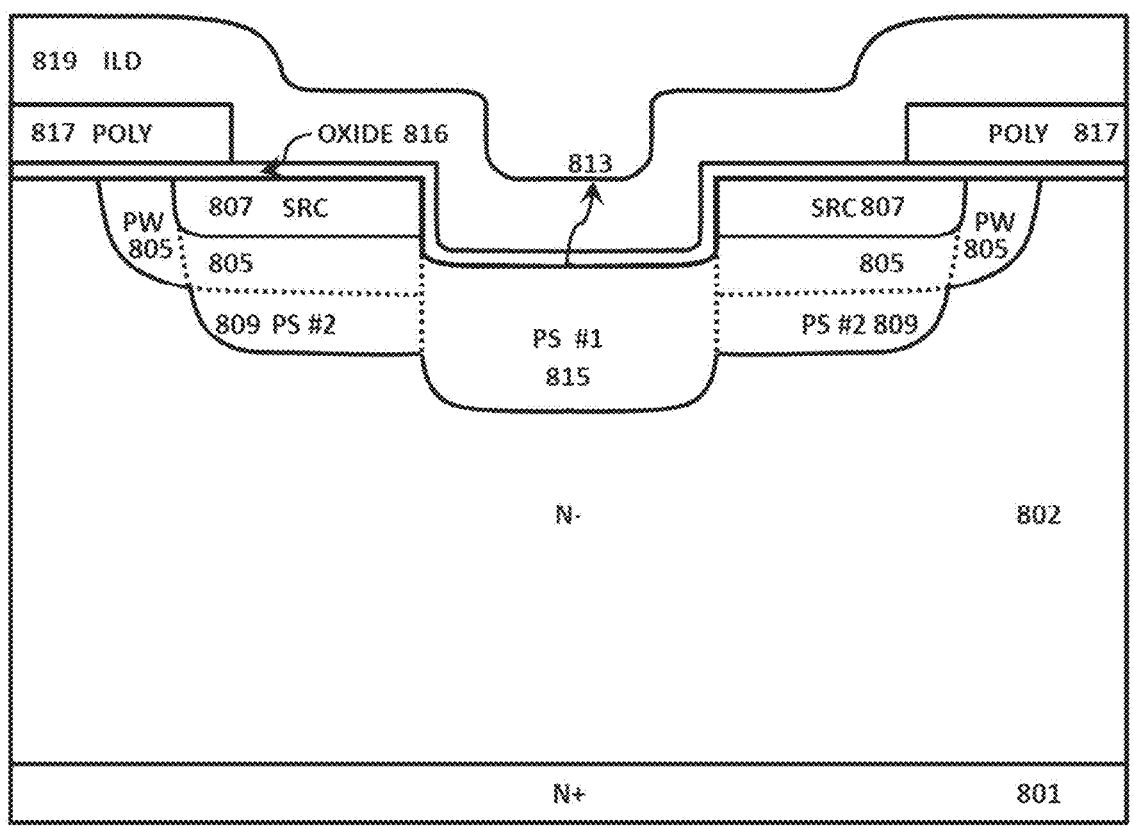
Figure 8W:
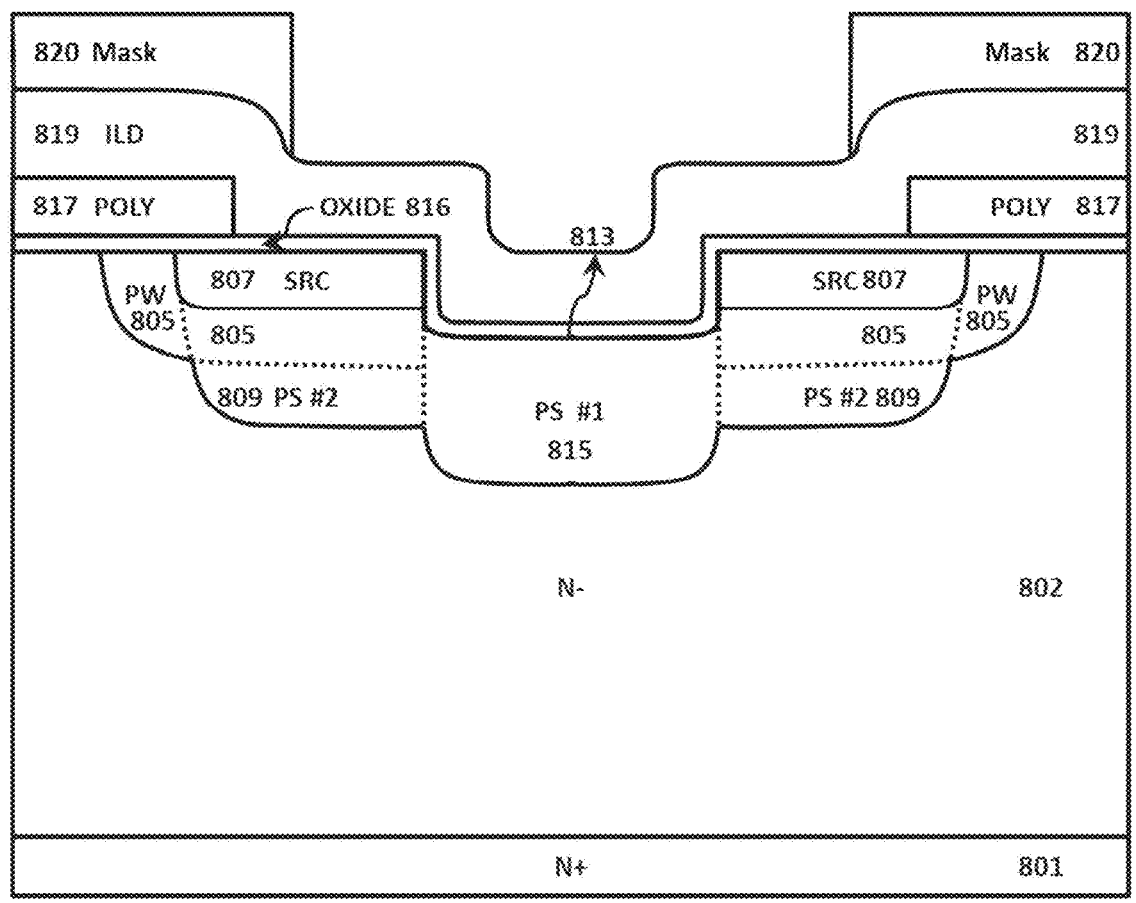
Figure 8X:
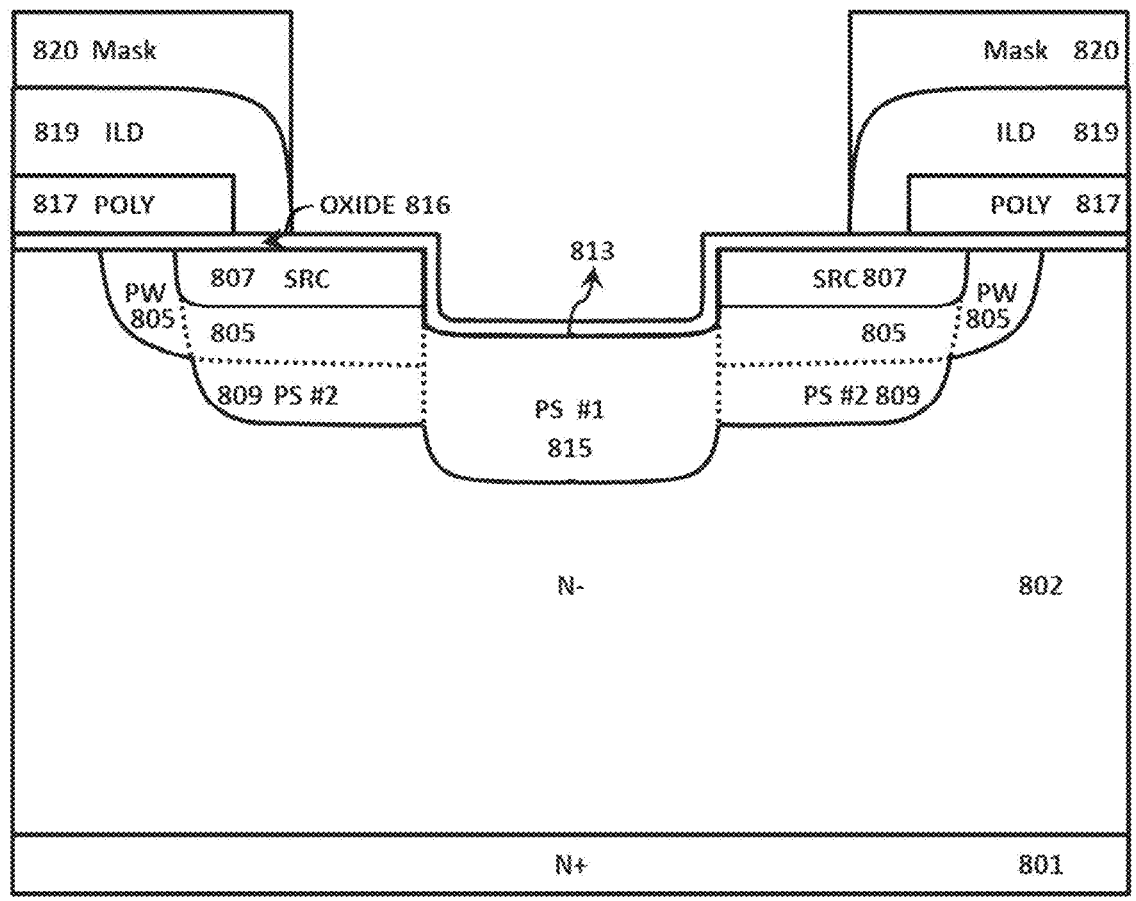
Figure 8Y:
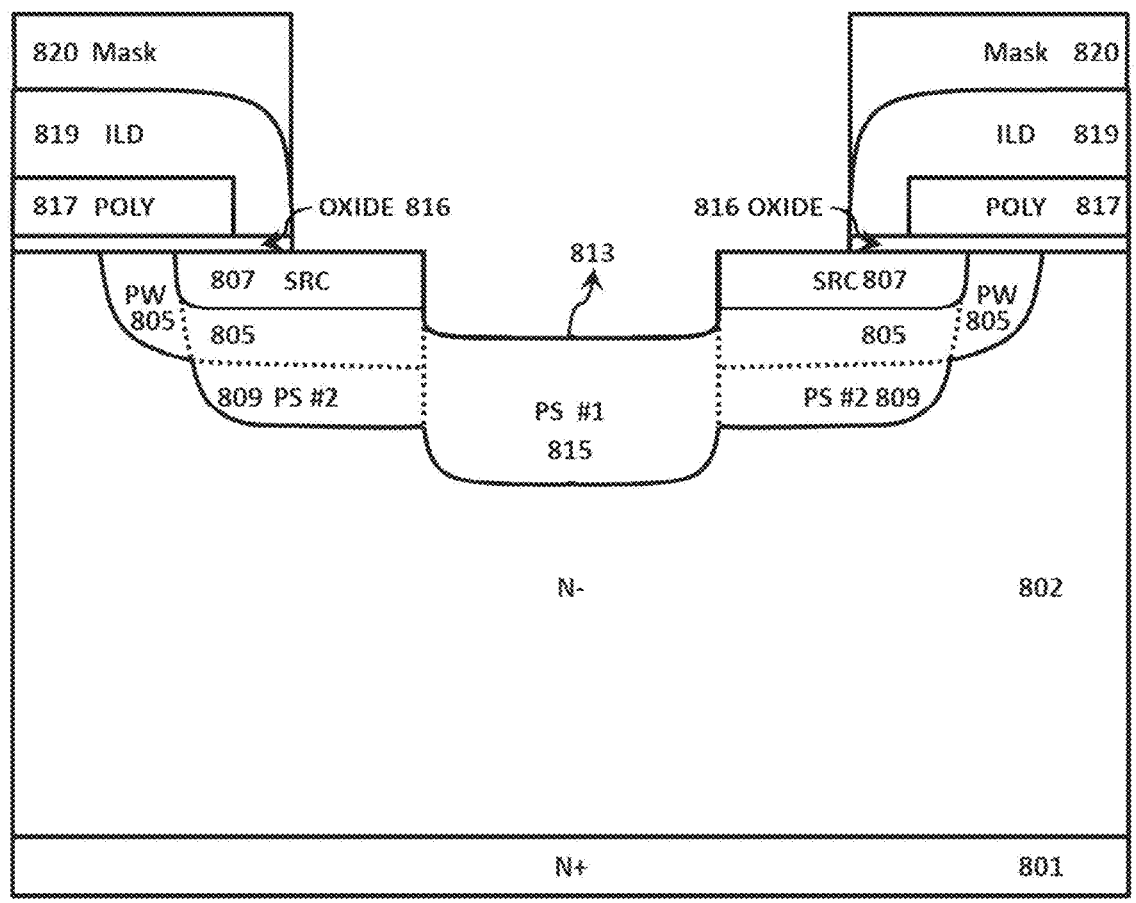
Figure 8Z:
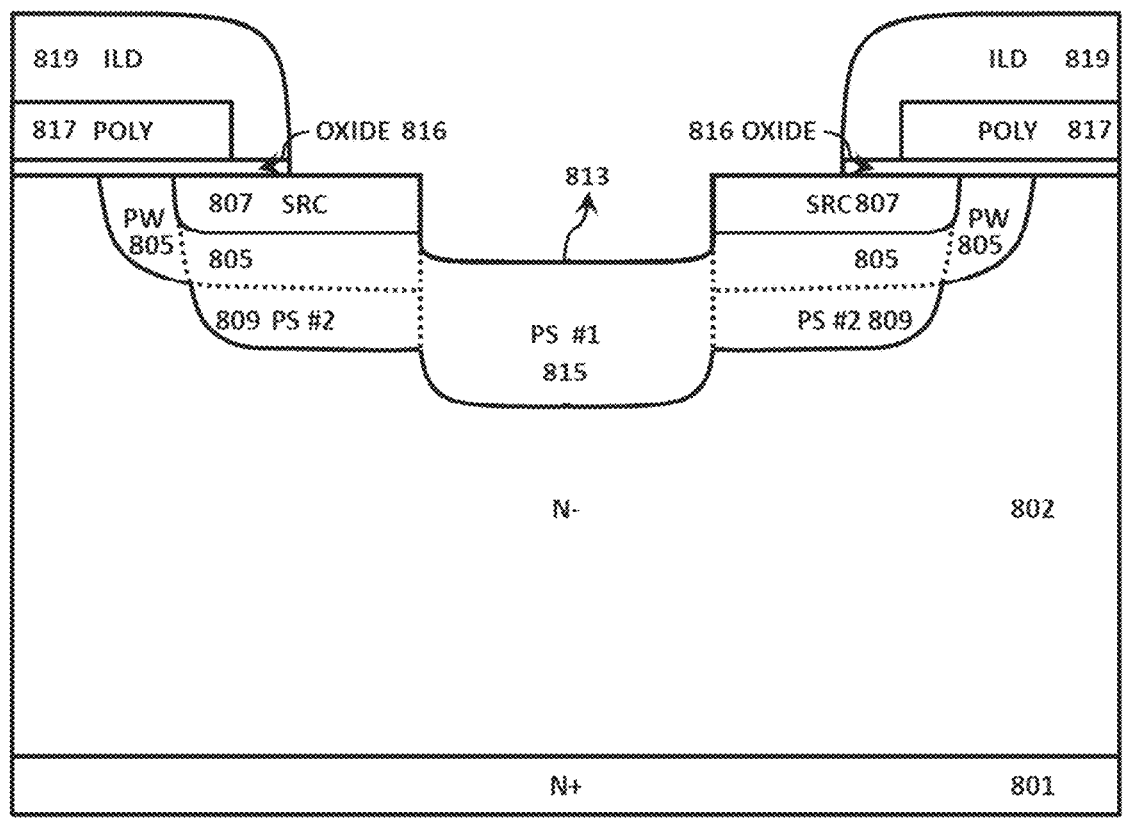
Figure 8A:
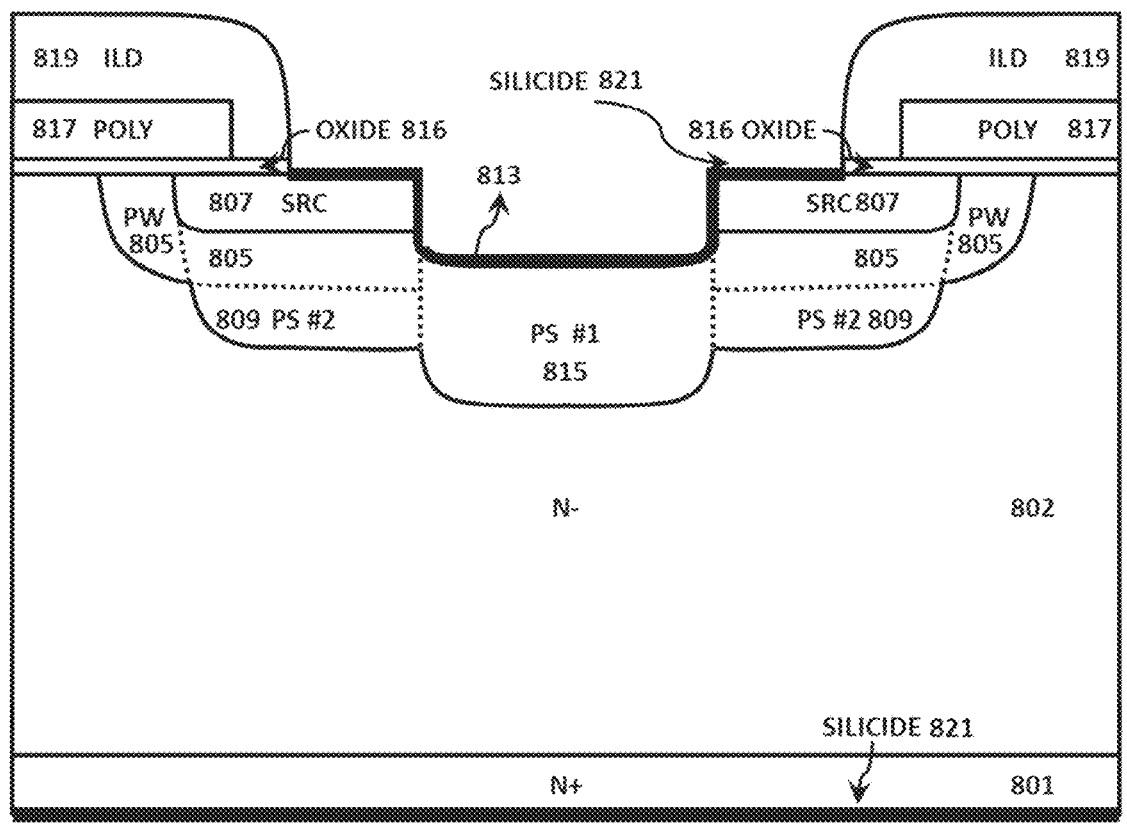
Figure 8B:
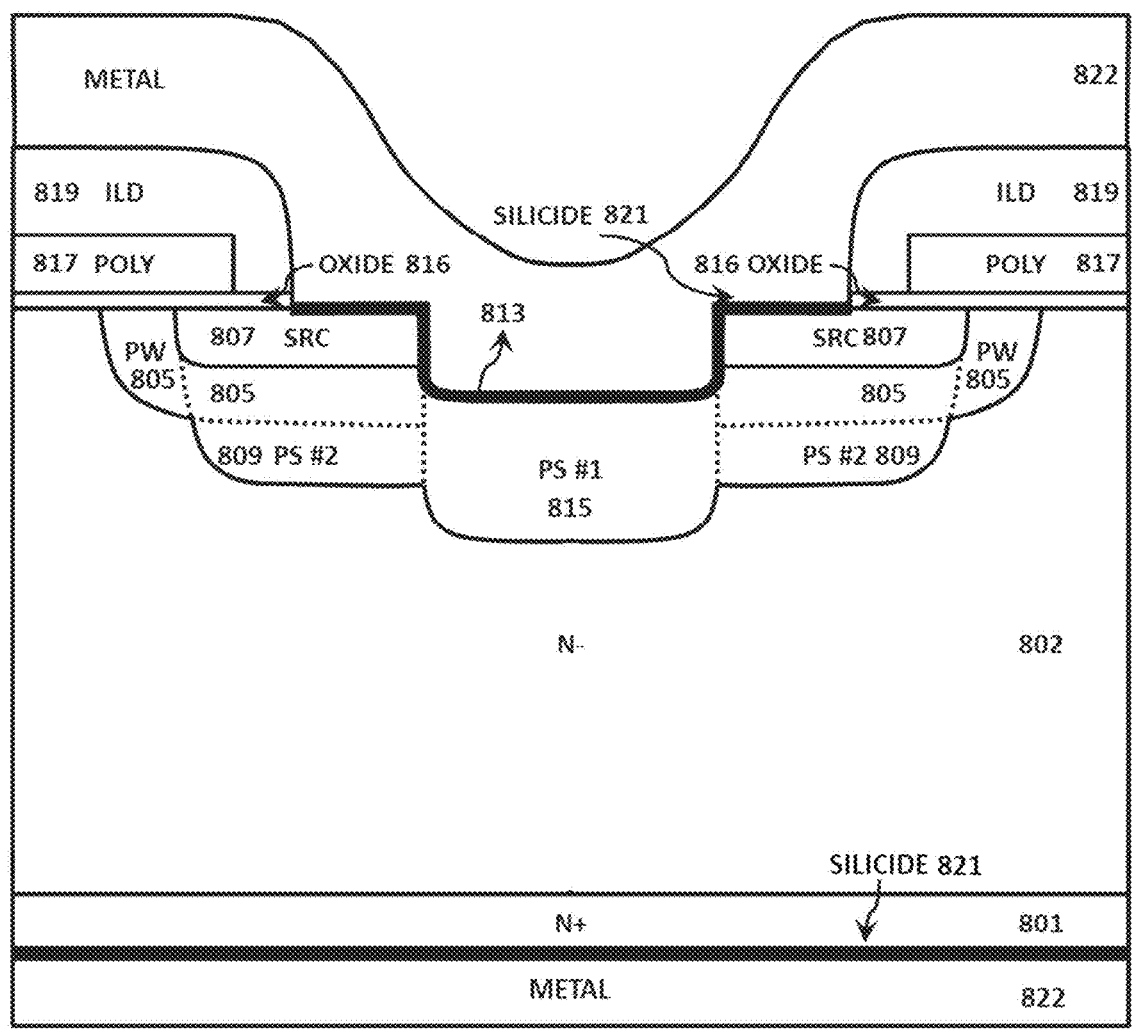

The patterned hard mask 811 is removed from the top in FIG. 8p. An oxide layer 816 for gate oxide is grown in FIG. 8q. A polysilicon gate layer is deposited on the top 817 in FIG. 8r. The polysilicon layer may be deposited using PECVD or LPCVD. The polysilicon layer may be degenerately doped using boron or phosphorus, either in-situ or in a subsequent step. In-situ doping may be performed by the addition of PH3 precursor to the polysilicon deposition chemistry. Post-deposition doping of polysilicon may be performed by depositing a layer of POCl$_3$ followed by a drive-in step at temperatures ranging from 700-900° C. A hard mask 818 is deposited on top and patterned as shown in FIG. 8s. The polysilicon gate layer 817 is etched by using the patterned mask layer 818 in FIG. 8t. The mask layer 818 is then removed from the top in FIG. 8u. An interlayer dielectric (ILD) layer 819 (comprising 50 nm-1000 nm thick silicon dioxide, silicon nitride, silicon oxynitride layers or a stacked combination thereof) is deposited on the wafer in FIG. 8v. A hard mask 820 is deposited and patterned on top to define the ILD opening in FIG. 8w. The ILD layer is patterned using the hard mask 820 as shown in FIG. 8x. Further the gate oxide 816 is etched using the same mask 820 in FIG. 8y. The mask 820 is then removed in FIG. 8z.

A nickel silicide region 821 is formed on the exposed SiC surface in Fig. 8aa. Interconnect metal layers 822 (either Al or Ag or Au) are deposited and patterned on the top and bottom of the chip in. FIG. 8bb The advantage of the embodiment herein is that by etching the source trench region, prior to the implantation of the PS #1 region, the breakdown location has been moved further into the semiconductor and farther away from the gate oxide layer. Due to the inherent hardness of silicon carbide, the observed range (depth) of ion-implanted dopants is significantly lower than in silicon. For example, forming deep (>0.3 μm) ion-implanted layers in silicon carbide requires extremely high implantation energies (>300 keV), which requires doubly or triply ionized implantation species, which drastically reduces the throughput and increase the cost of these ion-implantation steps. Forming the source trench as described in this embodiment obviates the need for doubly/triply ionized implantation steps, and low-cost with high-throughput singly ionized implantation can be utilized for realizing the PS #1 region.

Other embodiments are also within the scope of the following claims.

Although, various embodiments which incorporate the teachings described in detail herein, those skilled in the art can readily devise many other varied embodiments that still incorporate these teachings. For example, a complementary SiC MOSFET device with a P+, P− drift layer and P+ source can be created in a N-well region. The embodiments described are all applicable to the complementary MOSFET as well.

All documents (patents, patent publications or other publications) mentioned in the specification are incorporated herein in their entirety by reference.

The invention claimed is:

1. A device comprising a unit cell on a SiC substrate, the unit cell comprising:
   a first sinker region,
   a second sinker region surrounding the first sinker region,
   a source region surrounding the first sinker region,
   a well region surrounding the first sinker region,
   wherein the first sinker region has a depth that is greater than a depth of the second sinker region, wherein at least a portion of the first sinker region is located at a center of the unit cell.

2. The device of claim 1, wherein the source region located is within the well region.

3. The device of claim 1, wherein the first sinker region is located between a source interconnect metallization region and the SiC substrate.

4. The device of claim 1, wherein the first sinker region is located between least two well regions.

5. The device of claim 1, wherein the first sinker region is located between at least two source regions.

6. The device of claim 1, wherein at least a portion of the well region is located between the source region and the SiC substrate.

7. The device of claim 1, further comprising a drift layer.

8. The device of claim 7, wherein the drift layer is located on the SiC substrate.

9. The device of claim 8, wherein the unit cell is located within the drift layer.

10. The device of claim 1, wherein the well region surrounds the second sinker region and the source region.

11. The device of claim 10, wherein the well region surrounds the second sinker region and the first sinker region.

12. The device of claim 1, wherein the second sinker region is located between the well region and the first sinker region.

13. The device of claim 1, wherein the second sinker region is located between the source region and the SiC substrate.

14. The device of claim 1, wherein the second sinker region is under the source region.

15. The device of claim 1, wherein a top surface of the second sinker region is located below a bottom surface of the source region.

16. The device of claim 1, wherein the device comprises a N-type MOSFET or P-type MOSFET.

17. The device of claim 1, wherein the device comprises a N-type DMOSFET or P-type DMOSFET.

18. The device of claim 1, further comprising a drain region.

19. The device of claim 1, further comprising gate region.

20. The device of claim 1, further comprising an interlayer dielectric.

21. The device of claim 1, wherein the device comprises a planar metal oxide semiconductor field-effect transistor having a vertical silicon carbide.

22. A device comprising a unit cell on a SiC substrate, the unit cell comprising:
 a first sinker region,
 a second sinker region surrounding the first sinker region,
 a source region surrounding the first sinker region,
 a well region surrounding the first sinker region,
 wherein the first sinker region has a depth that is greater than a depth of the second sinker region, wherein the second sinker region, the source region, and the well region are symmetrically located around the first sinker region.

* * * * *